(12) United States Patent
Nakada et al.

(10) Patent No.: US 9,964,800 B2
(45) Date of Patent: May 8, 2018

(54) DISPLAY DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Masataka Nakada, Tochigi (JP); Takayuki Cho, Tochigi (JP); Daisuke Kubota, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/341,302

(22) Filed: Nov. 2, 2016

(65) Prior Publication Data

US 2017/0131594 A1 May 11, 2017

(30) Foreign Application Priority Data

Nov. 11, 2015 (JP) .................................. 2015-220994

(51) Int. Cl.
*G02F 1/1335* (2006.01)
*G02F 1/1337* (2006.01)
(Continued)

(52) U.S. Cl.
CPC .. *G02F 1/133553* (2013.01); *G02F 1/133555* (2013.01); *G02F 1/133707* (2013.01); *G06F 3/044* (2013.01); *G06F 3/0412* (2013.01); *G06F 3/0416* (2013.01); *H01L 27/322* (2013.01); *H01L 27/3232* (2013.01); *H01L 51/5206* (2013.01); *G02F 1/13338* (2013.01);
(Continued)

(58) Field of Classification Search
CPC .................................................. G02F 1/133555
USPC ......................................................... 349/114
See application file for complete search history.

(56) References Cited

U.S. PATENT DOCUMENTS 6,160,600 A    12/2000   Yamazaki et al.
6,407,785 B1    6/2002   Yamazaki
(Continued)

FOREIGN PATENT DOCUMENTS

CN    001403856 A    3/2003
CN    001482585 A    3/2004
(Continued)

OTHER PUBLICATIONS

International Search Report (Application No. PCT/IB2016/056546) dated Feb. 28, 2017.
(Continued)

*Primary Examiner* — Thanh-Nhan P Nguyen
(74) *Attorney, Agent, or Firm* — Fish & Richardson P.C.

(57) ABSTRACT

A novel display device that is highly convenient or reliable. The display device includes a first display element, a second display element, a color film, and a reflective electrode. The first display element includes a first pixel electrode and a liquid crystal layer. The second display element includes a second pixel electrode and a light-emitting layer. The first pixel electrode is electrically connected to the reflective electrode. The reflective electrode includes an opening through which light emitted from the light-emitting layer passes. The color film faces the reflective electrode with the liquid crystal layer placed therebetween.

11 Claims, 51 Drawing Sheets

(51) Int. Cl.
  *G06F 3/041* (2006.01)
  *H01L 27/32* (2006.01)
  *H01L 51/52* (2006.01)
  *G06F 3/044* (2006.01)
  *G02F 1/1333* (2006.01)

(52) U.S. Cl.
  CPC .. *G02F 1/133514* (2013.01); *G02F 2201/123* (2013.01); *G02F 2201/44* (2013.01); *G06F 2203/04103* (2013.01); *H01L 27/323* (2013.01); *H01L 27/3225* (2013.01); *H01L 2227/323* (2013.01); *H01L 2251/5307* (2013.01); *H01L 2251/5361* (2013.01)

(56) References Cited

U.S. PATENT DOCUMENTS

| | | | |
|---|---|---|---|
| 6,784,952 | B2 | 8/2004 | Yamazaki |
| 6,999,137 | B2 | 2/2006 | Yamazaki |
| 7,053,969 | B2 | 5/2006 | Yamazaki et al. |
| 7,212,265 | B2 | 5/2007 | Eguchi et al. |
| 7,248,235 | B2 | 7/2007 | Fujii et al. |
| 7,253,854 | B2 | 8/2007 | Yamazaki |
| 7,612,849 | B2 | 11/2009 | Eguchi et al. |
| 7,626,663 | B2 | 12/2009 | Kimura |
| 7,821,613 | B2 | 10/2010 | Kimura |
| 7,889,300 | B2 | 2/2011 | Kimura |
| 8,035,781 | B2 | 10/2011 | Eguchi et al. |
| 8,130,350 | B2 | 3/2012 | Kimura |
| 8,212,953 | B2 | 7/2012 | Hosoya |
| 8,242,683 | B2 | 8/2012 | Abe et al. |
| 8,305,535 | B2 | 11/2012 | Kimura |
| 8,576,363 | B2 | 11/2013 | Kimura |
| 8,634,044 | B2 | 1/2014 | Kimura |
| 8,866,725 | B2 | 10/2014 | Yamazaki et al. |
| 8,976,308 | B2 | 3/2015 | Hosoya |
| 9,000,438 | B2 | 4/2015 | Jintyou et al. |
| 9,046,245 | B2 | 6/2015 | Hirakata |
| 9,057,920 | B2 | 6/2015 | Eguchi et al. |
| 9,235,090 | B2 | 1/2016 | Kimura et al. |
| 9,298,035 | B2 | 3/2016 | Yamazaki et al. |
| 9,349,325 | B2 | 5/2016 | Yamazaki et al. |
| 9,437,623 | B2 | 9/2016 | Hosoya |
| 9,448,432 | B2 | 9/2016 | Yamazaki et al. |
| 9,448,433 | B2 | 9/2016 | Yamazaki et al. |
| 2003/0052869 | A1 | 3/2003 | Fujii et al. |
| 2003/0193457 | A1 | 10/2003 | Wang et al. |
| 2004/0027518 | A1 | 2/2004 | Kato et al. |
| 2006/0072047 | A1* | 4/2006 | Sekiguchi .............. G02F 1/1335 349/25 |
| 2007/0030571 | A1 | 2/2007 | Yeh et al. |
| 2008/0006833 | A1 | 1/2008 | Hirakata |
| 2008/0158138 | A1 | 7/2008 | Yamazaki et al. |
| 2010/0171905 | A1 | 7/2010 | Huang et al. |
| 2010/0328290 | A1* | 12/2010 | Jeong ................ G02F 1/133555 345/211 |
| 2011/0157254 | A1 | 6/2011 | Yamazaki et al. |
| 2011/0175874 | A1 | 7/2011 | Wakimoto et al. |
| 2012/0033156 | A1 | 2/2012 | Yamazaki et al. |
| 2014/0014960 | A1* | 1/2014 | Yamazaki ............. G06F 3/0412 257/59 |
| 2014/0132872 | A1 | 5/2014 | Kimura |
| 2014/0293192 | A1 | 10/2014 | Hatano |
| 2015/0270407 | A1 | 9/2015 | Suzuki et al. |
| 2015/0301388 | A1 | 10/2015 | Eguchi et al. |
| 2015/0316818 | A1 | 11/2015 | Jintyou et al. |
| 2016/0012783 | A1 | 1/2016 | Kimura et al. |
| 2016/0033820 | A1 | 2/2016 | Kimura |
| 2016/0042696 | A1 | 2/2016 | Hirakata et al. |
| 2016/0042702 | A1 | 2/2016 | Hirakata et al. |
| 2016/0210910 | A1 | 7/2016 | Yamazaki et al. |
| 2016/0275911 | A1 | 9/2016 | Kubota et al. |
| 2016/0283028 | A1 | 9/2016 | Yamazaki et al. |
| 2016/0299387 | A1 | 10/2016 | Yamazaki et al. |
| 2016/0313769 | A1 | 10/2016 | Yoshitani et al. |
| 2017/0038641 | A1 | 2/2017 | Yamazaki |
| 2017/0039931 | A1 | 2/2017 | Kubota et al. |
| 2017/0040402 | A1 | 2/2017 | Yasumoto et al. |
| 2017/0040403 | A1 | 2/2017 | Kuwabara |
| 2017/0040404 | A1 | 2/2017 | Kusunoki |
| 2017/0053603 | A1 | 2/2017 | Hirakata |
| 2017/0061863 | A1 | 3/2017 | Eguchi |
| 2017/0062528 | A1 | 3/2017 | Aoyama et al. |
| 2017/0075155 | A1 | 3/2017 | Oikawa et al. |
| 2017/0082882 | A1 | 3/2017 | Hirakata et al. |
| 2017/0082887 | A1 | 3/2017 | Kubota et al. |
| 2017/0090246 | A1 | 3/2017 | Seo et al. |
| 2017/0092177 | A1 | 3/2017 | Kobayashi et al. |
| 2017/0098689 | A1 | 4/2017 | Ikeda et al. |
| 2017/0102598 | A1 | 4/2017 | Nakada et al. |
| 2017/0103697 | A1 | 4/2017 | Kawashima et al. |
| 2017/0103714 | A1 | 4/2017 | Yamamoto et al. |
| 2017/0104049 | A1 | 4/2017 | Nakamura et al. |
| 2017/0116929 | A1 | 4/2017 | Hirakata |
| 2017/0123268 | A1 | 5/2017 | Sasaki et al. |

FOREIGN PATENT DOCUMENTS

| | | |
|---|---|---|
| CN | 001714380 A | 12/2005 |
| EP | 1380879 | 1/2004 |
| JP | 2002-196702 A | 7/2002 |
| JP | 2003-076302 A | 3/2003 |
| JP | 2003-279983 A | 10/2003 |
| JP | 2003-316295 A | 11/2003 |
| JP | 2004-037505 A | 2/2004 |
| JP | 2004-045769 A | 2/2004 |
| JP | 2005-293946 A | 10/2005 |
| JP | 2011-248351 A | 12/2011 |
| JP | 2015-195371 A | 11/2015 |
| KR | 2003-0022049 A | 3/2003 |
| KR | 2004-0007316 A | 1/2004 |
| TW | 544944 | 8/2003 |
| TW | 200403004 | 2/2004 |
| TW | 588185 | 5/2004 |
| TW | I282708 | 6/2007 |
| TW | 201027174 | 7/2010 |
| WO | WO-2004/053819 | 6/2004 |

OTHER PUBLICATIONS

Written Opinion (Application No. PCT/IB2016/056546) dated Feb. 28, 2017.

* cited by examiner

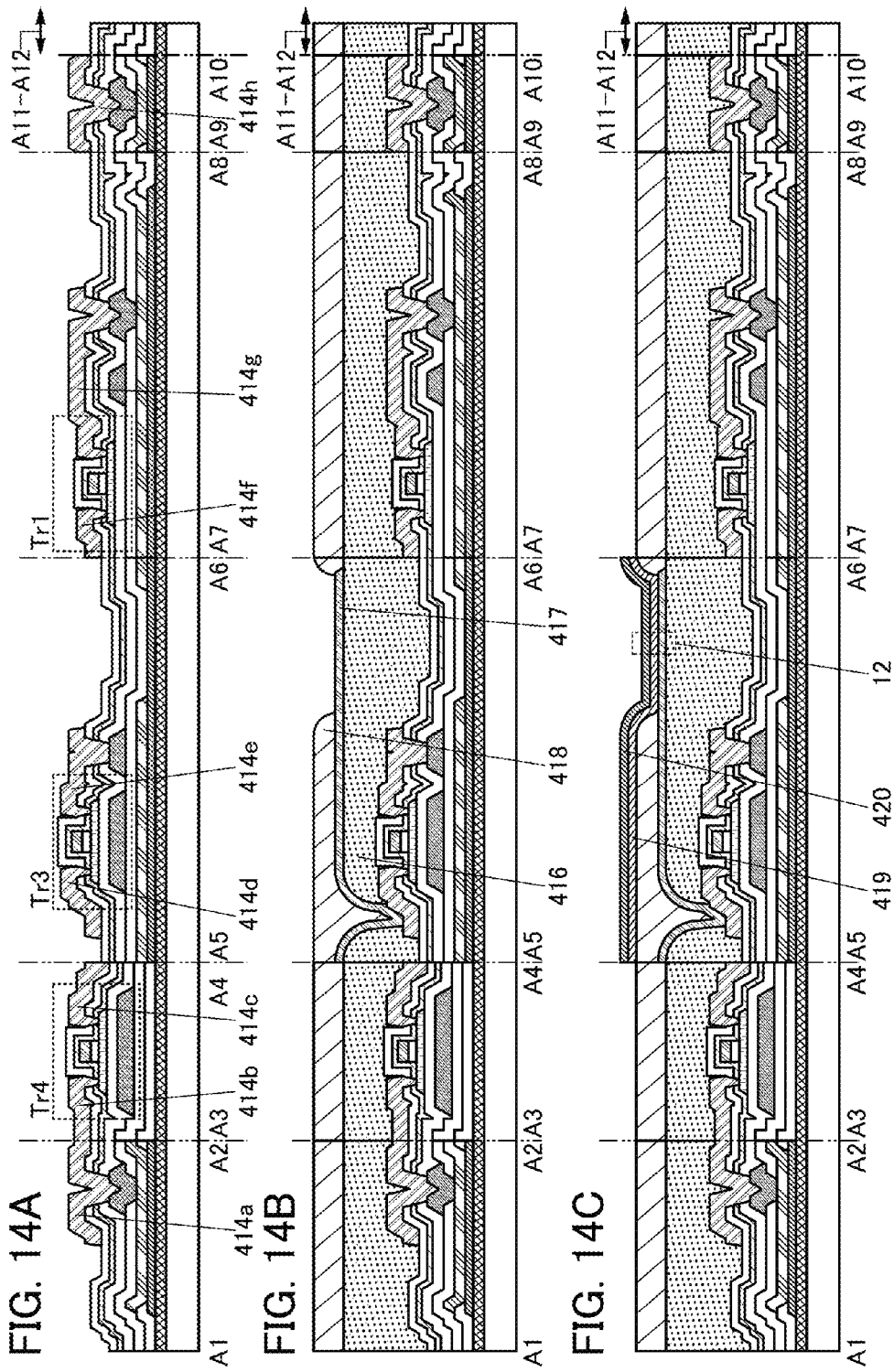

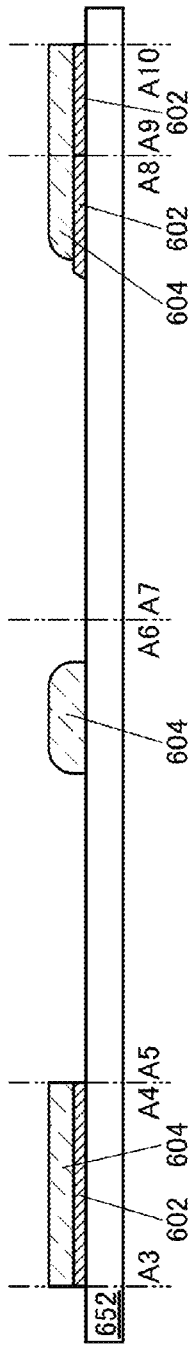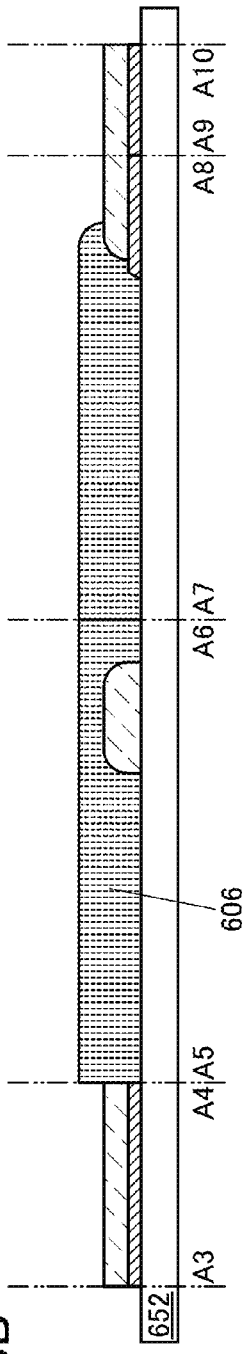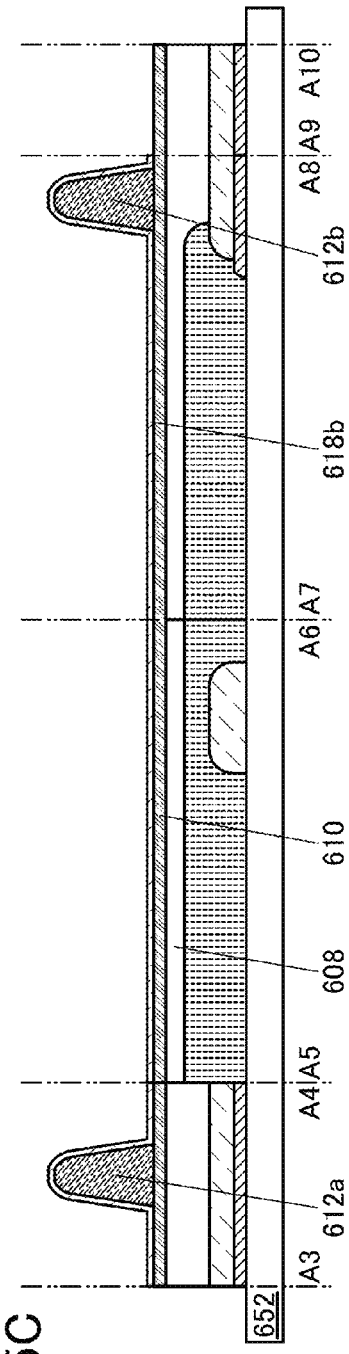

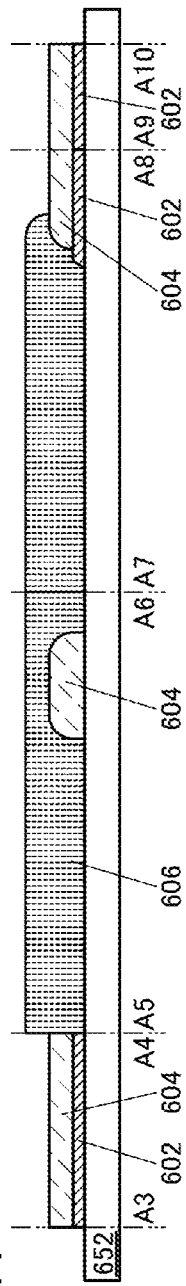
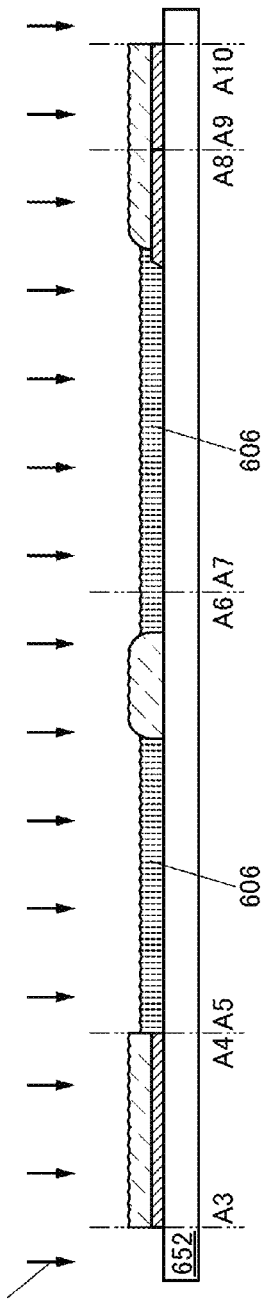
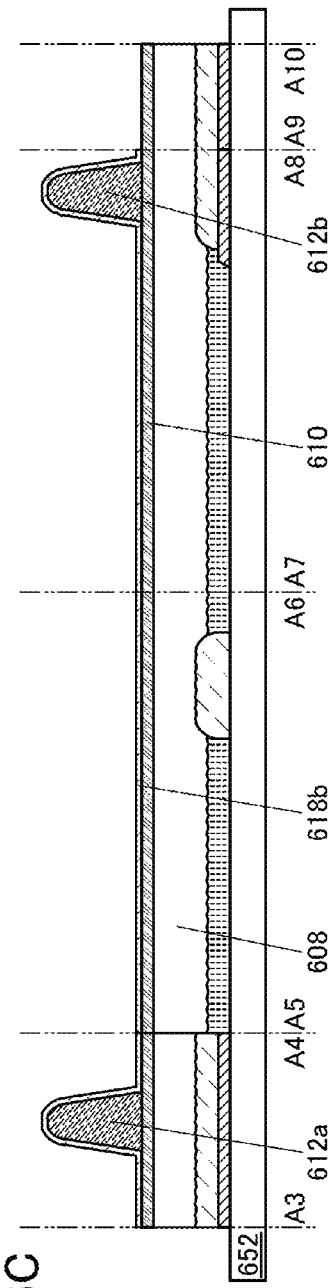
FIG. 16A
FIG. 16B
FIG. 16C

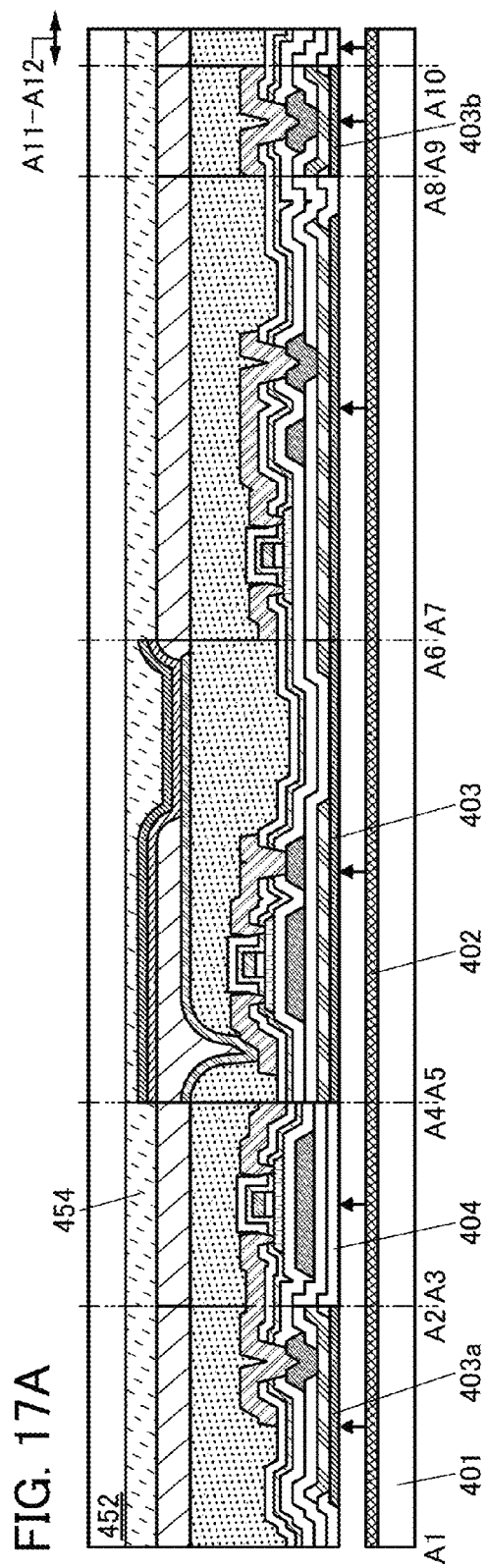
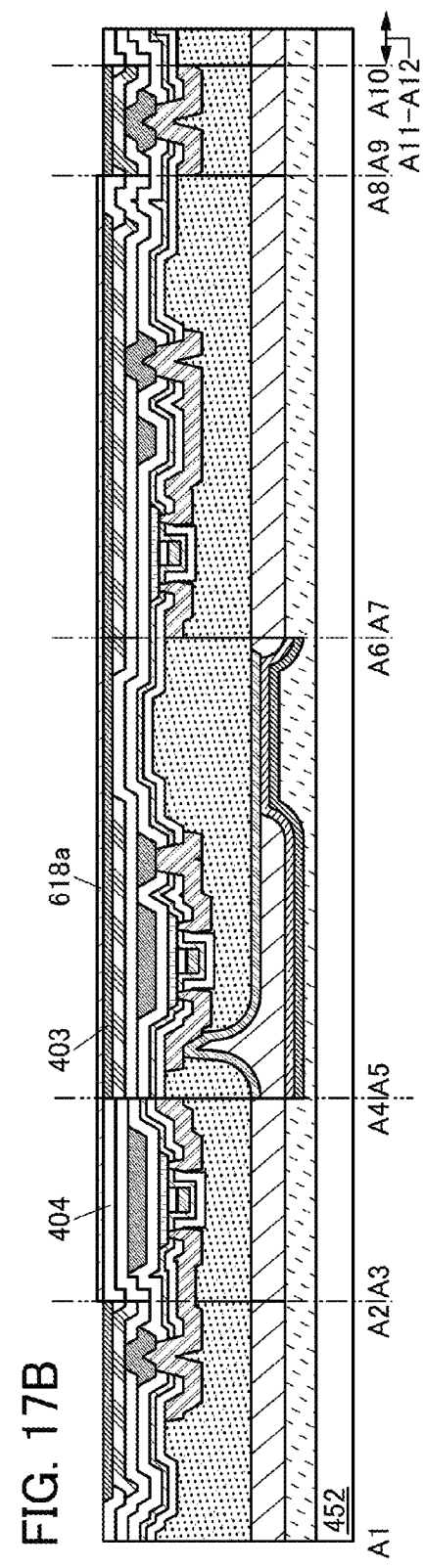
FIG. 17A
FIG. 17B

FIG. 37A
300B
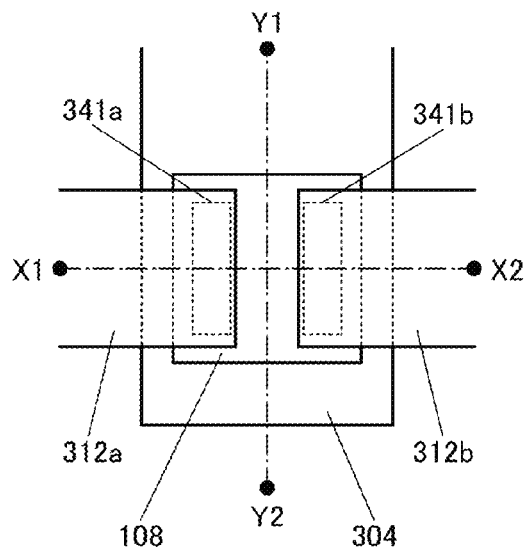
FIG. 37B
300B
FIG. 37C
300B
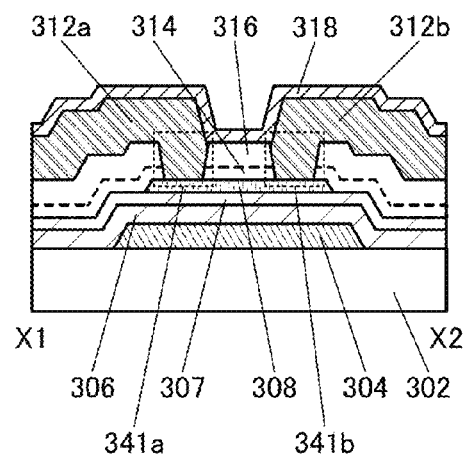
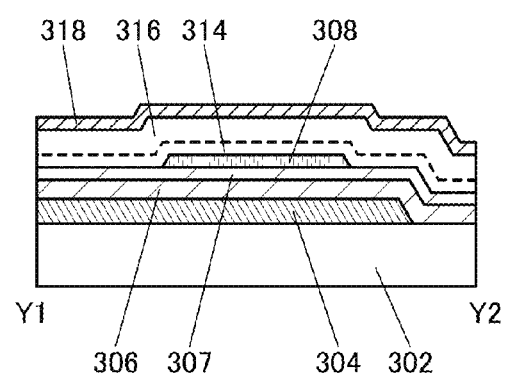

300C

300C

300C

300E

300E

300F

300F

9100

9101

9103

9102

9104

DISPLAY DEVICE AND METHOD FOR MANUFACTURING THE SAME

TECHNICAL FIELD

One embodiment of the present invention relates to a display device and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a surface-emitting light source is provided as a backlight and combined with a transmissive liquid crystal display device in order to reduce power consumption and suppress a reduction in display quality is known (see Patent Document 1).

REFERENCE

Patent Document

[Patent Document 1] Japanese Published Patent Application No. 2011-248351

DISCLOSURE OF INVENTION

An object of one embodiment of the present invention is to provide a novel display device that is highly convenient or reliable.

Another object of one embodiment of the present invention is to provide a display device with low power consumption and high display quality. Another object of one embodiment of the present invention is to provide a novel display device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a display device that includes a first display element, a second display element, a color film, and a reflective electrode. The first display element includes a first pixel electrode and a liquid crystal layer. The second display element includes a second pixel electrode and a light-emitting layer. The first pixel electrode is electrically connected to the reflective electrode. The reflective electrode includes an opening through which light emitted from the light-emitting layer passes. The color film faces the reflective electrode with the liquid crystal layer placed therebetween.

In the above mode, the color film is preferably provided over a substrate having a depression and a projection.

In addition, in the above mode, the first pixel electrode preferably faces the second pixel electrode with the reflective electrode placed therebetween.

Another embodiment of the present invention is a display device that includes a first display element, a second display element, a color film, and a reflective electrode. The first display element includes a first pixel electrode and a liquid crystal layer. The second display element includes a second pixel electrode and a light-emitting layer. The first pixel electrode is electrically connected to the reflective electrode. The reflective electrode includes an opening through which light emitted from the light-emitting layer passes. The color film faces the reflective electrode with the liquid crystal layer placed therebetween and faces the light-emitting layer.

In the above mode, it is preferable that the color film be provided over a substrate having a depression and a projection, the depression be provided in a position overlapping with the reflective electrode, and the projection be provided in a position overlapping with the second display element.

In the above mode, a region of the color film at the depression is thicker than a region of the color film at the projection.

In addition, in the above mode, the first pixel electrode preferably faces the second pixel electrode with the reflective electrode placed therebetween.

Another embodiment of the present invention is a display module including a touch sensor and the display device with any one of the above structures.

Another embodiment of the present invention is an electronic device including a battery and the display device with any one of the above structures or the display module.

With one embodiment of the present invention, a novel display device that is highly convenient or reliable can be provided. With one embodiment of the present invention, a display device with low power consumption and high display quality can be provided. With one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 14A to 14C are cross-sectional views illustrating a method for manufacturing a display device.

FIGS. 15A to 15C are cross-sectional views illustrating a method for manufacturing a display device.

FIGS. 16A to 16C are cross-sectional views illustrating a method for manufacturing a display device.

FIGS. 17A and 17B are cross-sectional views illustrating a method for manufacturing a display device.

FIGS. 37A to 37C are a top view and cross-sectional views illustrating one mode of a transistor.

BEST MODE FOR CARRYING OUT THE INVENTION

Figure 1:
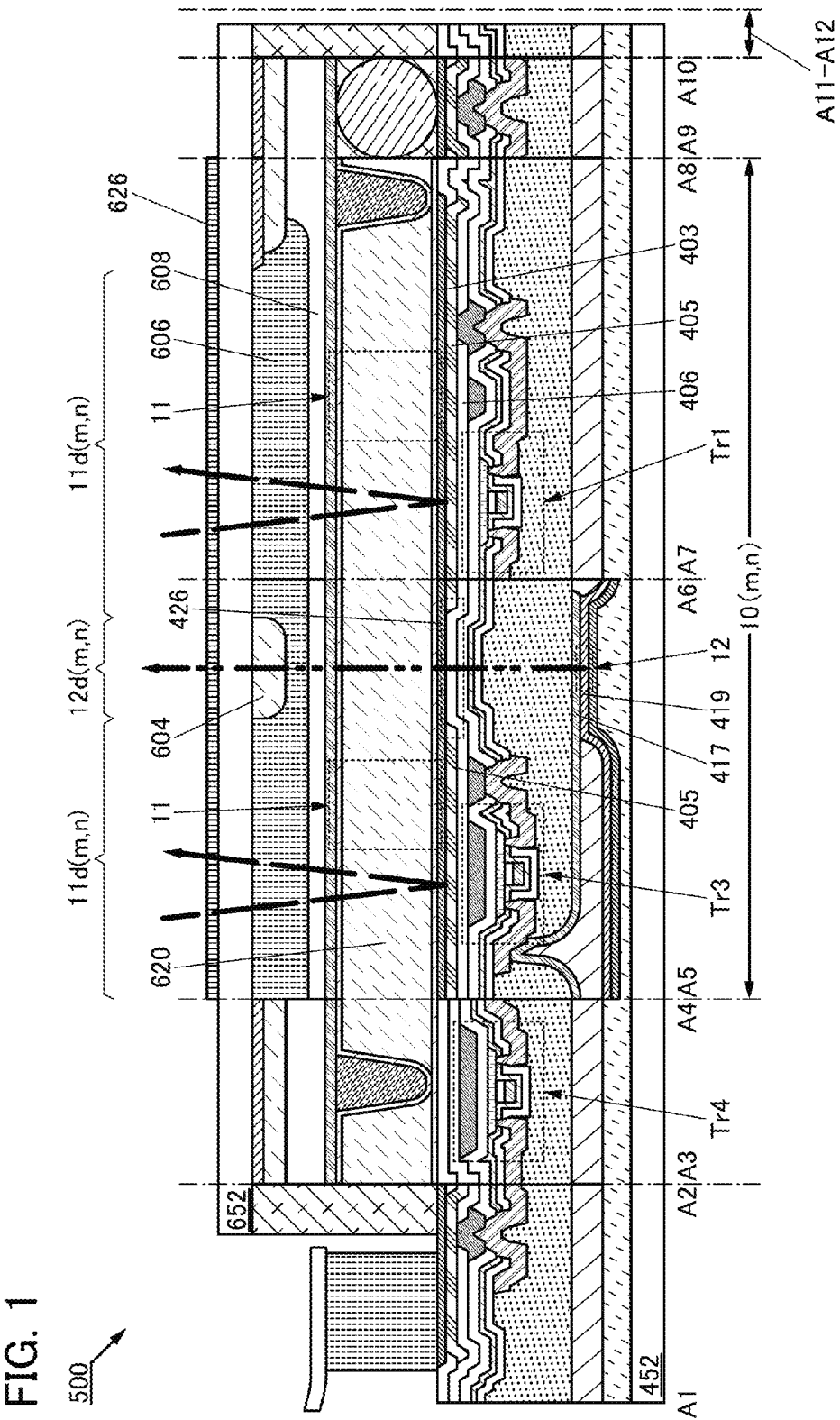
FIG. 1 is a cross-sectional view illustrating a display device.

Embodiments will be described below with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, and the region are exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the terms "film" and "layer" can be interchanged with each other. For example, in some cases, the term "conductive film" can be used instead of the term "conductive layer", and the term "insulating layer" can be used instead of the term "insulating film".

Embodiment 1

In this embodiment, a display device of one embodiment of the present invention is described with reference to FIG. 1, FIG. 2, FIG. 3, FIG. 4, FIG. 5, FIG. 6, FIG. 7, FIG. 8, FIG. 9, FIGS. 10A and 10B, FIGS. 11A and 11B, FIGS. 12A to 12C, FIGS. 13A to 13C, FIGS. 14A to 14C, FIGS. 15A to 15C, FIGS. 16A to 16C, FIGS. 17A and 17B, FIG. 18, FIG. 19, FIG. 20, FIG. 21, FIG. 22, FIG. 23, FIG. 24, FIG. 25, and FIG. 26.

<1-1. Structure of Display Device>

First, the structure of a display device is described with reference to FIG. 8. A display device 500 illustrated in FIG. 8 includes a pixel portion 502, and gate driver circuit portions 504a and 504b and a source driver circuit portion 506 which are placed outside the pixel portion 502.

[Pixel Portion]

The pixel portion 502 includes pixels 10(X, Y) arranged in X rows (X is a natural number of 2 or more) and Y columns (Y is a natural number of 2 or more). Each of the pixels 10(X, Y) includes two display elements having different functions. One of the two display elements has a function of reflecting incident light, and the other has a function of emitting light. Note that the details of the two display elements are described later.

[Gate Driver Circuit Portion]

Some or all of the gate driver circuit portions 504a and 504b and the source driver circuit portion 506 are preferably formed over a substrate over which the pixel portion 502 is formed. Thus, the number of components and the number of terminals can be reduced. In the case where some or all of the gate driver circuit portions 504a and 504b and the source driver circuit portion 506 are not formed over the substrate over which the pixel portion 502 is formed, a separately prepared driver circuit board (e.g., a driver circuit board formed using a single-crystal semiconductor film or a polycrystalline semiconductor film) may be formed in the display device 500 by chip on glass (COG) or tape automated bonding (TAB).

The gate driver circuit portions 504a and 504b have a function of outputting a signal (a scan signal) for selecting the pixels 10(X, Y). The source driver circuit portion 506 has a function of supplying a signal (data signal) for driving the display elements included in the pixels 10(X, Y).

The gate driver circuit portion 504a has a function of controlling the potentials of wirings supplied with scan signals (hereinafter, such wirings are referred to as scan lines $G_{E\_1}$ to $G_{E\_X}$) or a function of supplying an initialization signal. The gate driver circuit portion 504b has a function of controlling the potentials of wirings supplied with scan signals (hereinafter, such wirings are referred to as scan lines $G_{L\_1}$ to $G_{L\_X}$) or a function of supplying an initialization signal. Without being limited thereto, the gate driver circuit portions 504a and 504b each can control or supply another signal.

Figure 8:
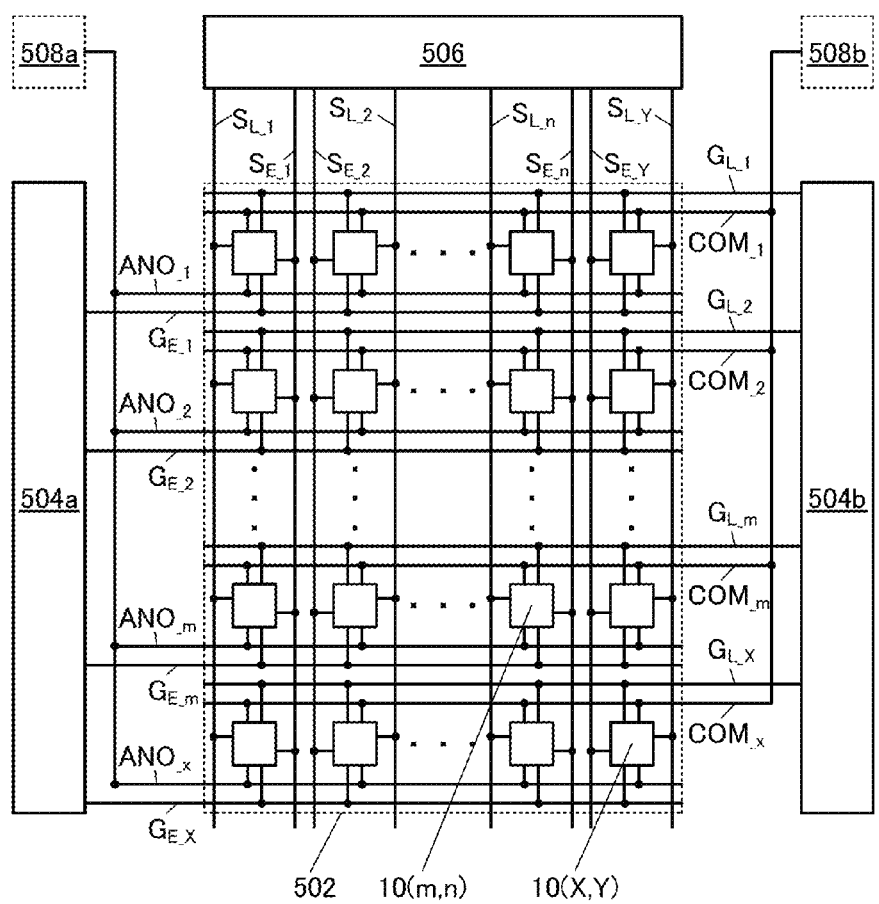
FIG. 8 is a block diagram illustrating a display device.

Although the structure in which the two gate driver circuit portions 504a and 504b are provided as gate driver circuit portions is illustrated in FIG. 8, the number of the gate driver circuit portions is not limited thereto, and one or three or more gate driver circuit portions may be provided.

[Source Driver Circuit Portion]

The source driver circuit portion 506 has a function of generating a data signal to be written to the pixels 10(X, Y) on the basis of an image signal, a function of controlling the potentials of wirings supplied with data signals (such wirings are hereinafter referred to as signal lines $S_{L\_1}$ to $S_{L\_Y}$ and signal lines $S_{E\_1}$ to $S_{E\_Y}$), or a function of supplying an initialization signal. Without being limited thereto, the source driver circuit portion 506 may have a function of generating, controlling, or supplying another signal.

The source driver circuit portion 506 includes a plurality of analog switches or the like. The source driver circuit portion 506 can output, as data signals, time-divided image signals obtained by sequentially turning on the plurality of analog switches.

Although the structure where one source driver circuit portion 506 is provided is illustrated in FIG. 8, the number of the source driver circuit portions is not limited thereto, and a plurality of source driver circuit portions may be provided in the display device 500. For example, two source driver circuit portions may be provided so that the signal lines $S_{L\_1}$ to $S_{L\_Y}$ are controlled by one of the source driver circuit portions and the signal lines $S_{E\_1}$ to $S_{E\_Y}$ are controlled by the other of the source driver circuit portions.

[Pixel]

A pulse signal is input to each of the pixels 10(X, Y) through one of the scan lines $G_{L\_1}$ to $G_{L\_X}$ and the scan lines $G_{E\_1}$ to $G_{E\_X}$. A data signal is input to each of the pixels 10(X, Y) through one of the signal lines $S_{L\_1}$ to $S_{L\_Y}$ and the signal lines $S_{E\_1}$ to $S_{E\_Y}$.

For example, the pixel 10(m, n) in the m-th row and the n-th column (m is a natural number of X or less, and n is a natural number of Y or less) is supplied with pulse signals from the gate driver circuit portion 504a through the scan lines $G_{L\_m}$ and $G_{E\_m}$ and supplied with a data signal from the source driver circuit portion 506 through the signal lines $S_{L\_n}$ and $S_{E\_n}$ in accordance with the potentials of the scan lines $G_{L\_m}$ and $G_{E\_m}$.

The pixel 10(m, n) includes two display elements as described above. The scan lines $G_{L\_1}$ to $G_{L\_X}$ are wirings which control the potential of a pulse signal supplied to one of the two display elements. The scan lines $G_{E\_1}$ to $G_{E\_X}$ are wirings which control the potential of a pulse signal supplied to the other of the two display elements.

The signal lines $S_{L\_1}$ to $S_{L\_Y}$ are wirings which control the potential of a data signal supplied to one of the two display elements. The signal lines $S_{E\_1}$ to $S_{E\_Y}$ are wirings which control the potential of a data signal supplied to the other of the two display elements.

[External Circuit]

External circuits 508a and 508b are connected to the display device 500. Note that the display device 500 may include the external circuits 508a and 508b.

As shown in FIG. 8, the external circuit 508a is electrically connected to wirings supplied with anode potentials (hereinafter referred to as anode lines ANO_1 to ANO_x) and the external circuit 508b is electrically connected to wirings supplied with common potentials (hereinafter referred to as common lines COM_1 to COM_x).

<1-2. Circuit Configuration of Pixels>

Next, the circuit configuration of the pixels 10(m, n) is described with reference to FIG. 9.

Figure 9:
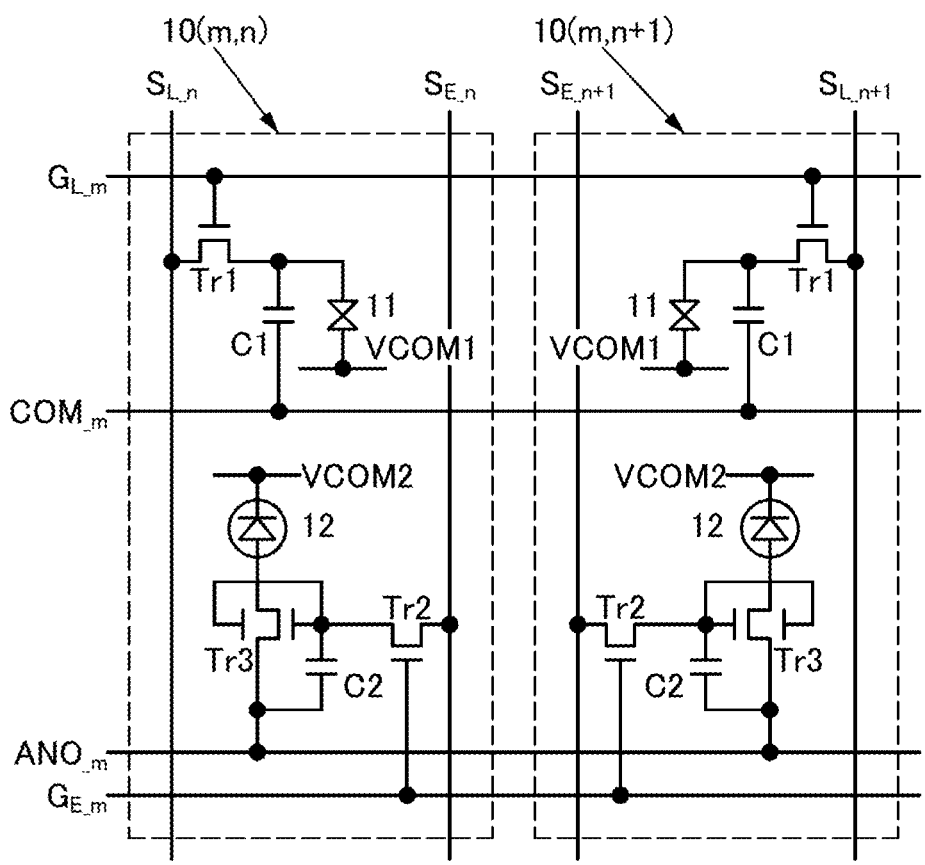
FIG. 9 is a circuit diagram illustrating pixels.

FIG. 9 is a circuit diagram showing the pixel 10(m, n) and an adjacent pixel 10(m, n+1) in a column direction of the pixel 10(m, n) which are included in the display device 500 of one embodiment of the present invention. In this specification and the like, the column direction is a direction in which the value of n of the signal line $S_{L\_n}$ (or the signal line $S_{E\_n}$) increases or decreases and the row direction is a direction in which the value of m of the scan line $G_{L\_m}$ (or the scan line $G_{E\_m}$) increases and decreases.

The pixel 10($m$, $n$) includes a transistor Tr1, a transistor Tr2, a transistor Tr3, a capacitor C1, a capacitor C2, a display element 11, and a display element 12. The pixel 10($m$, $n$+1) has a similar structure. Note that in this specification and the like, the display element 11 is called a first display element and the display element 12 is called a second display element in some cases.

The pixel 10($m$, $n$) is electrically connected to the signal line $S_{L\_n}$, the signal line $S_{E\_n}$, the scan line $G_{L\_m}$, the scan line $G_{E\_m}$, a common line COM_$m$, a common line VCOM1, a common line VCOM2, and an anode line ANO_$m$. The pixel 10($m$, $n$+1) is electrically connected to a signal line $S_{L\_n+1}$, a signal line $S_{E\_n+1}$, the scan line $G_{L\_m}$, the scan line $G_{E\_m}$, the common line COM_$m$, the common line VCOM1, the common line VCOM2, and the anode line ANO_$m$.

Each of the signal lines $S_{L\_n}$ and $S_{L\_n+1}$, the scan line $G_{L\_m}$, the common line COM_$m$, and the common line VCOM1 is a wiring for driving the display element 11. Each of the signal lines $S_{E\_n}$ and $S_{E\_n+1}$, the scan line $G_{E\_m}$, the common line VCOM2, and the anode line ANO_$m$ is a wiring for driving the display element 12.

In the case where a potential supplied to the signal line $S_{E\_n}$ and the signal line $S_{E\_n+1}$ is different from a potential supplied to the signal line $S_{L\_n}$ and the signal line $S_{L\_n+1}$, the signal line $S_{E\_n}$ and the signal line $S_{L\_n+1}$ are preferably positioned apart from each other as shown in FIG. 9. In other words, the signal line $S_{E\_n}$ is preferably positioned adjacent to the signal line $S_{E\_n+1}$. With this arrangement, an influence of the potential difference between the signal lines $S_{L\_n}$ and $S_{L\_n+1}$ and signal lines $S_{E\_n}$ and $S_{E\_n+1}$ can be reduced.

<1-3. Structure Example of First Display Element>

The display element 11 has a function of controlling transmission or reflection of light. In particular, the display element 11 is preferably a reflective display element which controls reflection of light. The display element 11 serving as a reflective display element can reduce power consumption of the display device because display can be performed with the use of external light. For example, the display element 11 may have a combined structure of a reflective film, a liquid crystal element, and a polarizing plate or a structure using micro electro mechanical systems (MEMS).

<1-4. Structure Example of Second Display Element>

The display element 12 has a function of emitting light. Therefore, the display element 12 may be rephrased as a light-emitting element. For example, an electroluminescent element (also referred to as an EL element), or a light-emitting diode may be used as the display element 12.

As described above, in the display device of one embodiment of the present invention, display elements with different functions like the display elements 11 and 12 are used. In the case where a reflective liquid crystal element is used as one of the display elements and a transmissive EL element is used as the other of the display elements, a novel display device that is highly convenient or reliable can be provided. Furthermore, a display device with low power consumption and high display quality can be provided when a reflective liquid crystal element is used in an environment with bright external light and a transmissive EL element is used in an environment with weak external light.

<1-5. Driving Method of Display Element>

Next, a method for driving the display element 11 and the display element 12 is described. Note that a structure including a liquid crystal element as the display element 11 and a light-emitting element as the display element 12 is used in the description below.

[Driving Method of First Display Element]

In the pixel 10($m$, $n$), a gate electrode of the transistor Tr1 is electrically connected to the scan line $G_{L\_m}$. One of a source electrode and a drain electrode of the transistor Tr1 is electrically connected to the signal line $S_{L\_n}$, and the other is electrically connected to one of a pair of electrodes of the display element 11. The transistor Tr1 has a function of controlling whether to write data of a data signal by being turned on or off.

The other of the pair of electrodes of the display element 11 is electrically connected to the common line VCOM1.

One of a pair of electrodes of the capacitor C1 is electrically connected to the common line COM_$m$, and the other of the pair of electrodes of the capacitor C1 is electrically connected to the other of the source electrode and the drain electrode of the transistor Tr1 and the one of the pair of electrodes of the display element 11. The capacitor C1 has a function of storing data written to the pixel 10($m$, $n$).

For example, the gate driver circuit portion 504*b* in FIG. 8 sequentially selects the pixels 10($m$, $n$) row by row to turn on the transistor Tr1, and data of data signals are written. When the transistor Tr1 is turned off, the pixel 10($m$, $n$) to which the data has been written is brought into a holding state. This operation is sequentially performed row by row; thus, an image is displayed.

[Driving Method for Second Display Element]

A gate electrode of the transistor Tr2 is electrically connected to the scan line $G_{E\_m}$ in the pixel 10($m$, $n$). One of a source electrode and a drain electrode of the transistor Tr2 is electrically connected to the signal line $S_{E\_n}$ and the other of the source electrode and the drain electrode is electrically connected to a gate electrode of the transistor Tr3. The transistor Tr2 has a function of controlling whether to write data of a data signal by being turned on or off.

One of a pair of electrodes of the capacitor C2 is electrically connected to the anode line ANO_$m$. The other of the pair of electrodes of the capacitor C2 is electrically connected to the other of the source electrode and the drain electrode of the transistor Tr2. The capacitor C2 has a function of storing data written to the pixel 10($m$, $n$).

The gate electrode of the transistor Tr3 is electrically connected to the other of the source electrode and the drain electrode of the transistor Tr2. One of a source electrode and a drain electrode of the transistor Tr3 is electrically connected to the anode line ANO_$m$. The other of the source electrode and the drain electrode of the transistor Tr3 is electrically connected to one of a pair of electrodes of the display element 12. The transistor Tr3 includes a backgate electrode. The backgate electrode is electrically connected to the gate electrode of the transistor Tr3.

The other of the pair of electrodes of the display element 12 is electrically connected to the common line VCOM2.

For example, the gate driver circuit portion 504*a* in FIG. 8 sequentially selects the pixels 10($m$, $n$) row by row to turn on the transistors Tr2, and data of data signals are written. When the transistor Tr2 is turned off, the pixel 10($m$, $n$) to which the data has been written is brought into a holding state. Furthermore, the amount of current flowing between the source electrode and the drain electrode of the transistor Tr3 is controlled in accordance with the potential of the written data signal. The display element 12 emits light with a luminance corresponding to the amount of flowing current. This operation is sequentially performed row by row; thus, an image is displayed.

In this manner, two display elements can be controlled separately with the use of different transistors in the display device of one embodiment of the present invention. Accordingly, a display device having high display quality can be provided.

It is preferable that transistors used in the display device of one embodiment of the present invention (the transistors Tr1, Tr2, and Tr3) each include an oxide semiconductor film. The transistor including an oxide semiconductor film can have relatively high field-effect mobility and thus can operate at high speed. The off-state current of the transistor including an oxide semiconductor film is extremely low. Therefore, the luminance of the display device can be kept even when the refresh rate of the display device is lowered, so that power consumption can be lowered.

A progressive type display, an interlace type display, or the like can be employed as the display type of the display element 11 and the display element 12. Further, as color elements controlled in the pixel at the time of color display, three colors of R (red), G (green), and B (blue) can be given. Note that color elements are not limited to the three colors of R, G, and B. For example, one or more colors of yellow, cyan, magenta, white, and the like may be added to RGB. Further, the sizes of display regions may be different between respective dots of color elements. However, the display device of one embodiment of the present invention is not limited to a color display device and can be applied to a monochrome display device.

<1-6. Display Region of Display Element>

Here, the display regions of the display elements 11 and 12 in the pixel 10(m, n) are described with reference to FIGS. 10A and 10B.

Figure 10A:
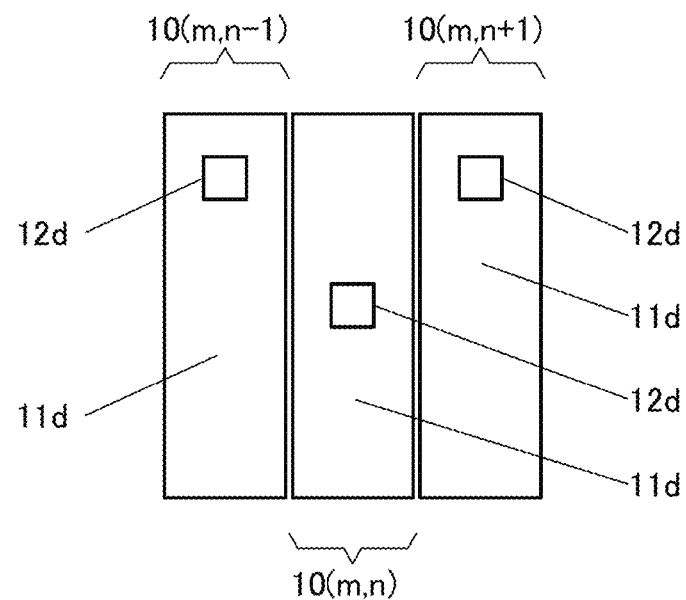
FIGS. 10A and 10B are schematic views illustrating display regions of display elements.

FIG. 10A is a schematic view illustrating display regions of the pixel 10(m, n) and pixels 10(m, n−1) and 10(m, n+1) which are adjacent to the pixel 10(m, n) in the column direction.

The pixel 10(m, n), the pixel 10(m, n−1), and the pixel 10(m, n+1) illustrated in FIG. 10A each include a display region 11d that functions as a display region of the display element 11 and a display region 12d that functions as a display region of the display element 12.

For example, the display region 11d includes a region which reflects light and the display region 12d includes a region which transmits light. Furthermore, as shown in FIG. 10A, each of the pixel 10(m, n−1) and the pixel 10(m, n+1) adjacent to the pixel 10(m, n) in the column direction of the pixel 10(m, n) preferably includes the display region 12d at a position different from the position of the display region 12d in the pixel 10(m, n).

With the arrangement of the display regions 12d shown in FIG. 10A, the manufacturing yield in the case of separately forming the display elements 12 can be increased or interference of light emitted from the display elements 12 between adjacent pixels can be suppressed.

Although an example where the pixels 10(m, n−1), 10(m, n), and 10(m, n+1) are provided in a stripe arrangement in the column direction is shown in FIG. 10A, one embodiment of the present invention is not limited thereto. For example, a stripe arrangement in the row direction shown in FIG. 10B may be employed. Alternatively, although not illustrated, delta arrangement or pentile arrangement may be used. FIG. 10B is a schematic view illustrating display regions of the pixel 10(m, n) and pixels 10(m−1, n) and 10(m+1, n) which are adjacent to the pixel 10(m, n) in the row direction of the pixel 10(m, n).

Figure 10B:
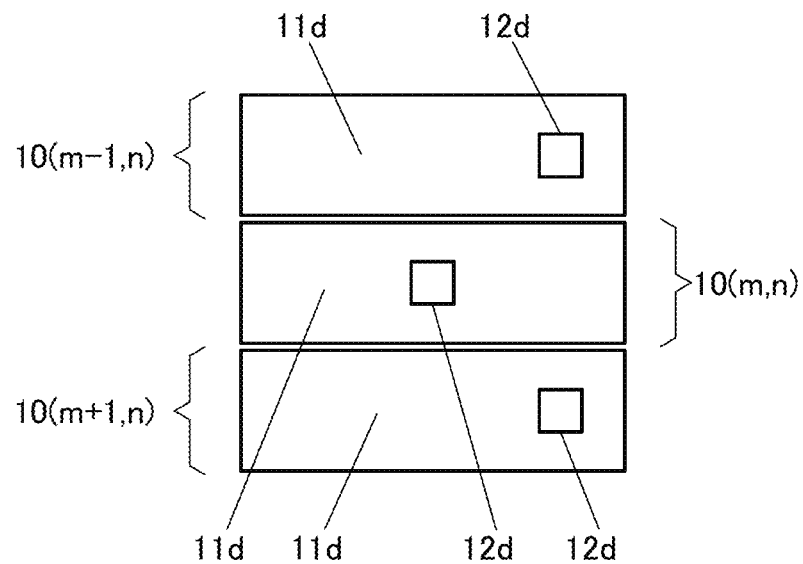

The pixel 10(m, n), the pixel 10(m−1, n), and the pixel 10(m+1, n) illustrated in FIG. 10B each include the display region 11d functioning as a display region of the display element 11 and the display region 12d functioning as a display region of the display element 12. The structures of the display regions 11d and 12d may be similar to those shown in FIG. 10A.

<1-7. Structure Example of Display Device (Top View)>

Next, a specific structure example of the display device 500 illustrated in FIG. 8 is described with reference to FIGS. 11A and 11B.

Figure 11A:
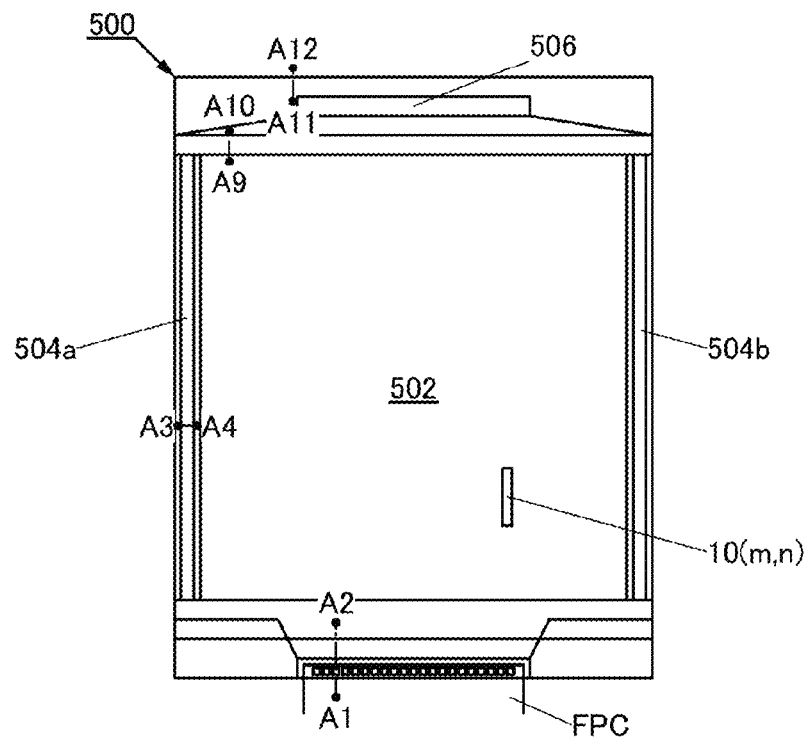
FIGS. 11A and 11B are top views illustrating a display device and pixels.

FIG. 11A is a top view of the display device 500. As described above, the display device 500 includes the pixel portion 502, the gate driver circuit portions 504a and 504b and the source driver circuit portion 506 placed outside the pixel portion 502. FIG. 11A schematically illustrates the pixel 10(m, n) included in the pixel portion 502. A flexible printed circuit (FPC) is electrically connected to the display device 500 in FIG. 11A.

Figure 11B:
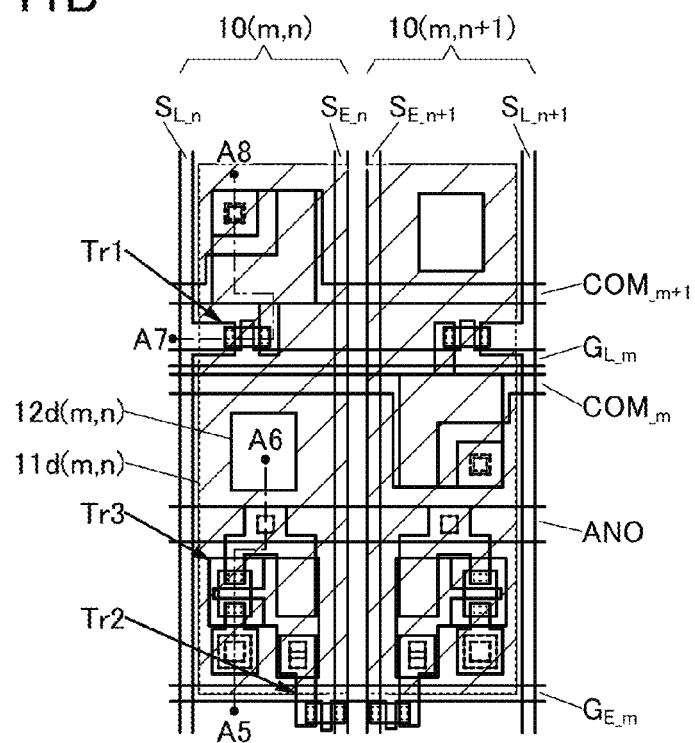
Figure 12A:
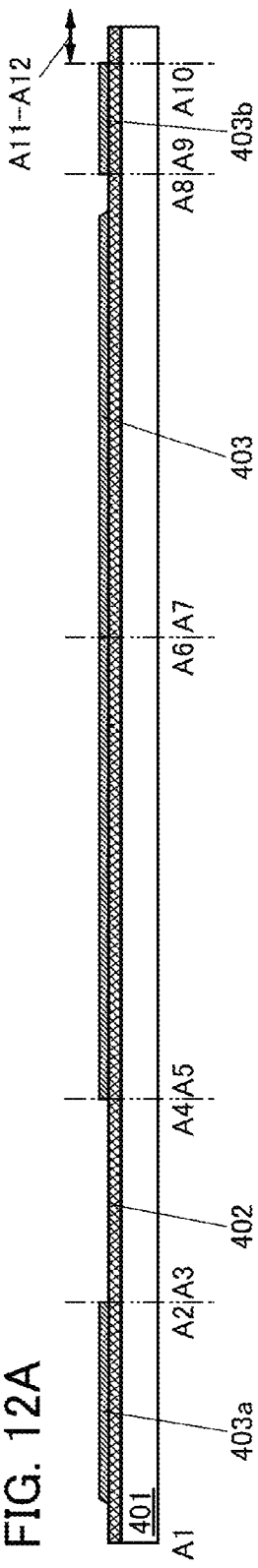
FIGS. 12A to 12C are cross-sectional views illustrating a method for manufacturing a display device.
Figure 12B:
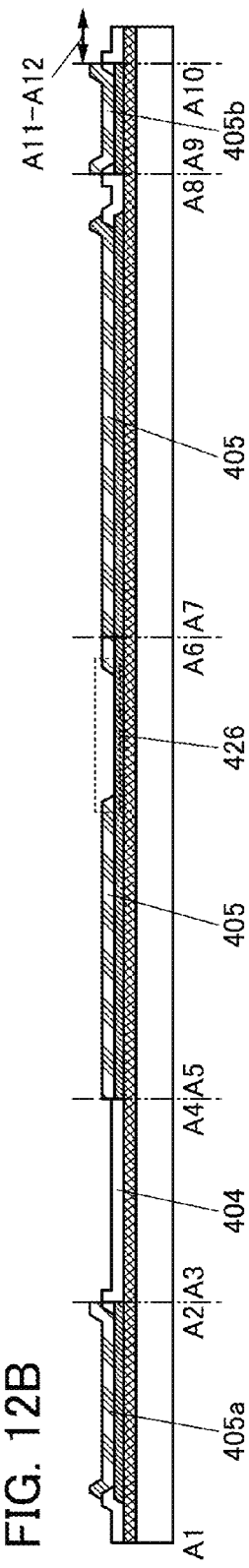
Figure 12C:
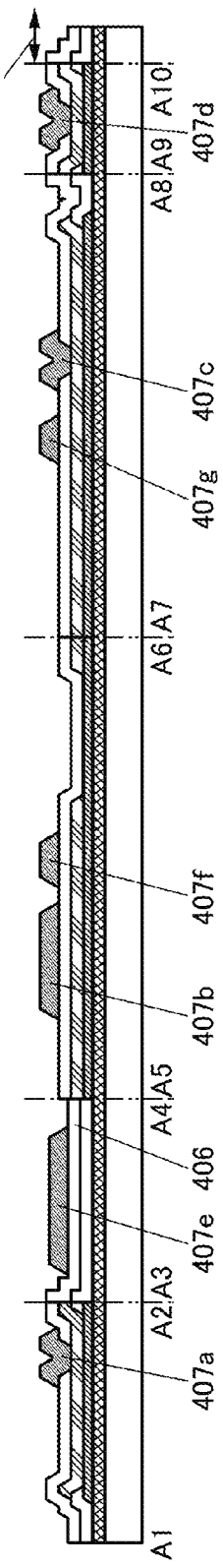

FIG. 11B is a top view schematically illustrating the pixel 10(m, n) shown in FIG. 10A and the pixel 10(m, n+1) adjacent to the pixel 10(m, n). The signal lines $S_{L\_n}$, $S_{L\_n+1}$, $S_{E\_n}$, and $S_{E\_n+1}$, the scan lines $G_{L\_m}$ and $G_{E\_m}$, the common line $COM\_m$, and the transistors Tr1, Tr2, and Tr3 in FIG. 11B respectively correspond to the reference numerals in FIG. 9. The display region 11d and the display region 12d in FIG. 11B correspond to the reference numerals in FIGS. 10A and 10B. A common line $COM\_{m+1}$ in FIG. 11B indicates a common line included in the pixel 10(m+1, n) adjacent to the pixel 10(m, n).

<1-8. Structure Example of Display Device (Cross Section)>

Next, an example of a cross-sectional structure of the display device 500 is described with reference to FIG. 1.

FIG. 1 is a cross-sectional view corresponding to cross sections taken along dashed-dotted lines A1-A2, A3-A4, A5-A6, A7-A8, A9-A10, and A11-A12 illustrated in FIGS. 11A and 11B.

A cross section taken along dashed-dotted line A1-A2 corresponds to a region in which the FPC is attached to the display device 500. A cross section taken along dashed-dotted line A3-A4 corresponds to a region in which the gate driver circuit portion 504a is provided. A cross section taken along dashed-dotted line A5-A6 corresponds to a region in which the display element 11 and the display element 12 are provided. A cross section taken along dashed-dotted line A7-A8 corresponds to a region in which the display element 11 is provided. A cross section taken along dashed-dotted line A9-A10 corresponds to a connection region of the display device 500. A cross section taken along dashed-dotted line A11-A12 corresponds to the edge of the display device 500 and the vicinity thereof.

In FIG. 1, the display device 500 includes the display element 11, the display element 12, a color film 606, and a conductive film 405 serving as a reflective electrode between a substrate 452 and a substrate 652. The display element 11 includes a conductive film 403 serving as a pixel electrode and a liquid crystal layer 620, and the display element 12 includes a conductive film 417 serving as a pixel electrode and an EL layer 419.

The conductive film 403 serving as the pixel electrode is electrically connected to the conductive film 405 serving as the reflective electrode. The conductive film 405 includes an opening 426 through which light emitted from the EL layer 419 passes. The color film 606 faces the conductive film 405 with the liquid crystal layer 620 placed therebetween. A structure body 604 and an insulating film 608 are provided in contact with the color film 606. The structure body 604 has a function of controlling the thickness of the color film 606, and the insulating film 608 has a function of protecting the color film 606. Note that the insulating film 608 is not necessarily provided.

In addition, the display device 500 includes the transistor Tr1, the transistor Tr3, and a transistor Tr4 between the substrate 452 and the substrate 652. A functional film 626 is provided over the substrate 652. The transistors Tr1, Tr3, and Tr4 are provided in contact with an insulating film 406.

As described above, the display element 11 has a function of reflecting incident light and the display element 12 has a function of emitting light. In FIG. 1, the light entering the display element 11 and the reflected light are schematically denoted by arrows of dashed lines. Furthermore, the light emitted from the display element 12 is schematically denoted by an arrow of a dashed double-dotted line.

As illustrated in FIG. 1, the conductive film 403 included in the display element 11 and the conductive film 417 included in the display element 12 at least partly face each other with the conductive film 405 placed therebetween. With such a structure, the area of the display device can be reduced.

In other words, the display device 500 in FIG. 1 has the following structure.

The display device includes a plurality of pixels. Each of the plurality of pixels independently includes the transistor Tr1, the transistor Tr3, the display element 11 serving as a liquid crystal element, and the display element 12 serving as a light-emitting element. The transistor Tr1 is provided in contact with the insulating film 406 and electrically connected to the conductive film 403 serving as one electrode of the display element 11. The transistor Tr3 is provided in contact with the insulating film 406 and electrically connected to the conductive film 417 serving as one electrode of the display element 12. The conductive film 403 is electrically connected to the conductive film 405 serving as the reflective electrode.

Note that in the above structure, the gap between the conductive film 403 and the conductive film 417 is preferably small. The gap is preferably 200 μm or less, further preferably 100 μm or less, still further preferably 50 μm or less. The conductive film 403 and the conductive film 417 serve as pixel electrodes of the respective display elements; thus, when there is a large gap between the conductive film 403 and the conductive film 417, images displayed by the different display elements are distanced away from each other. When images displayed by different display elements are distanced away from each other, a viewer who looks at the images might see a blur in the images. However, in a structure of one embodiment of the present invention, the gap between the conductive film 403 and the conductive film 417 can be small and thus, a difference in position between images displayed by different display elements can be small.

[Cross Section 1 of Pixel]

Figure 2:
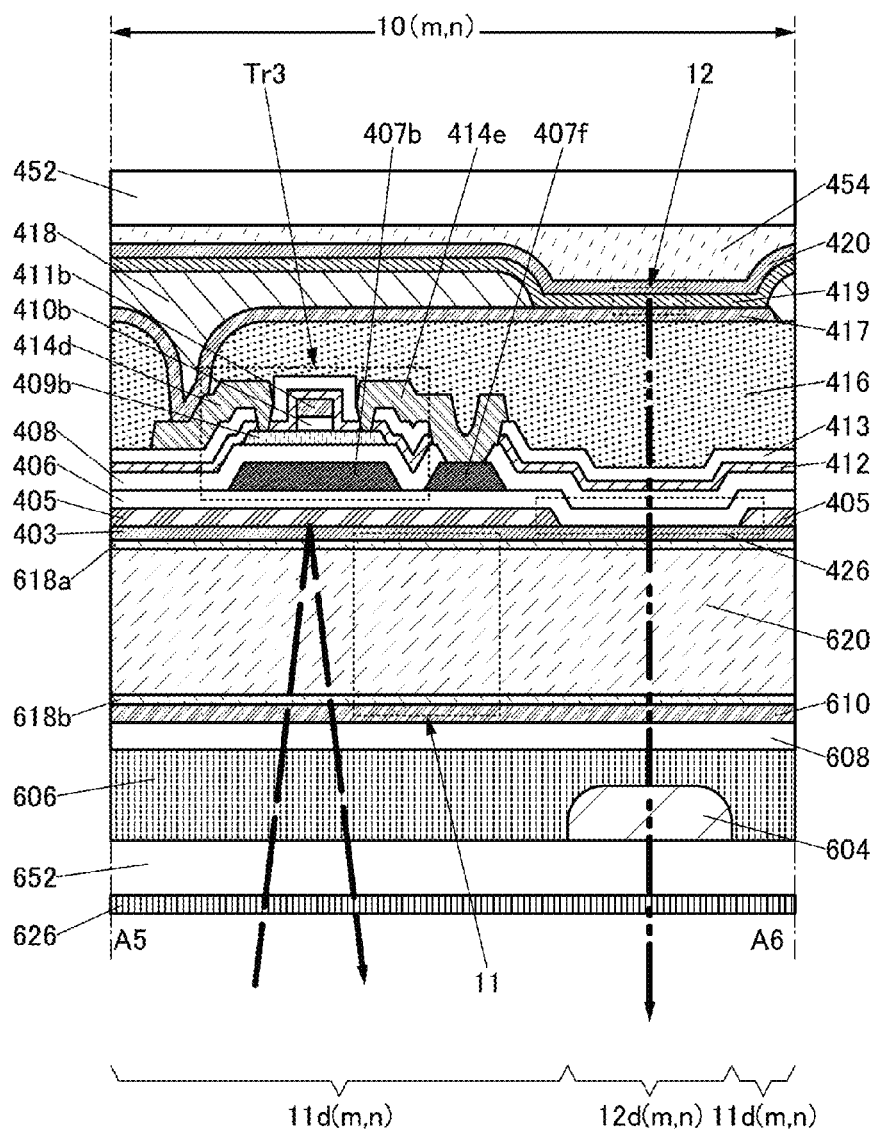
FIG. 2 is a cross-sectional view illustrating a display device.

Next, the cross section taken along dashed-dotted line A5-A6 in FIG. 1 is described in detail with reference to FIG. 2. FIG. 2 corresponds to an enlarged cross-sectional view of some components taken along dashed-dotted line A5-A6 in FIG. 1. The enlarged cross-sectional view is reversed upside down.

The display element 11 includes a conductive film 403, a liquid crystal layer 620, and a conductive film 610. The conductive film 403 functions as a pixel electrode and the conductive film 610 functions as a counter electrode.

The display element 11 includes alignment films 618a and 618b in contact with the liquid crystal layer 620 as illustrated in FIG. 2. Note that a structure without the alignment films 618a and 618b may be employed.

The display element 11 includes the conductive film 405 electrically connected to the conductive film 403. The conductive film 405 has a function of reflecting incident light. That is, the conductive film 405 functions as a reflective electrode. The opening 426 through which incident light passes is provided in the reflective electrode. Since light emitted from the display element 12 is extracted through the opening 426, the opening 426 corresponds to the display region 12d illustrated in FIGS. 10A and 10B.

Since light emitted from the display element 12 is extracted through the opening 426, the display element 12 in FIG. 2 is what is called a bottom-emission light-emitting element. Although light emitted from the display element 12 is extracted through the opening 426 in the structure example illustrated in FIG. 2, one embodiment of the present invention is not limited thereto. Light emitted from the display element 12 can be extracted through at least the region where the conductive film 405 is not provided below the display element 12.

The display element 12 includes a conductive film 417, an EL layer 419, and a conductive film 420. The conductive film 417 functions as a pixel electrode and an anode electrode. The conductive film 420 functions as a cathode electrode. Although a description is made on a structure where the conductive film 417 functions as an anode electrode and the conductive film 420 functions as a cathode electrode in this embodiment, one embodiment of the present invention is not limited thereto. For example, the conductive film 417 may function as a cathode electrode and the conductive film 420 may function as an anode electrode.

The conductive film 417 is electrically connected to the transistor Tr3.

The transistor Tr3 is formed over the insulating film 406, and includes a conductive film 407b over the insulating film 406, the insulating film 408 over the conductive film 407b, an oxide semiconductor film 409b over the insulating film 408, an insulating film 410b over the oxide semiconductor film 409b, and an oxide semiconductor film 411b over the insulating film 410b. The conductive film 407b functions as a first gate electrode, and the insulating film 408 functions as a first gate insulating film. The insulating film 410b functions as a second gate insulating film, and the oxide semiconductor film 411b functions as a second gate electrode.

Insulating films 412 and 413 are provided over the oxide semiconductor films 409b and 411b. An opening reaching the oxide semiconductor film 409b is provided in the insulating films 412 and 413 and conductive films 414d and 414e are electrically connected to the oxide semiconductor film 409b through the opening. The conductive films 414d and 414e function as a source electrode and a drain electrode of the transistor Tr3.

A conductive film 414e is electrically connected to a conductive film 407f through an opening provided in the insulating films 406, 408, 412, and 413. The conductive film 407f is formed through the same process as the conductive film 407b and functions as a connection electrode.

The insulating film 416 and the conductive film 417 are provided over the transistor Tr3. An opening reaching the conductive film 414d is provided in the insulating film 416, and the conductive film 414d and the conductive film 417 are electrically connected to each other through the opening.

An insulating film 418, the EL layer 419, and the conductive film 420 are provided over the conductive film 417. An opening reaching the conductive film 417 is provided in the insulating film 418, and the conductive film 417 and the EL layer 419 are electrically connected to each other through the opening.

The conductive film 420 is adhered to the substrate 452 with a sealing material 454 placed therebetween.

The structure body 604, the color film 606, the insulating film 608, and the conductive film 610 are provided over the substrate 652 that faces the substrate 452. A functional film 626 is provided below the substrate 652. Light reflected by the display element 11 and light emitted from the display element 12 are extracted through the color film 606, the functional film 626, and the like.

As illustrated in FIG. 2, the color film 606 is provided over the substrate having a depression and a projection. Specifically, the color film 606 is provided to cover the substrate 652 and the structure body 604 formed over the substrate 652. When the color film 606 is provided over the substrate having a depression and a projection, the thickness of the color film 606 over the depression and that of the color film 606 over the projection can be made different. The color film 606 over the depression is thicker than the color film 606 over the projection.

With such a structure, the display element 11 and the display element 12 can be different from each other in the thickness of the color film 606 or in whether or not the color film 606 is provided. When the display element 11 and the display element 12 are different from each other in the thickness of the color film 606 or in whether or not the color film 606 is provided, the color film can have a structure that is suitable for each of the display elements. Accordingly, a display device with a high color purity can be provided.

When the thickness of the color film 606 is varied with the use of the structure body 604, the color film 606 does not need to be formed separately for the display element 11 and the display element 12, which can reduce manufacturing cost. For example, in the case where the color film 606 for three primary colors of R, G, and B is necessary and the color film 606 is formed separately for the display element 11 and the display element 12, it is necessary to perform a total of six separate fabrication steps for R, G, and B of the display element 11 and those of the display element 12. In contrast, by the use of the structure body 604, the thickness of the color film 606 can be made different between the display element 11 and the display element 12 by four steps of a step for forming the structure body 604 and steps for forming R, G, and B.

[Cross Section 2 of Pixel]

Figure 3:
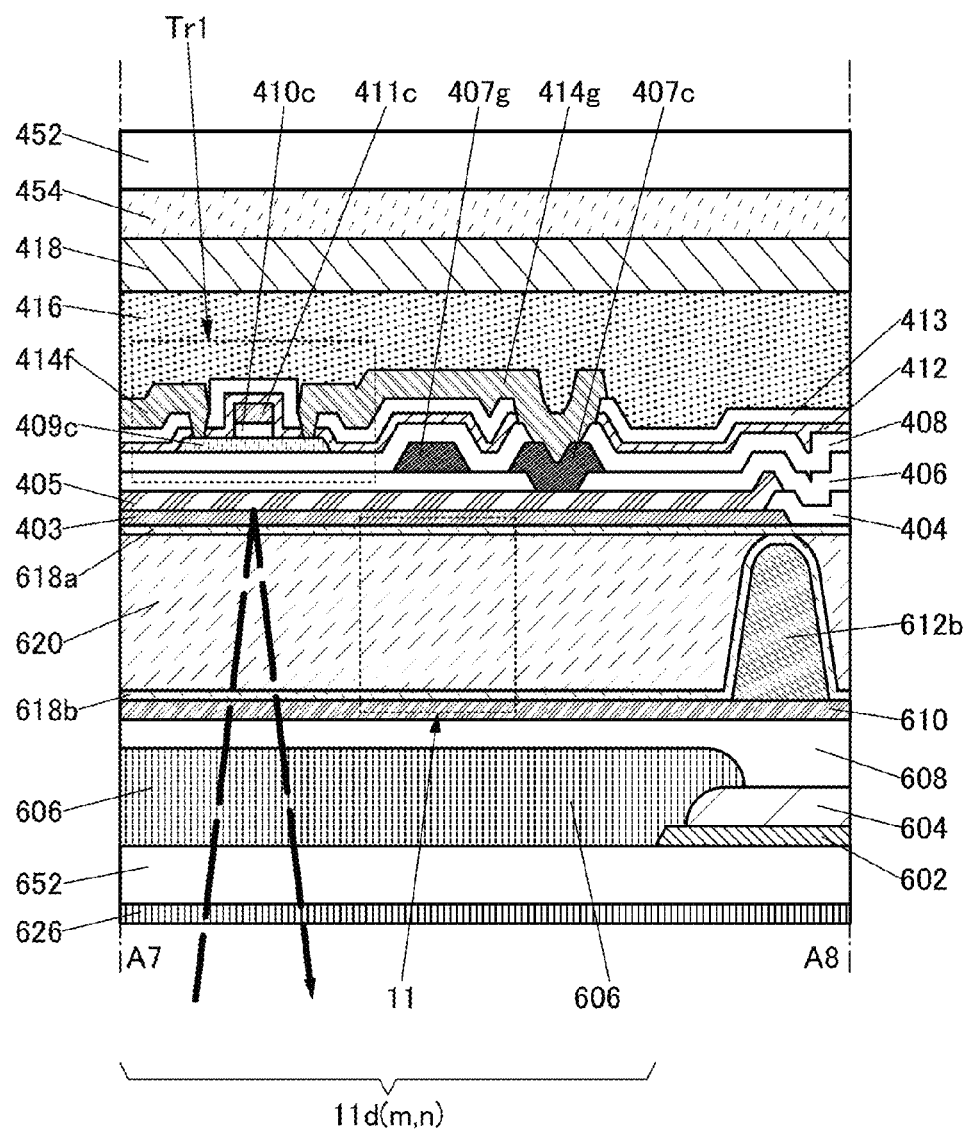
FIG. 3 is a cross-sectional view illustrating a display device.

Next, the cross section taken along dashed-dotted line A7-A8 in FIG. 1 is described in detail with reference to FIG. 3. FIG. 3 corresponds to an enlarged cross-sectional view of some components taken along dashed-dotted line A7-A8 in FIG. 1. The enlarged cross-sectional view is reversed upside down.

The portions that are already described are denoted by the same reference numerals, and a detailed description of the portions is omitted.

The transistor Tr1 illustrated in FIG. 3 is formed over an insulating film 406 and an insulating film 408 and includes an oxide semiconductor film 409*c* over the insulating film 408, an insulating film 410*c* over the oxide semiconductor film 409*c*, and an oxide semiconductor film 411*c* over the insulating film 410*c*. The insulating film 410*c* functions as a gate insulating film and the oxide semiconductor film 411*c* functions as a gate electrode.

Insulating films 412 and 413 are provided over the oxide semiconductor films 409*c* and 411*c*. An opening reaching the oxide semiconductor film 409*c* is provided in the insulating films 412 and 413 and conductive films 414*f* and 414*g* are electrically connected to the oxide semiconductor film 409*c* through the opening. The conductive films 414*f* and 414*g* function as a source electrode and a drain electrode of the transistor Tr1.

Conductive films 407*g* and 407*c* are provided below the conductive film 414*g*. The conductive films 407*g* and 407*c* are formed by processing the same conductive film as that used for forming the conductive film 407*b* of the transistor Tr3. The conductive film 407*g* serves as a wiring and the conductive film 407*c* serves as a connection electrode. An opening reaching the conductive film 407*c* is provided in the insulating films 408, 412, and 413, and the conductive film 414*g* and the conductive film 407*c* are electrically connected through the opening. An opening reaching the conductive film 405 is provided in the insulating film 406, and the conductive film 407*c* and the conductive film 405 are electrically connected through the opening. Since the conductive film 405 is formed in contact with the conductive film 403, the conductive film 403 and the transistor Tr1 are electrically connected to each other.

Insulating films 416 and 418 are provided over the transistor Tr1.

Each of the transistor Tr3 and the transistor Tr1 preferably has a staggered structure (also referred to as a top gate structure) as illustrated in FIG. 2 and FIG. 3. When the staggered structure is employed, parasitic capacitance that can be generated between a gate electrode and a source electrode and between the gate electrode and a drain electrode can be reduced. However, one embodiment of the present invention is not limited to this, and a transistor having an inverted staggered structure (also referred to as a bottom gate structure) may be used.

When the transistors have the structures as illustrated in FIG. 2 and FIG. 3, the area of the circuit can be reduced. Specifically, the transistor Tr1 is a single-gate transistor in which the oxide semiconductor film 411*c* functioning as a gate electrode is provided, whereas the transistor Tr3 is a multi-gate transistor in which the conductive film 407*b* functioning as a first gate electrode and the oxide semiconductor film 411*b* functioning as a second gate electrode are provided. Note that there is no limitation on the structure of the transistor that is used in the display device of one embodiment of the present invention. For example, both the transistors Tr1 and Tr3 may have either a single-gate structure or a multi-gate structure.

A light-blocking film 602, the structure body 604, the color film 606, the insulating film 608, and the conductive film 610 are provided over the substrate 652 that faces the substrate 452.

A structure body 612*b* is formed between the conductive film 403 and the conductive film 610. The structure body 612*b* has a function of controlling the thickness of the liquid crystal layer 620. The alignment films 618*a* and 618*b* are formed between the structure body 612*b* and the conductive film 403 in FIG. 3. Note that the alignment films 618*a* and 618*b* are not necessarily formed between the structure body 612*b* and the conductive film 403.

[Cross Sections of FPC Region and Gate Driver Circuit Portion]

Figure 4:
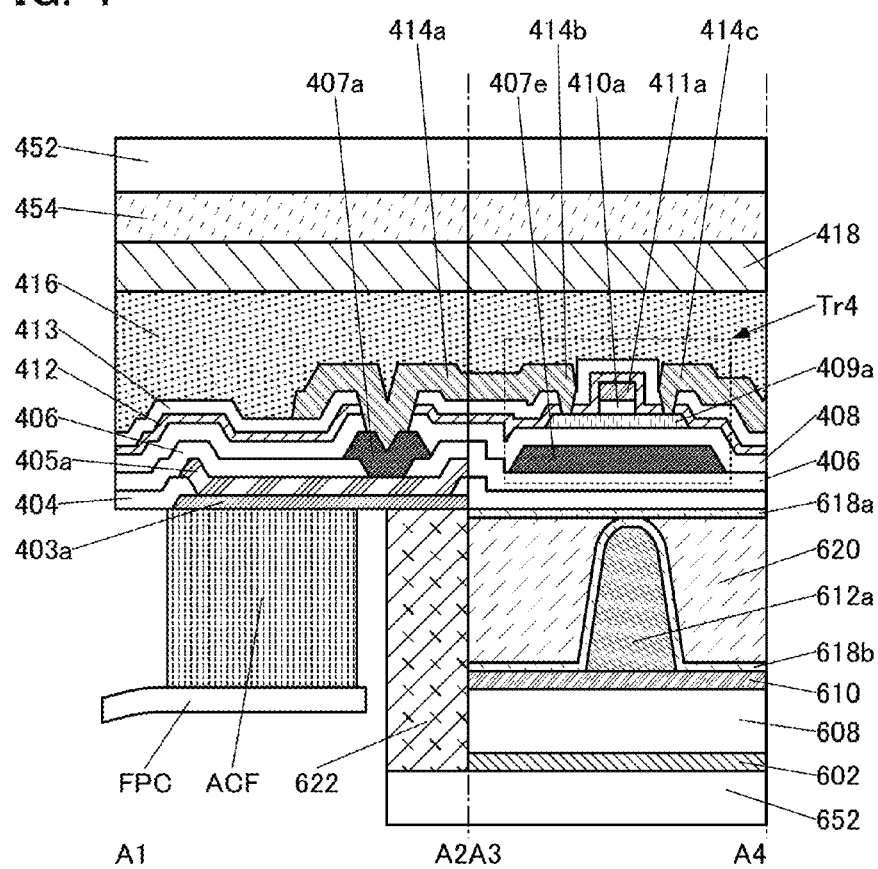
FIG. 4 is a cross-sectional view illustrating a display device.

The cross-sections taken along dashed-dotted lines A1-A2 and A3-A4 in FIG. 1 are described in detail with reference to FIG. 4. FIG. 4 corresponds to an enlarged cross-sectional view of components taken along dashed-dotted lines A1-A2 and A3-A4 in FIG. 1. The enlarged cross-sectional view is reversed upside down. Note that in FIG. 4, some components are not illustrated in order to avoid complexity of the drawing.

The FPC illustrated in FIG. 4 is electrically connected to a conductive film 403a with an anisotropic conductive film (ACF) placed therebetween. An insulating film 404 is provided over the conductive film 403a. An opening reaching the conductive film 403a is provided in the insulating film 404, and the conductive film 403a and a conductive film 405a are electrically connected to each other through the opening.

The insulating film 406 is provided over the conductive film 405a. An opening reaching the conductive film 405a is provided in the insulating film 406, and the conductive film 405a and a conductive film 407a are electrically connected to each other through the opening. The insulating films 408, 412, and 413 are provided over the conductive film 407a. An opening reaching the conductive film 407a is provided in the insulating films 408, 412, and 413 and the conductive film 407a and a conductive film 414a are electrically connected to each other through the opening.

The insulating films 416 and 418 are provided over the insulating film 413 and the conductive film 414a. The insulating film 418 is adhered to the substrate 452 with the sealing material 454 placed therebetween.

The transistor Tr4 illustrated in FIG. 4 corresponds to a transistor included in the gate driver circuit portion 504a.

The transistor Tr4 is formed over the insulating film 406 and includes a conductive film 407e over the insulating film 406, the insulating film 408 over the conductive film 407e, an oxide semiconductor film 409a over the insulating film 408, an insulating film 410a over the oxide semiconductor film 409a, and an oxide semiconductor film 411a over the insulating film 410a. The conductive film 407e functions as a first gate electrode. The insulating film 410a functions as a second gate insulating film and the oxide semiconductor film 411a functions as a second gate electrode.

The insulating films 412 and 413 are provided over the oxide semiconductor films 409a and 411a. An opening reaching the oxide semiconductor film 409a is provided in the insulating films 412 and 413 and conductive films 414b and 414c are electrically connected to the oxide semiconductor film 409a through the opening. The conductive films 414b and 414c function as a source electrode and a drain electrode of the transistor Tr4.

The transistor Tr4 is a multi-gate transistor like the transistor Tr3 described above. A multi-gate transistor is preferably used in the gate driver circuit portion 504a because the current drive capability can be improved. Since the use of a multi-gate transistor can improve the current drive capability, the width of the driver circuit can be reduced.

The insulating films 416 and 418 are provided over the transistor Tr4. The insulating film 418 is adhered to the substrate 452 with the sealing material 454 placed therebetween.

The light-blocking film 602, the insulating film 608, and the conductive film 610 are provided over the substrate 652 that faces the substrate 452.

A structure body 612a is formed over the conductive film 610 in a position overlapping with the transistor Tr4. The structure body 612a has a function of controlling the thickness of the liquid crystal layer 620. The alignment films 618a and 618b are formed between the structure body 612a and the insulating film 404 in FIG. 4. Note that the alignment films 618a and 618b are not necessarily formed between the structure body 612a and the insulating film 404.

A sealant 622 is provided at an end portion of the substrate 652. Note that the sealant 622 is provided between the substrate 652 and the conductive film 403a.

[Cross Sections of Connection Region and Region in the Vicinity of End Portion]

Figure 5:
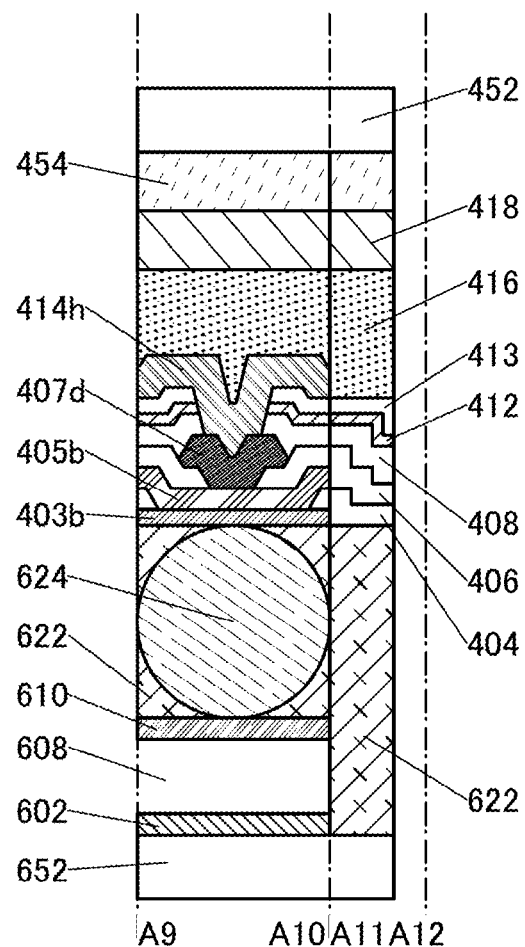
FIG. 5 is a cross-sectional view illustrating a display device.

The cross sections taken along dashed-dotted lines A9-A10 and A11-A12 in FIG. 1 are described in detail with reference to FIG. 5. FIG. 5 corresponds to an enlarged cross-sectional view of components taken along dashed-dotted lines A9-A10 and A11-A12 in FIG. 1. The enlarged cross-sectional view is reversed upside down. Note that in FIG. 5, some components are not illustrated in order to avoid complexity of the drawing.

In FIG. 5, the conductive film 610 is electrically connected to a conductive film 403b with a conductor 624 placed therebetween. The conductor 624 is included in the sealant 622. The conductive film 610 is provided over the substrate 652, the light-blocking film 602, and the insulating film 608.

The insulating film 404 is provided over the conductive film 403b. An opening reaching the conductive film 403b is provided in the insulating film 404, and the conductive film 403b and a conductive film 405b are electrically connected to each other through the opening. The insulating film 406 is provided over the conductive film 405b. An opening reaching the conductive film 405b is provided in the insulating film 406, and the conductive film 405b and a conductive film 407d are electrically connected to each other through the opening.

The insulating films 408, 412, and 413 are provided over the conductive film 407d. An opening reaching the conductive film 407d is provided in the insulating films 408, 412, and 413 and the conductive film 407d and a conductive film 414h are electrically connected to each other through the opening. The insulating films 416 and 418 are provided over the conductive film 414h. The insulating film 418 is adhered to the substrate 452 with the sealing material 454 placed therebetween.

The sealant 622 is provided at end portions of the substrates 452 and 652. Note that the sealant 622 is provided between the substrate 652 and the insulating film 404.

<1-9. Structure 2 of Display Device>

Next, a display device with a structure different from that of the display device 500 in FIG. 1 is described with reference to FIG. 6. Note that FIG. 6 is a cross-sectional view of a display device 500A.

Figure 6:
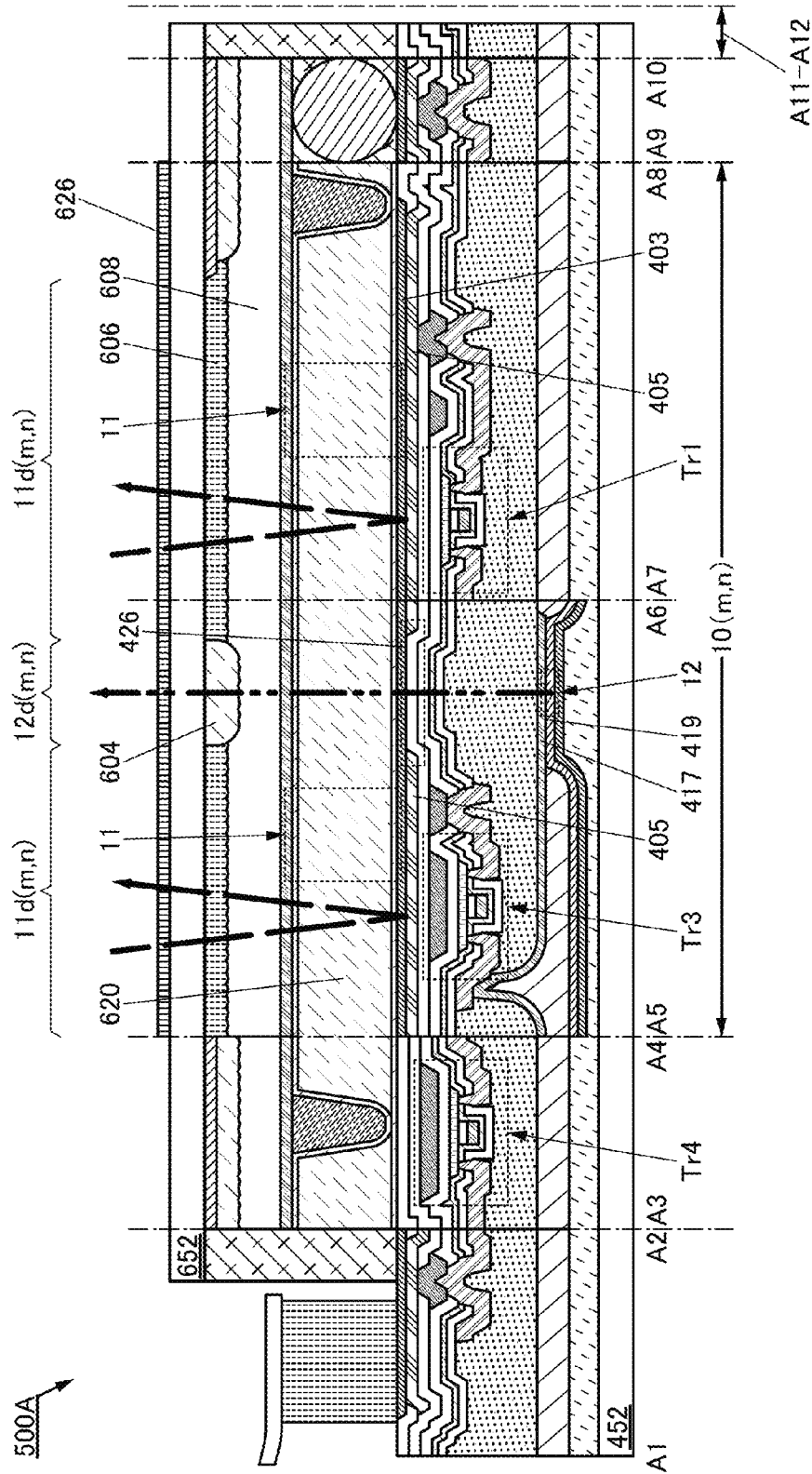
FIG. 6 is a cross-sectional view illustrating a display device.

Except for the structures of the structure body 604, the color film 606, and the insulating film 608, the display device 500A in FIG. 6 has a structure and an effect similar to those of the display device 500.

The color film 606 in the display device 500A has unevenness at the interface with the insulating film 608. Furthermore, the color film 606 in the display device 500A is not provided in a position overlapping with the structure body 604.

When the structure of the display device 500A is employed, light reflected at the display element 11 is extracted to the outside through the color film 606, and light emitted from the display element 12 is extracted to the outside without passing through the color film 606. For example, in the case where the display elements 12 in adjacent pixels include organic EL elements emitting red, green, and blue light, a structure without the color film 606 has an advantage in emission efficiency. In addition, since no light is absorbed by the color film 606, the power consumption of the display device can be reduced.

Unevenness is provided at the interface between the color film 606 and the insulating film 608 as illustrated in FIG. 6, whereby the incident angle of external light that is incident on the conductive film 405 serving as the reflective electrode can be small. As a result, a display device with a wide viewing angle can be provided.

<1-10. Structure 3 of Display Device>

Next, a display device with a structure different from that of the display device 500 in FIG. 1 is described with reference to FIG. 7. Note that FIG. 7 is a cross-sectional view of a display device 500B.

Figure 7:
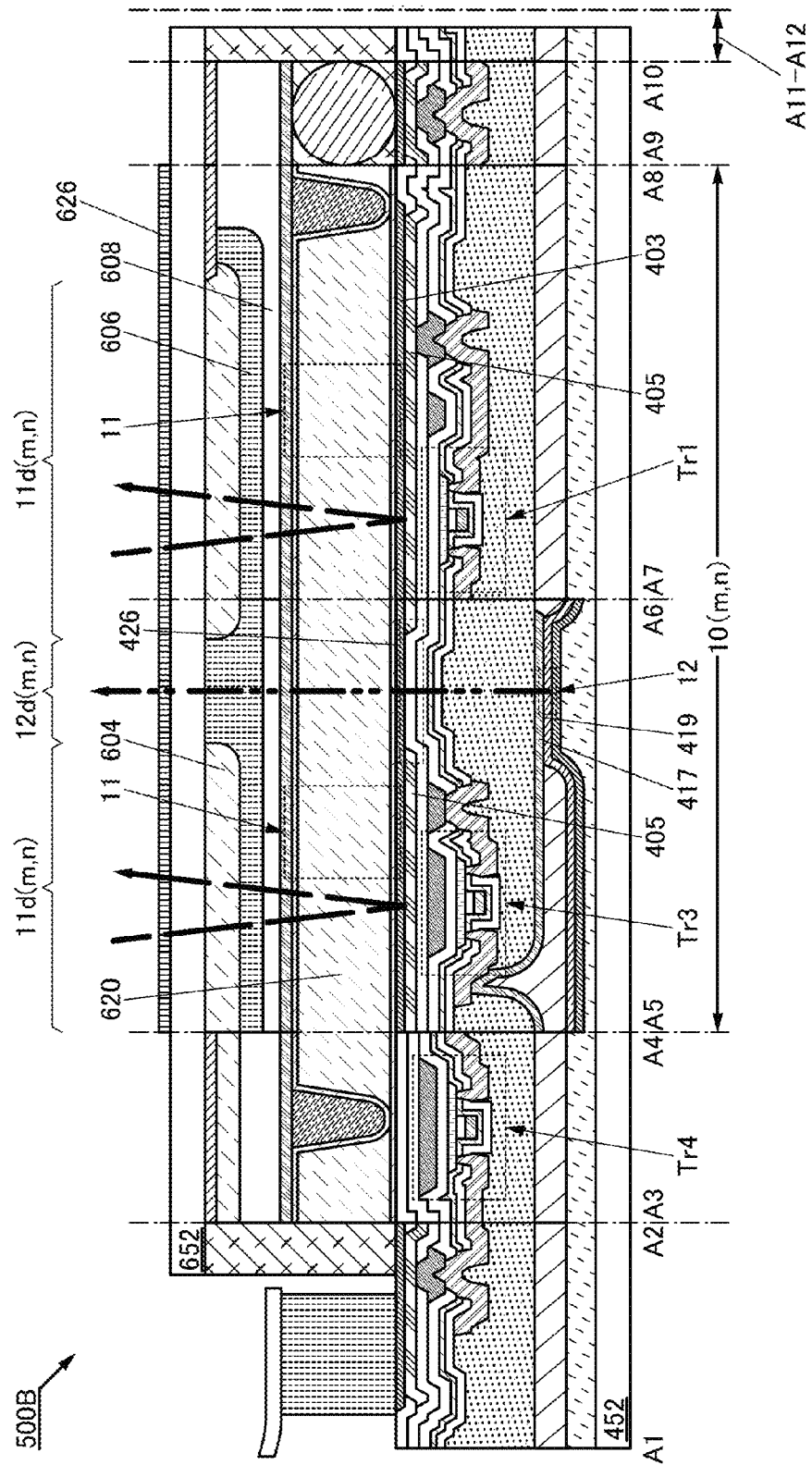
FIG. 7 is a cross-sectional view illustrating a display device.

Except for the structures of the structure body 604, the color film 606, and the insulating film 608, the display device 500B in FIG. 7 has a structure and an effect similar to those of the display device 500.

The structure body 604 in the display device 500B is provided in a position overlapping with a display region 11d(m, n).

When the structure of the display device 500B is employed, the thickness of the color film 606 overlapping with the display region 11d(m, n) is small and that of the color film 606 overlapping with the display region 12d(m, n) is large.

For example, in the case where the display element 11 is a reflective display element and the EL layer 419 of the display element 12 emits white light, the structure of the display device 500B is preferably employed.

For example, since the display element 11 is a reflective display element, light that enters the display element 11 passes through the color film 606 twice as indicated by a dashed line arrow in FIG. 7. In contrast, light emitted from the display element 12 passes through the color film 606 only once as indicated by a dashed-two dotted line arrow in FIG. 7. Accordingly, when the structure of the display device 500B in FIG. 7 is employed, the thickness of the color film 606 in a region overlapping with the display region 12d(m, n) is preferably more than or equal to twice that of the color film 606 in a region overlapping with the display region 11d(m, n).

<1-11. Manufacturing Method of Display Device>

Next, a method for manufacturing the display device 500 illustrated in FIG. 1 is described with reference to FIGS. 12A to 12C, FIGS. 13A to 13C, FIGS. 14A to 14C, FIGS. 15A to 15C, FIGS. 16A to 16C, FIGS. 17A and 17B, and FIG. 18. FIGS. 12A to 12C to FIG. 18 are cross-sectional views illustrating a method for manufacturing the display device 500.

[Process for Forming First Element]

First, a conductive film 402 is formed over a substrate 401. Then, a conductive film is formed over the conductive film 402 and processed into island shapes, whereby the conductive films 403a, 403b, and 403 are formed (see FIG. 12A).

The conductive film 402 has a function of a separation layer, the conductive films 403a and 403b each have a function of a connection electrode, and the conductive film 403 has a function of a pixel electrode.

An insulating film is formed over the conductive films 402, 403a, 403b, and 403 and openings are formed in desired regions of the insulating film, whereby the insulating film 404 is formed. Then, a conductive film is formed over the conductive films 403a, 403b, and 403 and the insulating film 404 and processed into island shapes, whereby the conductive films 405a, 405b, and 405 are formed (see FIG. 12B).

The insulating film 404 has openings in regions overlapping with the conductive films 403a, 403b, and 403. The conductive film 403a is electrically connected to the conductive film 405a through the opening, the conductive film 403b is electrically connected to the conductive film 405b through the opening, and the conductive film 403 is electrically connected to the conductive film 405 through the opening.

An insulating film is formed over the insulating film 404 and the conductive films 405a, 405b, and 405 and openings are formed in desired regions of the insulating film, whereby the insulating film 406 is formed. A conductive film is formed over the conductive films 405a, 405b, and 405 and the insulating film 406 and processed into island shapes, whereby the conductive films 407a, 407b, 407c, 407d, 407e, 407f, and 407g are formed (see FIG. 12C).

The insulating film 406 has openings in regions overlapping with the conductive films 405a, 405b, and 405. The conductive film 405a, the conductive film 405b, and the conductive film 405 are electrically connected to the conductive film 407a, the conductive film 407d, and the conductive film 407c, respectively, through the openings.

Next, the insulating film 408 is formed over the insulating film 406 and the conductive films 407a, 407b, 407c, 407d, 407e, 407f, and 407g. Then, an oxide semiconductor film is formed over the insulating film 408 and processed into island shapes, whereby the island-shaped oxide semiconductor films 409a, 409b, and 409c are formed (see FIG. 13A).

Figure 13A:
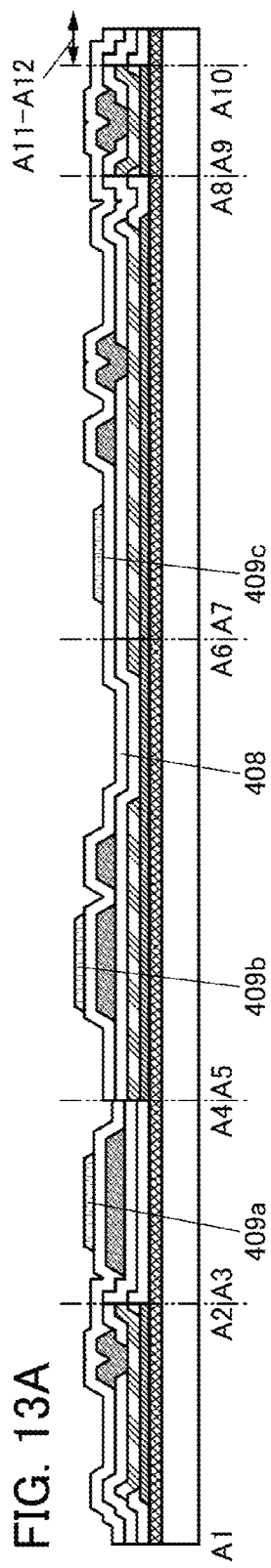
FIGS. 13A to 13C are cross-sectional views illustrating a method for manufacturing a display device.
Figure 13B:
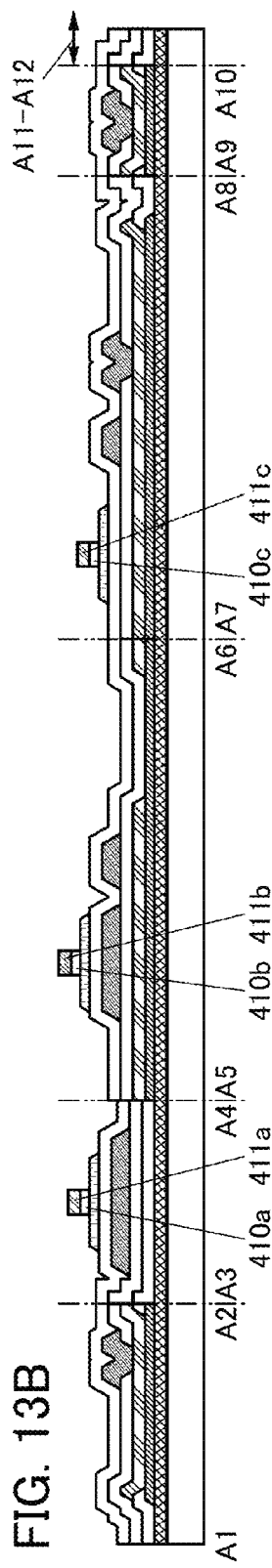

Next, an insulating film and an oxide semiconductor film are formed over the insulating film 408 and the oxide semiconductor films 409a, 409b, and 409c and processed into desired shapes, whereby the island-shaped insulating films 410a, 410b, and 410c and the island-shaped oxide semiconductor films 411a, 411b, and 411c are formed (see FIG. 13B).

Figure 13C:
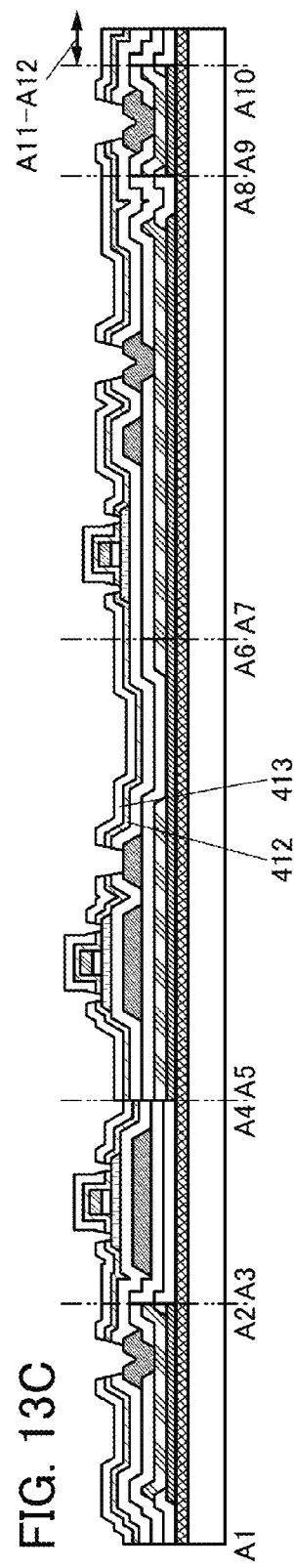

Next, insulating films are formed over the insulating film 408, the oxide semiconductor films 409a, 409b, and 409c, and the oxide semiconductor films 411a, 411b, and 411c and openings are formed in desired regions of the insulating films, whereby the insulating films 412 and 413 are formed (see FIG. 13C).

Although a two-layer structure of the insulating films 412 and 413 is illustrated in FIG. 13C, the present invention is not limited thereto. For example, a single-layer structure of the insulating film 412, a single-layer structure of the insulating film 413, or a stacked-layer structure of three or more layers in which the insulating films 412 and 413 and another insulating film are stacked may be used. When openings are formed in the insulating films 412 and 413, openings are also formed in part of the insulating film 408. Openings formed in the insulating films 408, 412, and 413 reach the conductive films 407a, 407c, 407d, and 407f.

Next, a conductive film is formed over the insulating film 413 and processed into desired shapes, whereby the conductive films 414a, 414b, 414c, 414d, 414e, 414f, 414g, and 414h are formed (see FIG. 14A).

The conductive films 414b and 414c function as a source electrode and a drain electrode of the transistor Tr4. The conductive films 414d and 414e function as a source electrode and a drain electrode of the transistor Tr3. The conductive films 414f and 414g function as a source electrode and a drain electrode of the transistor Tr1.

In the transistor Tr1, the conductive film 414g is electrically connected to the conductive film 403 with the conductive films 407c and 405 placed therebetween. The transistor Tr1 can control the potential of the conductive film 403.

Next, the insulating film 416 is formed to cover the transistors Tr1, Tr3, and Tr4. The insulating film 416 has an opening in a region overlapping with the conductive film 414*d*. Next, a conductive film is formed over the insulating film 416 and the conductive film 414*d* and processed into a desired shape, whereby the conductive film 417 is formed. Then, the insulating film 418 is formed in a desired region over the insulating film 416 and the conductive film 417. The insulating film 418 has an opening in a region overlapping with the conductive film 417 (see FIG. 14B).

Next, the EL layer 419 is formed over the conductive film 417 and the insulating film 418, and the conductive film 420 is formed over the EL layer 419 (see FIG. 14C).

The conductive film 417, the EL layer 419, and the conductive film 420 form the display element 12. The conductive film 417 functions as one of a pair of electrodes of the display element 12, and the conductive film 420 functions as the other thereof. Although not illustrated, it is preferable that the EL layers 419 be separately formed for color elements (RGB). However, one embodiment of the present invention is not limited to this structure and the EL layer 419 is not necessarily formed separately for color elements (RGB). In that case, the EL layer 419 capable of emitting white light is formed.

Through the above steps, an element formed over the substrate 401 can be fabricated.

[Process for Forming Second Element]

Next, a method for manufacturing the substrate 652 disposed to face the substrate 452 is described with reference to FIGS. 15A to 15C and FIGS. 16A to 16C.

First, the light-blocking film 602 is formed over the substrate 652. After that, the structure body 604 is formed in desired regions over the substrate 652 and the light-blocking film 602 (see FIG. 15A).

The structure body 604 is formed in a region where the color film 606 to be formed later is not intended to be provided or a region where the thickness of the color film 606 is intended to be small. The structure in which the structure body 604 is provided is favorable in the case where a reflective display element and a transmissive display element which have different functions are provided as in the display device of one embodiment of the present invention and the reflective display element and the transmissive display element are different in the structure of the color film 606. Although the structure body 604 is also provided over the light-blocking film 602 in the example described in this embodiment, one embodiment of the present invention is not limited thereto and the structure body 604 is not necessarily provided over the light-blocking film 602.

Next, the color film 606 is formed over the substrate 652, the light-blocking film 602, and the structure body 604 (see FIG. 15B).

In FIG. 15B, the color film 606 is formed to cover the structure body 604. For example, when the color film 606 is formed using an organic resin material or the like, the color film 606 is thinner over the structure body 604 than in the region where the structure body 604 is not provided. As described above, by providing the color film 606 over the substrate having a depression and a projection, the thickness of the color film 606 can be varied.

Next, the insulating film 608 is formed over the structure body 604 and the color film 606. Then, the conductive film 610 is formed over the insulating film 608. Next, the structure bodies 612*a* and 612*b* are formed in desired regions over the conductive film 610. Then, the alignment film 618*b* is formed over the conductive film 610 and the structure bodies 612*a* and 612*b* (see FIG. 15C).

Note that a structure without the alignment film 618*b* may be employed. Although the structure bodies 612*a* and 612*b* are formed over the substrate 652 in this embodiment, the present invention is not limited thereto. For example, the structure bodies 612*a* and 612*b* may be formed over the above-described element formed over the substrate 401.

Through the above steps, an element formed over the substrate 652 can be fabricated.

Note that in the case of the display device 500A illustrated in FIG. 6, the elements over the substrate 652 can be fabricated by the manufacturing method illustrated in FIGS. 16A to 16C.

First, the steps up to the step illustrated in FIG. 15B are performed (see FIG. 16A).

Then, irradiation with plasma 648 is performed from above the structure body 604 and the color film 606. By the irradiation with the plasma 648, part of the surfaces of the structure body 604 and the color film 606 are etched. Furthermore, the irradiation with the plasma 648 forms minute unevenness on the surfaces of the structure body 604 and the color film 606 (see FIG. 16B).

In this embodiment, irradiation with oxygen plasma is performed as the irradiation with the plasma 648. However, one embodiment of the present invention is not limited thereto, and plasma excited with hydrogen or an inert gas such as helium, neon, or argon or plasma excited with a nitrogen gas can be used as the plasma 648. Alternatively, the surfaces of the structure body 604 and the color film 606 may be etched with the use of a chemical solution, a gas, or the like instead of the plasma 648.

Next, the insulating film 608 is formed over the structure body 604 and the color film 606. Then, the conductive film 610 is formed over the insulating film 608. Next, the structure bodies 612*a* and 612*b* are formed in desired regions over the conductive film 610. Then, the alignment film 618*b* is formed over the conductive film 610 and the structure bodies 612*a* and 612*b* (see FIG. 16C).

Note that as illustrated in FIG. 16C, it is favorable that unevenness formed on the surface of the color film 606 is also formed at the interface with the insulating film 608. It is more favorable that the unevenness be reduced at the interface between the insulating film 608 and the conductive film 610. For example, when the color film 606 and the insulating film 608 are formed using an organic resin material or the like, the refractive index difference between the color film 606 and the insulating film 608 is small. In contrast, when the conductive film 610 is formed using a transparent conductive film (e.g., ITO), the refractive index difference between the insulating film 608 and the conductive film 610 is large. Unevenness at an interface where a refractive index difference is large sometimes reduces viewability.

Through the above steps, an element formed over the substrate 652 can be fabricated.

[Step of Separating First Element]

Next, the element formed over the substrate 401 is separated from the substrate 401. Specifically, separation is conducted at an interface between the conductive film 402 formed over the substrate 401 and the conductive films 403*a*, 403*b*, and 403 and the insulating film 404 which are formed over the conductive film 402. For the separation, the sealing material 454 is formed over the element formed over the substrate 401. Then, the substrate 452 is attached to the sealing material 454 and the element is separated at the interface between the element and the conductive film 402 (see FIG. 17A).

When the element is separated at the interface between the element and the conductive film 402, surfaces of the conductive films 403*a*, 403*b*, and 403 (bottom surfaces of the conductive films 403*a*, 403*b*, and 403 in FIG. 17A) are exposed. In the case where an insulating film, a foreign substance, or the like is attached to the surfaces of the conductive films 403*a*, 403*b*, and 403, the insulating film, the foreign substance, or the like is preferably removed by cleaning treatment, ashing treatment, etching treatment, or the like.

When the element is separated at the interface between the element and the conductive film 402, a polar solvent (typically water), a nonpolar solvent, or the like is preferably added to the interface between the conductive film 402 and the conductive films 403*a*, 403*b*, and 403 and the insulating film 404 which are formed over the conductive film 402. For example, it is preferable to use water in separating the element at the interface between the element and the conductive film 402 because damage caused by electrification in separation can be reduced.

As the conductive film 402, any of the following materials can be used. The conductive film 402 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. In the case of a layer containing silicon, the layer containing silicon may have an amorphous, microcrystalline, polycrystalline, or single-crystal structure.

When the conductive film 402 is formed as a stacked-layer structure including a layer containing tungsten and a layer containing an oxide of tungsten, the layer containing tungsten may be formed and an insulating layer containing an oxide may be formed thereover so that the layer containing an oxide of tungsten is formed at the interface between the tungsten layer and the insulating layer. Alternatively, the layer containing an oxide of tungsten may be formed by performing thermal oxidation treatment, oxygen plasma treatment, dinitrogen monoxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or dinitrogen monoxide alone, or a mixed gas of any of these gasses and another gas. The surface condition of the conductive film 402 is changed by the plasma treatment or the heat treatment, whereby adhesion between the conductive film 402 and the conductive films 403*a*, 403*b*, and 403 and the insulating film 404 which are formed later can be controlled.

Although the structure where the conductive film 402 is provided is described in this embodiment, the present invention is not limited thereto. For example, a structure where the conductive film 402 is not provided may be employed. In that case, an organic resin film may be formed in a region where the conductive film 402 is formed. As the organic resin film, for example, a polyimide resin film, a polyamide resin film, an acrylic resin film, an epoxy resin film, or a phenolic resin film can be used.

In the case where the organic resin film is used instead of the conductive film 402, as a method for separating the element formed over the substrate 401, a laser light is irradiated from the lower side of the substrate 401 to weaken the organic resin film, whereby separation is conducted at an interface between the substrate 401 and the organic resin film or at an interface between the organic resin film and the conductive films 403*a*, 403*b*, and 403 and the insulating film 404.

In the case where a laser light is irradiated, a region having strong adhesion and a region having weak adhesion are formed between the substrate 401 and the conductive films 403*a*, 403*b*, and 403 and the insulating film 404 by adjustment of the irradiation energy density of the laser light, and then, the element may be separated from the substrate 401.

Next, the element is reversed so that the substrate 452 is placed at the bottom, and the alignment film 618*a* is formed over the insulating film 404 and the conductive film 403 (see FIG. 17B).

[Step of Bonding First Element and Second Element]

Next, an element over the substrate 452 and an element over the substrate 652 are attached to each other and sealed with the sealant 622. After that, the liquid crystal layer 620 is formed between the substrates 452 and 652, whereby the display element 11 is formed (see FIG. 18).

Note that the conductor 624 is provided in the sealant 622 over the conductive film 403*b*. As the conductor 624, conductive particles may be dispersed into a desired region in the sealant 622 by a dispenser method or the like. The conductive film 403*b* and the conductive film 610 are electrically connected to each other with the conductor 624 placed therebetween.

Figure 18:
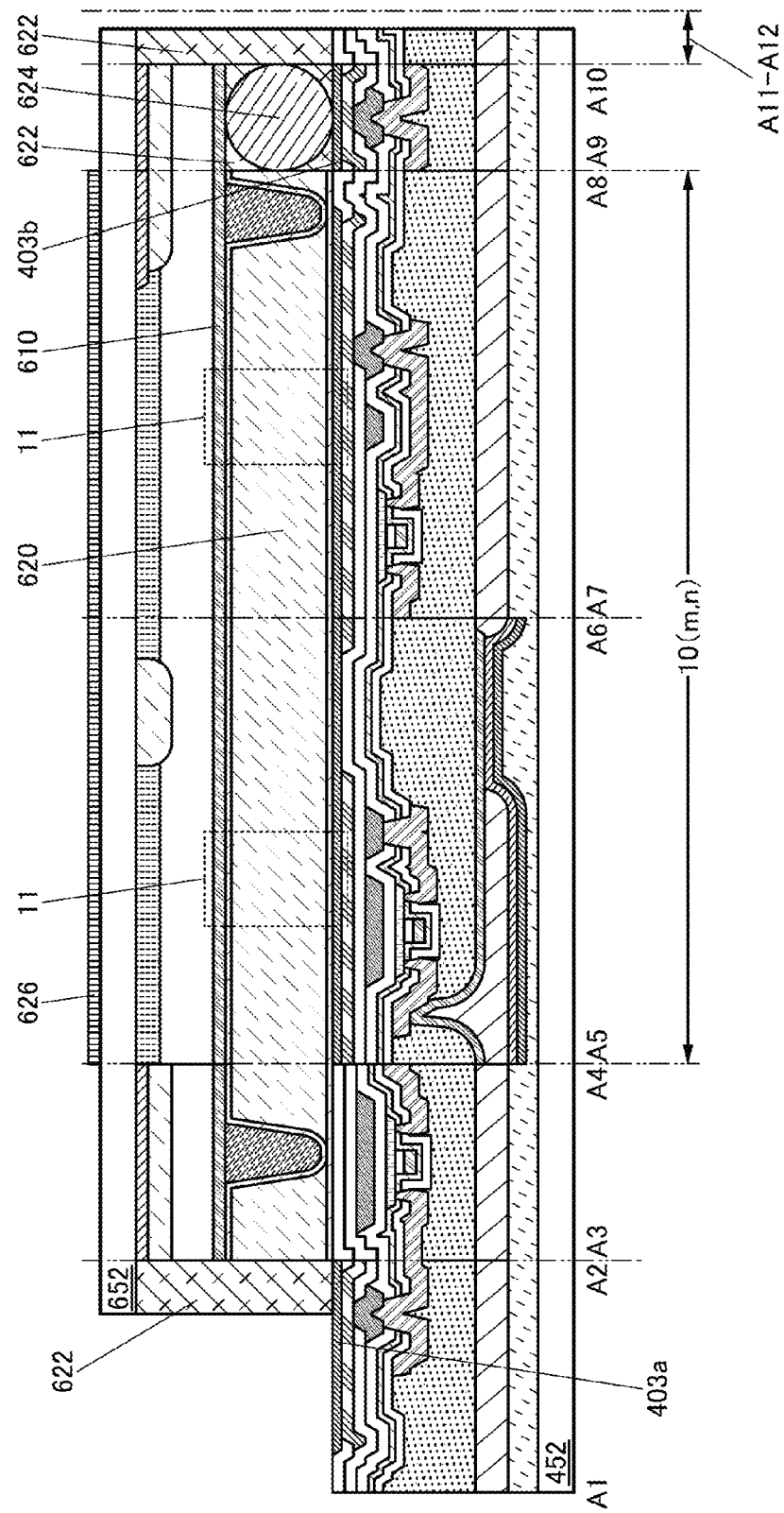
FIG. 18 is a cross-sectional view illustrating a method for manufacturing a display device.

Next, the functional film 626 is formed over the substrate 652 (see FIG. 18). Note that the functional film 626 is not necessarily formed.

After that, the FPC is bonded to the conductive film 403*a* with the ACF placed therebetween. Note that an anisotropic conductive paste (ACP) may be used instead of the ACF.

Through the above steps, the display device 500 illustrated in FIG. 1 can be fabricated.

<1-12. Modification Example 1 of Display Device>

Next, a structure in which a touch panel is provided in the display device 500 illustrated in FIG. 1 is described with reference to FIG. 19, FIG. 20, and FIG. 21. As the touch panel, a capacitive touch panel (a surface capacitive touch panel or a projected capacitive touch panel) can be favorably used.

Figure 19:
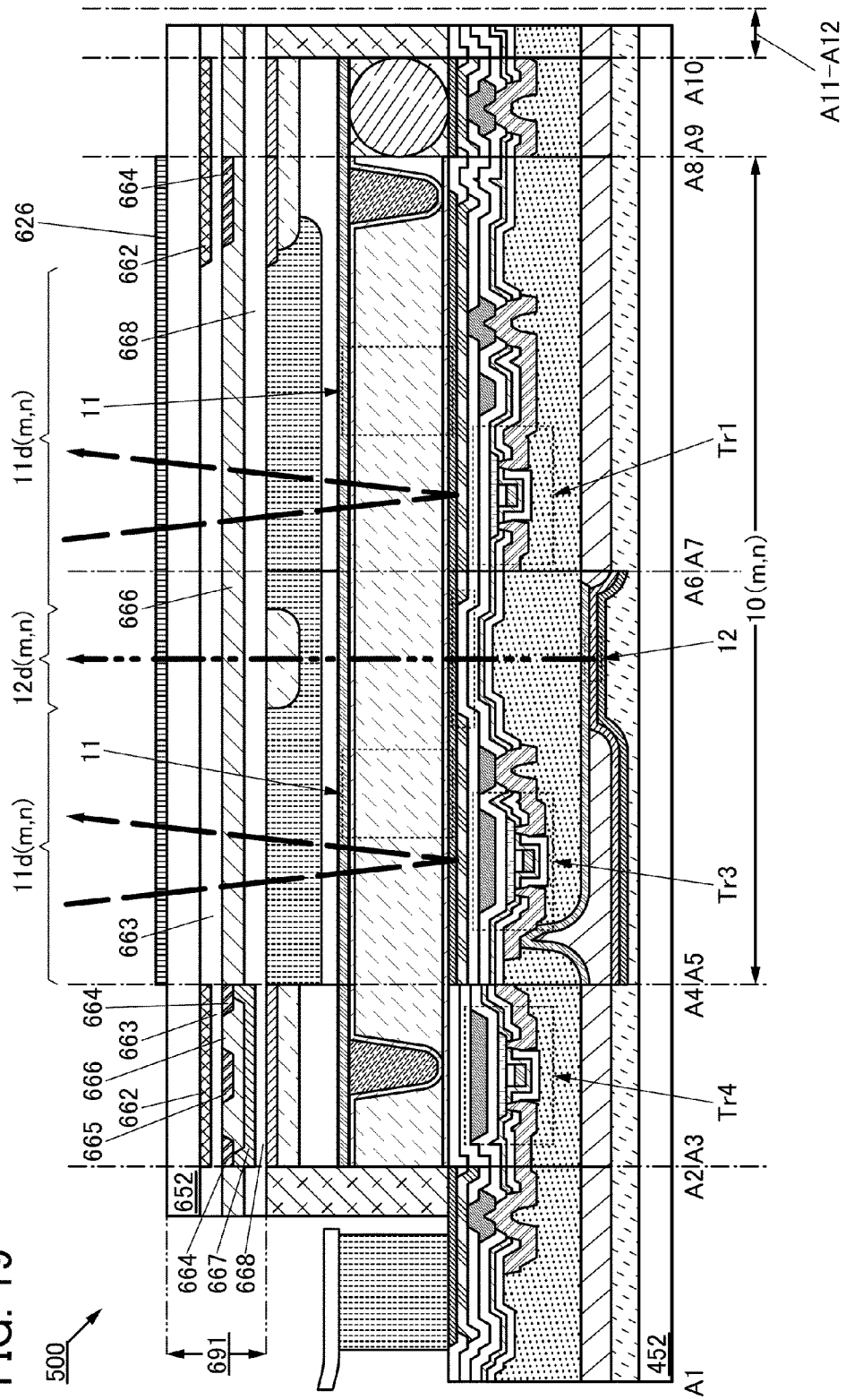
FIG. 19 is a cross-sectional view illustrating a display device.

FIG. 19 is a cross-sectional view of a structure in which a touch panel 691 is provided in the display device 500. FIG. 20 is a cross-sectional view of a structure in which a touch panel 692 is provided in the display device 500. FIG. 21 is a cross-sectional view of a structure in which a touch panel 693 is provided in the display device 500.

First, the touch panel 691 illustrated in FIG. 19 is described below.

The touch panel 691 illustrated in FIG. 19 is an in-cell touch panel that is provided between the substrate 652 and the color film 606. The touch panel 691 is formed over the substrate 652 before the light-blocking film 602, the structure body 604, and the color film 606 are formed.

The touch panel 691 includes a light-blocking film 662, an insulating film 663, an electrode 664, an electrode 665, an insulating film 666, an electrode 667, and an insulating film 668. Changes in the mutual capacitance in the electrodes 664 and 665 can be detected when an object such as a finger or a stylus approaches, for example.

An intersection portion of the electrode 664 and the electrode 665 is shown above the transistor Tr4 illustrated in FIG. 19. The electrode 667 is electrically connected to the two electrodes 664 between which the electrode 665 is sandwiched through openings provided in the insulating film 666. Although a region in which the electrode 667 is provided is located in a region corresponding to the gate driver circuit portion 504*a* in FIG. 19, one embodiment of the present invention is not limited thereto, and the region in which the electrode 667 is provided may be located in a region where the pixel 10(m, n) is provided, for example.

The electrodes 664 and 665 are provided in a region overlapping with the light-blocking film 662. As illustrated in FIG. 19, it is preferable that the electrode 664 do not overlap with the display element 12. In other words, the electrode 664 has openings in regions overlapping with the display element 12. That is, the electrode 664 has a mesh shape. With this structure, the electrode 664 does not block light emitted from the display element 12. Therefore, since luminance is hardly reduced even when the touch panel 691 is provided, a display device with high visibility and low power consumption can be obtained. Note that the electrode 665 can have a structure similar to that of the electrode 664.

Since the electrodes 664 and 665 do not overlap with the display element 12, a metal material whose transmittance of visible light is low can be used for the electrodes 664 and 665. Therefore, as compared with the case of using an oxide material whose transmittance of visible light is high, resistance of the electrodes 664 and 665 can be reduced, whereby sensitivity of the sensor of the touch panel can be increased.

Figure 20:
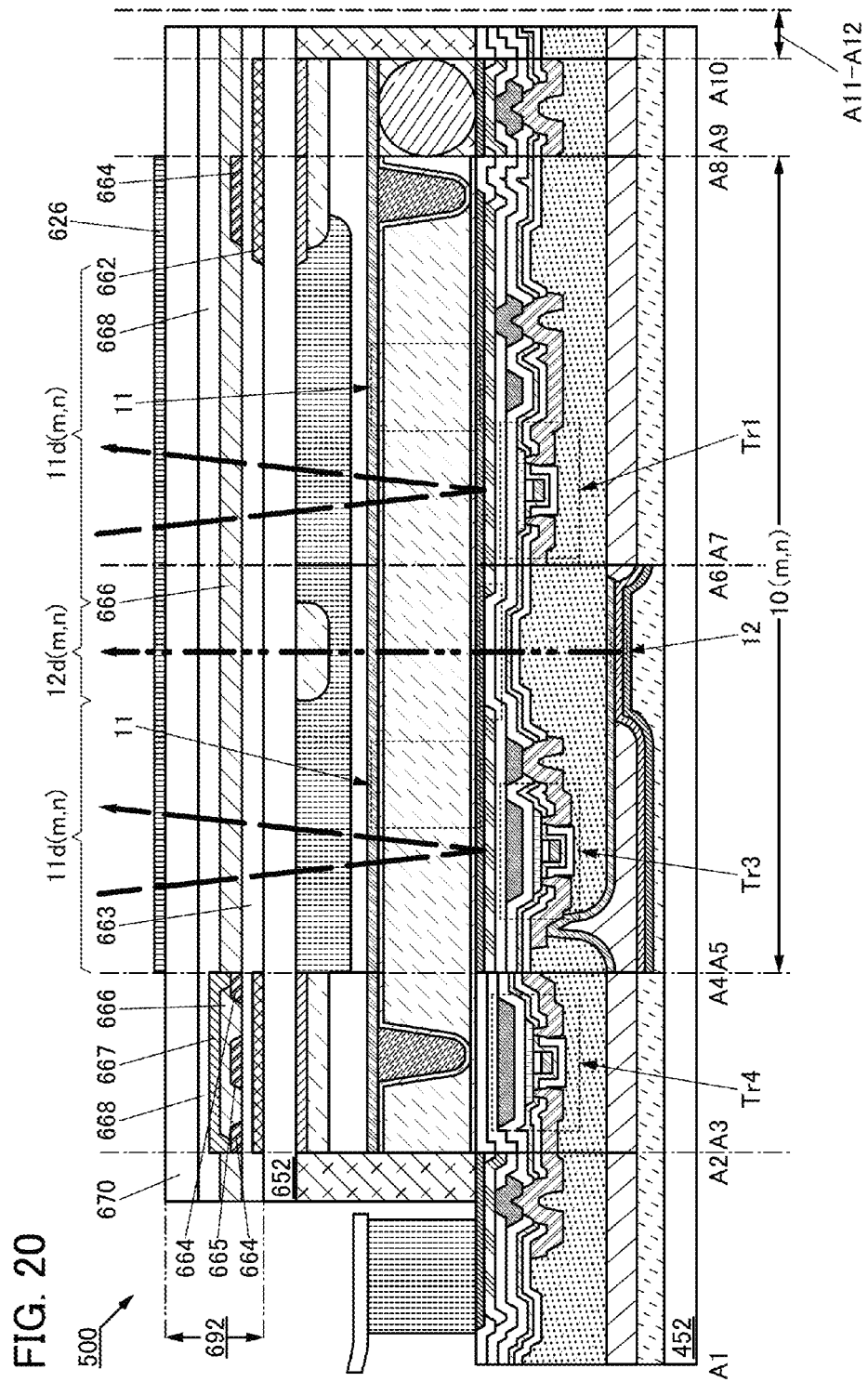
FIG. 20 is a cross-sectional view illustrating a display device.
Figure 21:
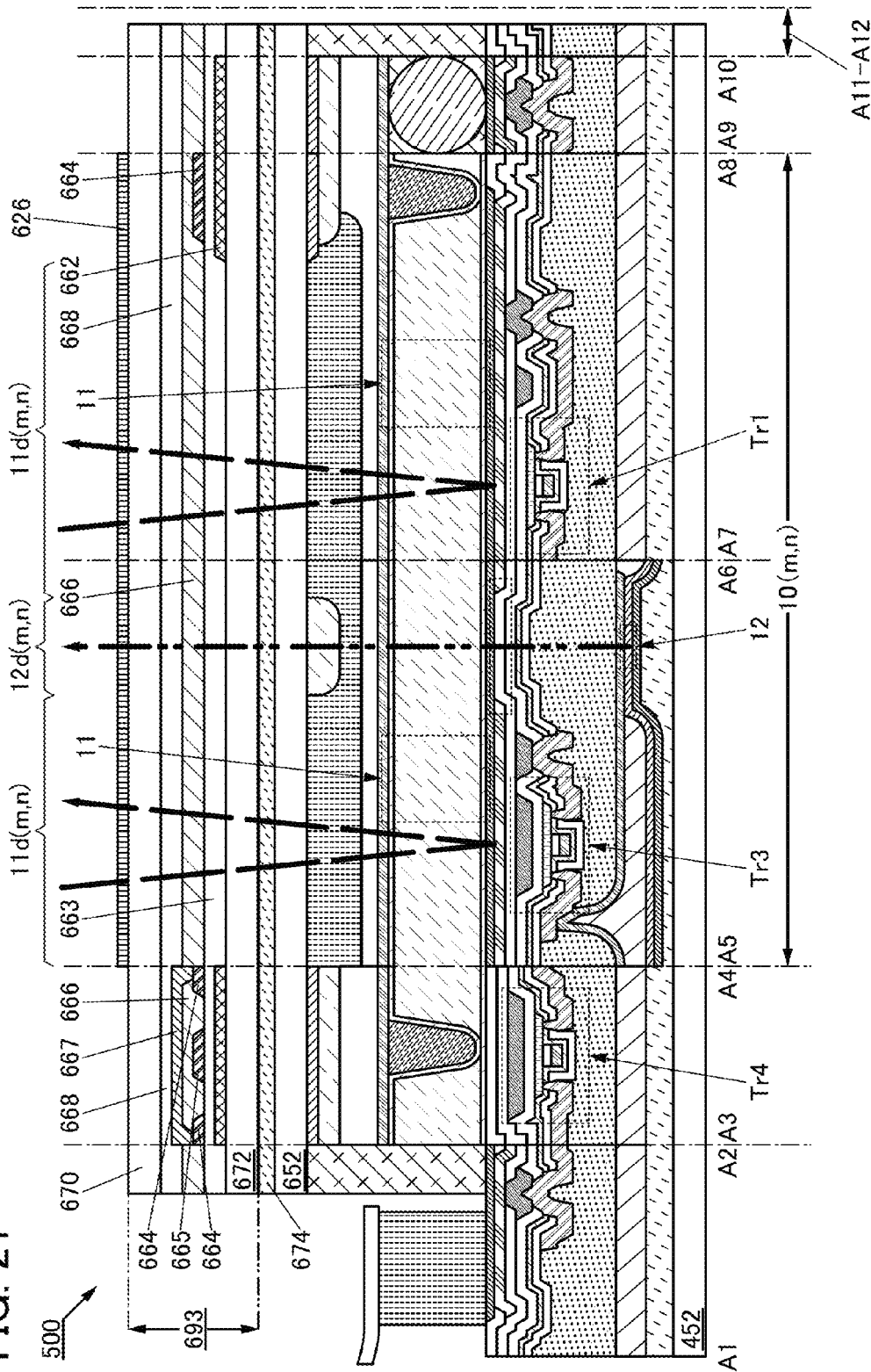
FIG. 21 is a cross-sectional view illustrating a display device.

Next, the touch panel 692 illustrated in FIG. 20 and the touch panel 693 illustrated in FIG. 21 are described below.

The touch panel 692 illustrated in FIG. 20 is an on-cell touch panel that is provided above the substrate 652. The touch panel 692 has a structure similar to that of the touch panel 691.

The touch panel 693 illustrated in FIG. 21 is provided over a substrate 672 and is bonded to the substrate 652 with a bonding material 674 placed therebetween. The touch panel 693 is an out-cell touch panel (also referred to as an externally attached touch panel). The touch panel 693 has a structure similar to that of the touch panel 691. The touch panel 693 further includes a substrate 670, in addition to the components included in the touch panel 691. The substrate 670 has a function of protecting the touch panel 693. Note that the substrate 670 is not necessarily provided.

In this manner, the display device of one embodiment of the present invention can be combined with various types of touch panels.

<1-13. Modification Example 2 of Display Device>

FIG. 1 and FIG. 19 to FIG. 21 illustrate examples in which the functional film 626 is positioned outside the substrate 652, but one embodiment of the present invention is not limited to these structures. For example, a structure in which the substrate 652 is not provided may be employed, and examples of the structure without the substrate 652 are illustrated in FIG. 22 to FIG. 25.

Figure 22:
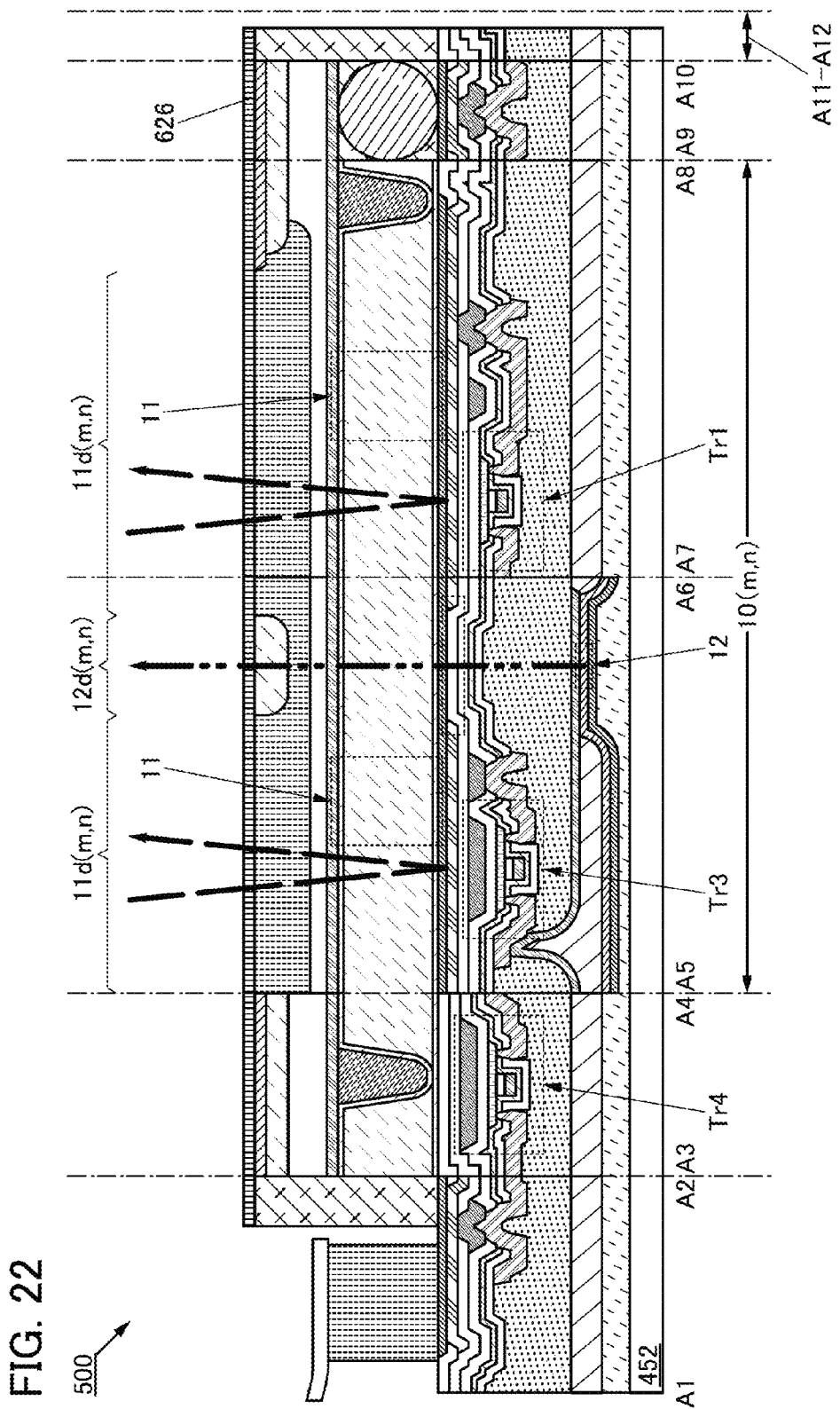
FIG. 22 is a cross-sectional view illustrating a display device.

FIG. 22 illustrates a modification example of the display device 500 illustrated in FIG. 1. In FIG. 22, the substrate 652 is not provided and sealing is performed by the functional film 626. In this case, a material used for a circularly polarizing plate can be suitably used for the functional film 626.

Figure 23:
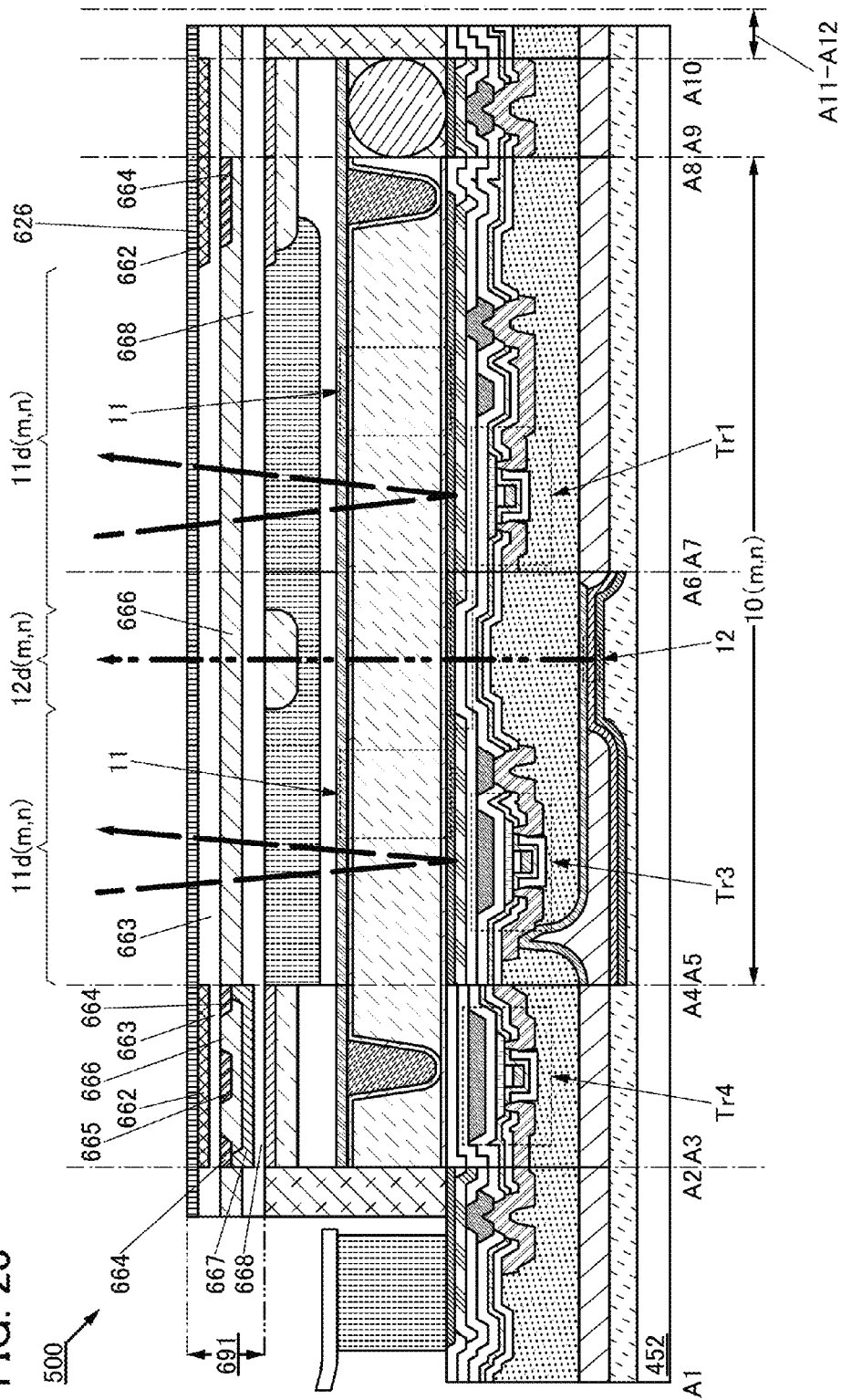
FIG. 23 is a cross-sectional view illustrating a display device.

FIG. 23 illustrates a modification example of the display device 500 illustrated in FIG. 19. In FIG. 23, the substrate 652 is not provided and the functional film 626 functions as part of the touch panel 691.

Figure 24:
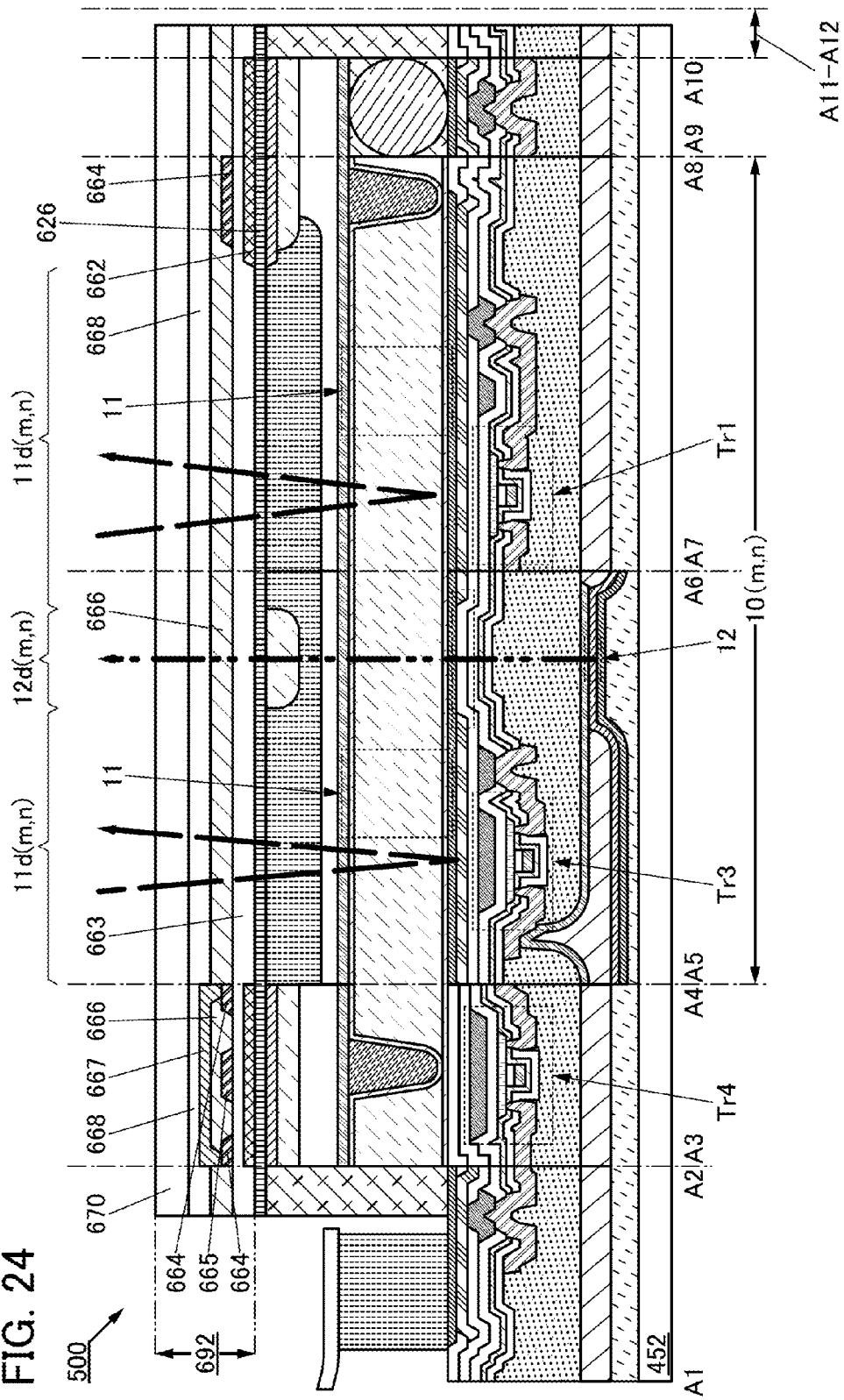
FIG. 24 is a cross-sectional view illustrating a display device.

FIG. 24 illustrates a modification example of the display device 500 illustrated in FIG. 20. In FIG. 24, the functional film 626 is provided inside the touch panel 692.

Figure 25:
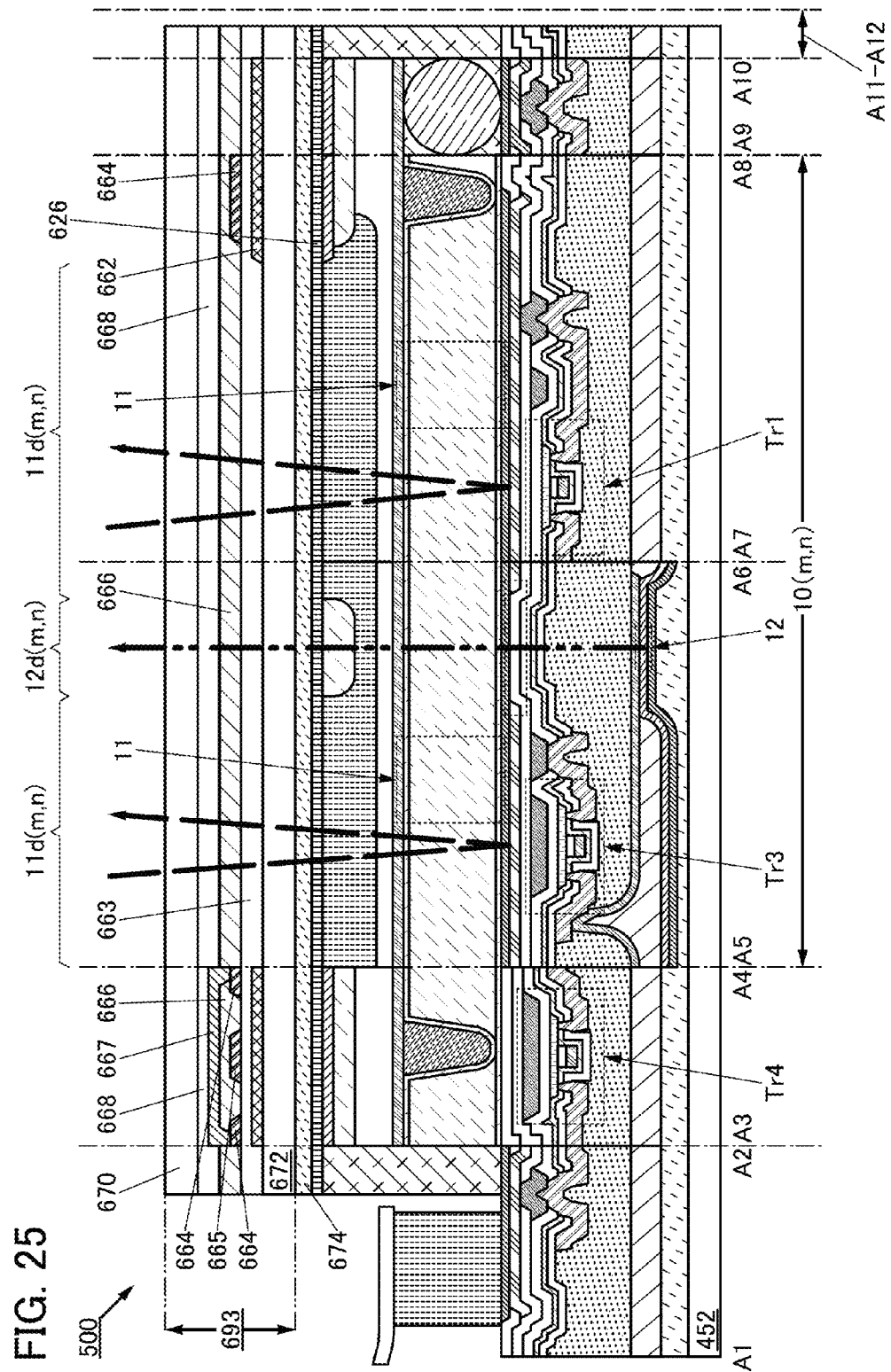
FIG. 25 is a cross-sectional view illustrating a display device.

FIG. 25 illustrates a modification example of the display device 500 illustrated in FIG. 21. In FIG. 25, the substrate 652 is not provided, and the functional film 626 is bonded to the touch panel 693 with the bonding material 674 interposed therebetween.

The structures as illustrated in FIG. 22 to FIG. 25 in which the substrate 652 is not provided are preferred because the thickness of the display device 500 can be small.

<1-14. Modification Example 3 of Display Device>

Figure 26:
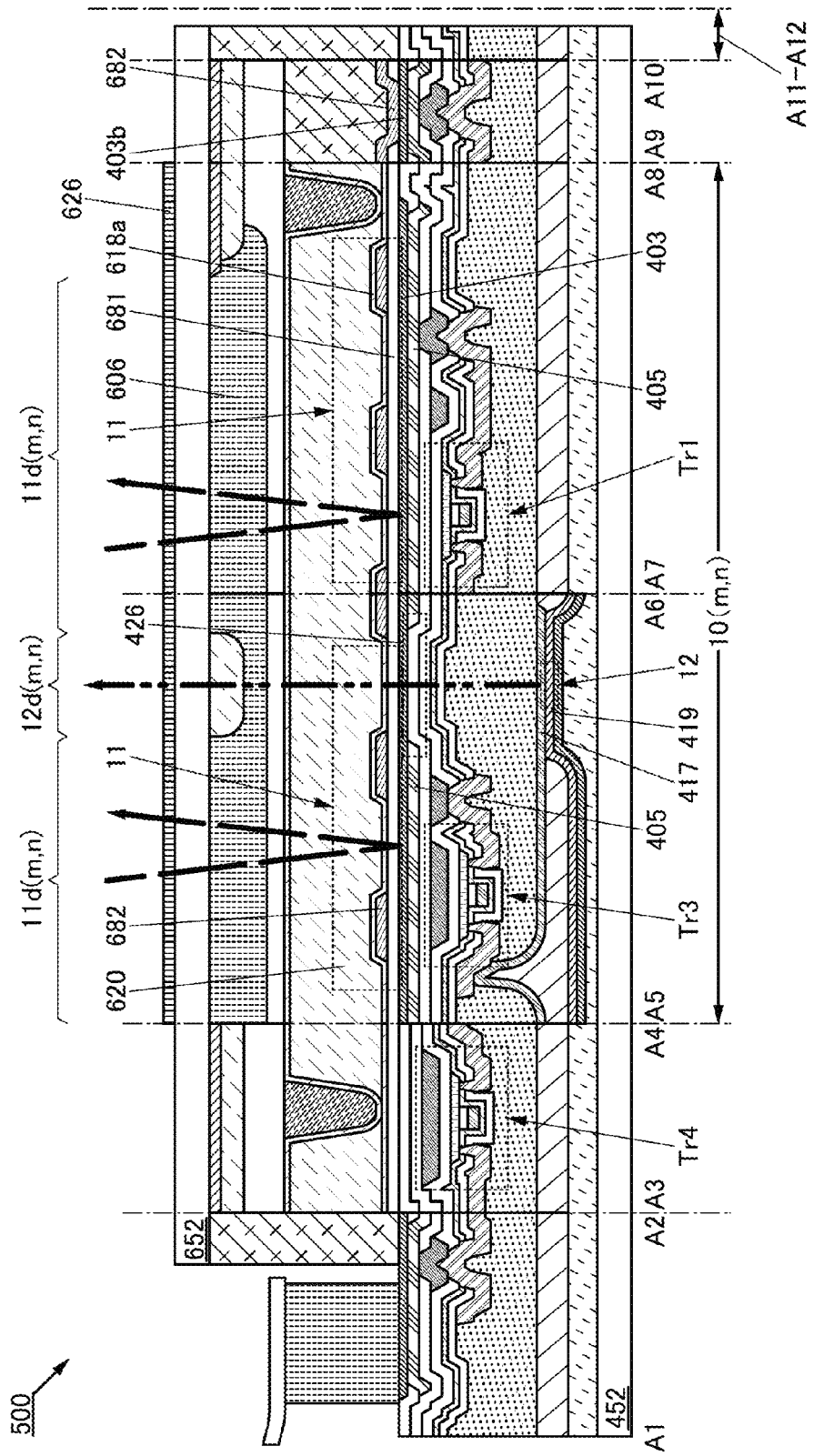
FIG. 26 is a cross-sectional view illustrating a display device.

An example of a structure where the liquid crystal element of the display device 500 illustrated in FIG. 1 is a horizontal electric field mode liquid crystal element (here, a fringe field switching (FFS) mode liquid crystal element) is shown in FIG. 26.

The display device 500 illustrated in FIG. 26 includes an insulating film 681 over the conductive films 403b and 403 and a conductive film 682 over the insulating film 681 in addition to the above-mentioned components.

The insulating film 681 has an opening in a connection region taken along dashed-dotted line A9-A10, and the conductive film 682 is electrically connected to the conductive film 403b through the opening. In FIG. 26, the conductor 624 included in the sealant 622 in FIG. 18 is not provided.

The conductive film 682 functions as a common electrode. The conductive film 682 can have a comb-like shape or a shape having a slit when seen from the above. Since the conductive film 682 is provided in the display device 500 illustrated in FIG. 26, the conductive film 610 provided on the substrate 652 side in FIG. 18 is not provided. Note that the conductive film 682 may be provided and the conductive film 610 may be further provided on the substrate 652 side.

When the conductive film 682 is formed using a light-transmitting material, a light-transmitting capacitor can be formed. The light-transmitting capacitor includes the conductive film 682, the insulating film 681 overlapping with the conductive film 682, and the conductive film 403. This structure is favorable because the amount of charge accumulated in the capacitor can be increased.

<1-15. Components of Display Device>

Next, the components of the display device 500 and the manufacturing method thereof illustrated in FIG. 1, FIGS. 12A to 12C, FIGS. 13A to 13C, FIGS. 14A to 14C, FIGS. 15A to 15C, FIGS. 16A to 16C, FIGS. 17A and 17B, FIG. 18, FIG. 19, FIG. 20, FIG. 21, FIG. 22, FIG. 23, FIG. 24, FIG. 25, and FIG. 26 are described below.

[Substrate]

The substrates 401, 452, 652 and 670 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass preferably can have a thickness of greater than or equal to 0.2 mm and less than or equal to 0.7 mm, for example. The non-alkali glass may be polished to obtain the above thickness.

For example, a large-sized glass substrate having any of the following sizes can be used as each of the substrates 401, 452, 652, and 670: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrates 401, 452, 652, and 670, a single-crystal semiconductor substrate or a polycrystalline semiconductor substrate made of silicon or silicon carbide, a compound semiconductor substrate made of silicon germanium or the like, an SOI substrate, or the like may be used.

Alternatively, for the substrates 401, 452, 652, and 670, an inorganic material such as a metal may be used. Examples of the inorganic material such as a metal include stainless steel and aluminum.

Alternatively, for the substrates 401, 452, 652, and 670, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

Alternatively, for the substrates 401, 452, 652, and 670, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

Each of the substrates 401, 452, 652, and 670 can at least support films or layers formed thereover or thereunder and may be one or more of an insulating film, a semiconductor film, and a conductive film.

[Conductive Film]

A metal film having conductivity, a conductive film having a function of reflecting visible light, or a conductive film having a function of transmitting visible light may be used as the conductive films 402, 403*a*, 403*b*, 403, 405*a*, 405*b*, 405, 407*a*, 407*b*, 407*c*, 407*d*, 407*e*, 414*a*, 414*b*, 414*c*, 414*d*, 414*e*, 414*f*, 414*g*, 414*h*, 417, 420, 610, and 682.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a titanium film, a copper film, and a titanium film are stacked in this order, or the like may be used. In particular, a conductive film containing a copper element is preferably used because the resistance can be reduced. As an example of the conductive film containing a copper element, an alloy film containing copper and manganese is given. The alloy film is favorable because it can be processed by a wet etching method.

As the metal film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 402, 403*a*, 403*b*, 403, 405*a*, 405*b*, 405, 407*a*, 407*b*, 407*c*, 407*d*, 407*e*, 414*a*, 414*b*, 414*c*, 414*d*, 414*e*, 414*f*, 414*g*, 414*h*, 417, 420, 610, and 682 can be formed by electroless plating. As materials that can be formed by electroless plating, for example, one or more selected from Cu, Ni, Al, Au, Sn, Co, Ag, and Pd can be used. It is further favorable to use Cu or Ag because the conductive film can have reduced resistance.

When the conductive film is formed by electroless plating, a diffusion prevention film may be formed under the conductive film to prevent component elements of the conductive film from diffusing outward. A seed film that can make the conductive film grow may be formed between the diffusion prevention film and the conductive film. The diffusion prevention film can be formed by sputtering, for example. For the diffusion prevention film, a tantalum nitride film or a titanium nitride film can be used, for example. The seed film can be formed by electroless plating. For the seed film, a material similar to the material for the conductive film that can be formed by electroless plating can be used.

[Insulating Film]

For the insulating films 404, 406, 408, 410*a*, 410*b*, 410*c*, 412, 413, 416, 418, 608, 663, 666, 668, and 681, an inorganic insulating material, an organic insulating material, or a composite insulating material including an inorganic insulating material and an organic insulating material can be used.

Examples of the inorganic insulating material include a silicon oxide film, a silicon nitride film, a silicon oxynitride film, a silicon nitride oxide film, and an aluminum oxide film. Alternatively, a plurality of the above inorganic materials may be stacked.

As the above organic insulating material, for example, materials that include polyester, polyolefin, polyamide (e.g., nylon or aramid), polyimide, polycarbonate, polyurethane, an acrylic resin, an epoxy resin, or a resin having a siloxane bond can be used. As the organic insulating material, a photosensitive material may be used.

[Oxide Semiconductor Film]

The oxide semiconductor films 409*a*, 409*b*, and 409*c* are formed using a metal oxide such as an In-M-Zn oxide (M is Al, Ga, Y, or Sn). Alternatively, an In—Ga oxide or an In—Zn oxide may be used for the oxide semiconductor films 409*a*, 409*b*, and 409*c*.

In the case where the oxide semiconductor films 409*a*, 409*b*, and 409*c* include an In-M-Zn oxide, the proportions of In and M, the summation of which is assumed to be 100 atomic %, are as follows: the proportion of In is higher than 25 atomic % and the proportion of M is lower than 75 atomic %, or the proportion of In is higher than 34 atomic % and the proportion of M is lower than 66 atomic %.

The energy gap of the oxide semiconductor films 409*a*, 409*b*, and 409*c* is preferably 2 eV or more, 2.5 eV or more, or 3 eV or more.

The thickness of each of the oxide semiconductor films 409*a*, 409*b*, and 409*c* is greater than or equal to 3 nm and less than or equal to 200 nm, preferably greater than or equal to 3 nm and less than or equal to 100 nm, further preferably greater than or equal to 3 nm and less than or equal to 60 nm.

In the case where the oxide semiconductor films 409a, 409b, and 409c include an In-M-Zn oxide, the atomic ratio of metal elements in a sputtering target used for depositing the In-M-Zn oxide preferably satisfies In≥M and Zn≥M. As the atomic ratio of metal elements in such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable. Note that the atomic ratio of metal elements in the deposited oxide semiconductor films 409a, 409b, and 409c may vary from the above atomic ratio of metal elements in the sputtering target within a range of approximately ±40%. For example, when a sputtering target whose atomic ratio of In to Ga to Zn is 4:2:4.1 is used, the atomic ratio of In to Ga to Zn in the deposited oxide semiconductor film may be approximately 4:2:3. In the case where a sputtering target whose atomic ratio of In to Ga to Zn is 5:1:7 is used, the atomic ratio of In to Ga to Zn in the deposited oxide semiconductor film may be approximately 5:1:6.

When silicon or carbon, which are elements belonging to Group 14, is contained in the oxide semiconductor films 409a, 409b, and 409c, oxygen vacancies are increased and the oxide semiconductor films 409a, 409b, and 409c have n-type conductivity in some cases. Thus, the concentration of silicon or carbon in the oxide semiconductor films 409a, 409b, and 409c, particularly in the channel region, is set to be lower than or equal to $2\times10^{18}$ atoms/cm$^3$, or lower than or equal to $2\times10^{17}$ atoms/cm$^3$. As a result, the transistor has a positive threshold voltage (normally-off characteristics). Note that the concentration of silicon or carbon can be measured by secondary ion mass spectrometry (SIMS), for example.

Furthermore, the concentration of alkali metal or alkaline earth metal in the oxide semiconductor films 409a, 409b, and 409c, which is measured by SIMS, can be lower than or equal to $1\times10^{18}$ atoms/cm$^3$ or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor films 409a, 409b, and 409c. As a result, the transistor has a positive threshold voltage (normally-off characteristics).

Furthermore, when nitrogen is contained in the oxide semiconductor films 409a, 409b, and 409c, electrons serving as carriers are generated and carrier density is increased and the oxide semiconductor films 409a, 409b, and 409c have n-type conductivity in some cases. Thus, a transistor including an oxide semiconductor film which contains nitrogen is likely to have normally-on characteristics. For this reason, nitrogen in the oxide semiconductor films 409a, 409b, and 409c is preferably reduced as much as possible. For example, the nitrogen concentration measured by SIMS may be $5\times10^{18}$ atoms/cm$^3$ or lower.

When impurity elements in the oxide semiconductor films 409a, 409b, and 409c are reduced, the carrier density of the oxide semiconductor films can be lowered. Therefore, the oxide semiconductor films 409a, 409b, and 409c can have a carrier density less than or equal to $1\times10^{17}$ cm$^{-3}$, less than or equal to $1\times10^{15}$ cm$^{-3}$, less than or equal to $1\times10^{13}$ cm$^{-3}$, or less than or equal to $1\times10^{11}$ cm$^{-3}$.

When an oxide semiconductor film with a low impurity concentration and a low density of defect states is used as the oxide semiconductor films 409a, 409b, and 409c, the transistor can have more excellent electrical characteristics. Here, the state in which the impurity concentration is low and the density of defect states low (the number of oxygen vacancies is small) is referred to as "highly purified intrinsic", "substantially highly purified intrinsic", "intrinsic", or "substantially intrinsic". A highly purified intrinsic or substantially highly purified intrinsic oxide semiconductor has few carrier generation sources and thus can have a low carrier density in some cases. Thus, a transistor whose channel region is formed in the oxide semiconductor film is likely to have a positive threshold voltage (normally-off characteristics). The highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film enables extremely low off-state current. Thus, the transistor whose channel region is formed in the oxide semiconductor film has little variation in electrical characteristics and high reliability in some cases.

Each of the oxide semiconductor films 409a, 409b, and 409c may have a non-single-crystal structure. The non-single-crystal structure includes a c-axis aligned crystalline oxide semiconductor (CAAC-OS) described later, a polycrystalline structure, a microcrystalline structure described later, or an amorphous structure, for example. Among the non-single-crystal structures, the amorphous structure has the highest density of defect states, whereas the CAAC-OS has the lowest density of defect states.

Note that each of the oxide semiconductor films 409a, 409b, and 409c may be a single film or stacked films including two or more of the following regions: a region having an amorphous structure, a region having a microcrystalline structure, a region having a polycrystalline structure, a CAAC-OS region, and a region having a single-crystal structure.

[Liquid Crystal Layer]

As examples of the liquid crystal layer 620, thermotropic liquid crystal, low-molecular liquid crystal, high-molecular liquid crystal, polymer dispersed liquid crystal, ferroelectric liquid crystal, and anti-ferroelectric liquid crystal are given. Alternatively, a liquid crystal material which exhibits a cholesteric phase, a smectic phase, a cubic phase, a chiral nematic phase, an isotropic phase, or the like may be used. Furthermore, a liquid crystal material exhibiting a blue phase may be used.

For a driving method of the liquid crystal layer 620, an in-plane switching (IPS) mode, a twisted nematic (TN) mode, an FFS mode, an axially symmetric aligned microcell (ASM) mode, an optically compensated birefringence (OCB) mode, a ferroelectric liquid crystal (FLC) mode, an antiferroelectric liquid crystal (AFLC) mode, or the like can be used. In addition, the liquid crystal layer 620 can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

[EL Layer]

The EL layer 419 includes at least a light-emitting material. Examples of the light-emitting material include an organic compound and an inorganic compound such as a quantum dot.

The organic compound and the inorganic compound can be formed by an evaporation method (including a vacuum evaporation method), an ink-jet method, a coating method, or gravure printing, for example.

Examples of materials that can be used for the organic compound include a fluorescent material and a phosphorescent material. A fluorescent material is preferably used in terms of the lifetime, while a phosphorescent material is preferably used in terms of the efficiency. Furthermore, both of a fluorescent material and a phosphorescent material may be used.

A quantum dot is a semiconductor nanocrystal with a size of several nanometers and contains approximately $1 \times 10^3$ to $1 \times 10^6$ atoms. Since energy shift of quantum dots depend on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high emission efficiency. Furthermore, since a quantum dot which is an inorganic compound has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; magnesium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; triiron tetraoxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of a compound of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophenes; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength region of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots emit directional light polarized in the c-axis direction; thus, quantum rods can be used as a light-emitting material to obtain a light-emitting element with higher external quantum efficiency.

In most EL elements, to improve emission efficiency, light-emitting materials are dispersed in host materials and the host materials need to be substances each having a singlet excitation energy or a triplet excitation energy higher than or equal to that of the light-emitting material. In the case of using a blue phosphorescent material, it is particularly difficult to develop a host material which has a triplet excitation energy higher than or equal to that of the blue phosphorescent material and which is excellent in terms of a lifetime. On the other hand, even when a light-emitting layer is composed of quantum dots and made without a host material, the quantum dots enable emission efficiency to be ensured; thus, a light-emitting element which is favorable in terms of a lifetime can be obtained. In the case where the light-emitting layer is composed of quantum dots, the quantum dots preferably have core-shell structures (including core-multishell structures).

[Alignment Film]

For the alignment films 618a and 618b, a material containing polyimide or the like can be used. For example, a material containing polyimide or the like may be subjected to a rubbing process or an optical alignment process to have alignment in a predetermined direction.

[Light-Blocking Film]

The light-blocking films 602 and 662 function as a black matrix. For the light-blocking films 602 and 662, a material that prevents light transmission is used. Examples of the material that prevents light transmission include a metal material and an organic resin material containing a black pigment.

[Color Film]

The color film 606 functions as a color filter. For the color film 606, a material transmitting light of a predetermined color (e.g., a material transmitting light of blue, green, red, yellow, or white) is used.

[Structure Body]

The structure body 604 has a function of forming a projection or a depression on the substrate 652. The structure bodies 612a and 612b have a function of providing a certain space between components between which the structure bodies 612a and 612b are interposed. For each of the structure bodies 604, 612a, and 612b, an organic material, an inorganic material, or an insulating material containing a composite material of an organic material and an inorganic material can be used. For the insulating material, the materials for the insulating films 404, 406, 408, 410a, 410b, 410c, 412, 413, 416, and 418 can be used.

[Functional Film]

As the functional film 626, a polarizing plate, a retardation plate, a diffusing film, an anti-reflective film, a condensing film, or the like can be used. As the functional film 626, an antistatic film preventing the attachment of a foreign substance, a water repellent film suppressing the attachment of stain, a hard coat film suppressing generation of a scratch in use, or the like may be used.

[Sealing Material]

For the sealing material 454, an inorganic material, an organic material, a composite material of an inorganic material and an organic material, or the like can be used. Examples of the organic material include a thermally fusible resin and a curable resin. As the sealing material 454, an adhesive including a resin material (e.g., a reactive curable adhesive, a photocurable adhesive, a thermosetting adhesive, or an anaerobic adhesive) may be used. Examples of such resin materials include an epoxy resin, an acrylic resin, a silicone resin, a phenolic resin, a polyimide resin, an imide resin, a polyvinyl chloride (PVC) resin, a polyvinyl butyral (PVB) resin, and an ethylene vinyl acetate (EVA) resin.

[Sealant]

For the sealant 622, the materials for the sealing material 454 can be used. For the sealant 622, a material such as glass frit may be used in addition to the above materials. As a material used for the sealant 622, a material which is impermeable to moisture or oxygen is preferably used.

[Electrode]

For the electrodes 664, 665, and 667, the materials for the conductive films 402, 403a, 403b, 403, 405a, 405b, 405, 405d, 407a, 407b, 407c, 407d, 407e, 414a, 414b, 414c, 414d, 414e, 414f, 414g, 414h, 417, 420, and 610 described above can be used. Conductive nanowires may be used for the electrodes 664, 665, and 667. The average diameter of the nanowire is greater than or equal to 1 nm and less than or equal to 100 nm, preferably greater than or equal to 5 nm and less than or equal to 50 nm, more preferably greater than or equal to 5 nm and less than or equal to 25 nm. As the nanowire, a carbon nanotube or a metal nanowire such as an Ag nanowire, a Cu nanowire, and an Al nanowire can be used. For example, in the case where an Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

As described above, the display device of one embodiment of the present invention includes two display elements. Furthermore, the display device includes two transistors for driving the two display elements. A reflective liquid crystal element is used as one of the display elements and a transmissive EL element is used as the other of the display elements; thus, a novel display device that is highly convenient or reliable can be provided. In addition, the color film of one display element and that of the other display element have different structures, whereby a display device with high color purity can be provided.

The structure described in this embodiment can be used in appropriate combination with any of the structures described in the other embodiments.

Embodiment 2

In this embodiment, a display element having a function of emitting light is described in detail.

<2. Structure Example 1 of Display Element>

Figure 27:
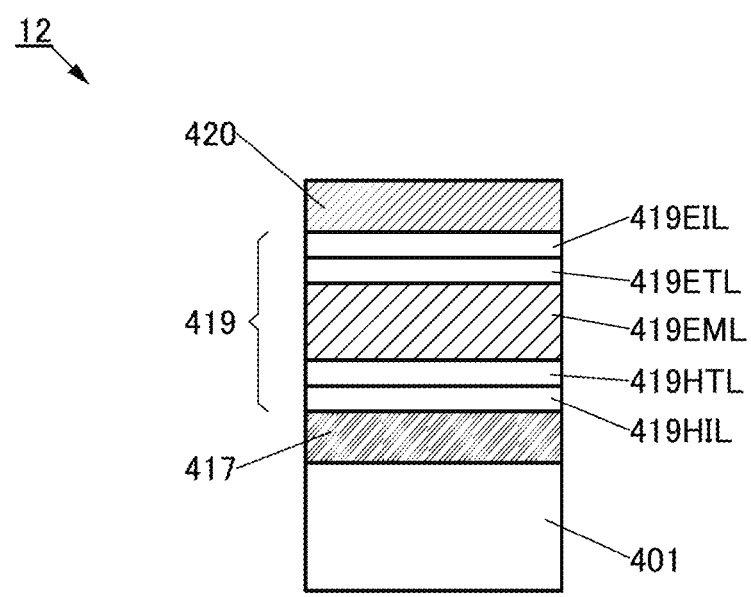
FIG. 27 is a cross-sectional view illustrating a display element.

FIG. 27 is a cross-sectional view illustrating an example of the display element 12 described in Embodiment 1.

The light-emitting element 12 illustrated in FIG. 27 includes a conductive film 417 over the substrate 401, the EL layer 419 over the conductive film 417, and the conductive film 420 over the EL layer 419. The EL layer 419 includes a hole-injection layer $419_{HIL}$ over the conductive film 417, a hole-transport layer $419_{HTL}$ over the hole-injection layer 419$_{HIL}$, a light-emitting layer 419$_{EML}$ over the hole-transport layer 419$_{HTL}$, an electron-transport layer 419$_{ETL}$ over the light-emitting layer 419$_{EML}$, and an electron-injection layer 419$_{EIL}$ over the electron-transport layer 419$_{ETL}$.

The light-emitting layer 419$_{EML}$ preferably includes a host material and a guest material (a light-emitting material). In that case, it is preferable that the host material have an electron-transport property and that the guest material have a hole-trap property. With such a structure, carriers can be efficiently recombined in the light-emitting layer 419$_{EML}$.

The light-emitting layer 419$_{EML}$ includes a phosphorescent material or a fluorescent material as a guest material. Note that the light-emitting layer 419$_{EML}$ may have a stacked-layer structure. In that case, it is preferable that one layer be formed using a phosphorescent material and the other layer be formed using a fluorescent material. With such a structure, a display element with high emission efficiency and high reliability can be provided.

Next, components in the display element 12 illustrated in FIG. 27 are described below.

[Conductive Film]

For the conductive film 417, the materials for the conductive films 402, 403a, 403b, 403, 405a, 405b, 405, 407a, 407b, 407c, 407d, 407e, 414a, 414b, 414c, 414d, 414e, 414f, 414g, 414h, 417, 420, 610, and 682 described in Embodiment 1 can be used. In particular, ITO or ITSO is preferably used for the conductive film 417. A metal film with high reflectance containing Al or Ag is preferably used for the conductive film 420.

[Light-Emitting Layer]

The light-emitting layer 419$_{EML}$ is formed using a material that has a peak in a red, yellow, green, or blue wavelength range. For example, it is preferable that a phosphorescent material be used as the material that has a peak in the red, yellow, or green wavelength range, and a fluorescent material be used as the material that has a peak in the blue wavelength range.

[Phosphorescent Material]

As the phosphorescent material, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be used. As the metal complex, a platinum complex having a porphyrin ligand or the like can be used.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)).

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Further, the organometallic iridium complexes having a pyrazine skeleton can provide red light emission with favorable chromaticity.

As the material included in the light-emitting layer 419$_{EML}$, any material can be used as long as the material can convert the triplet excitation energy into light emission. As an example of the material that can convert triplet excitation energy into light emission, a thermally activated delayed fluorescence material is given in addition to the phosphorescent material. Therefore, the term "phosphorescent material" in the description can be replaced with the term "thermally activated delayed fluorescence material". The thermally activated delayed fluorescence material is a material having a small energy difference between the singlet excitation energy level and the triplet excitation energy level and has a function of converting the triplet excitation energy into the singlet excitation energy by reverse intersystem crossing. Thus, the thermally activated delayed fluorescence material can up-convert a triplet excited state into a singlet excited state (i.e., reverse intersystem crossing is possible) using a little thermal energy and efficiently exhibit light emission (fluorescence) from the singlet excited state. Conditions for efficiently obtaining thermally activated delayed fluorescence are as follows: the energy difference between the triplet excitation energy level and the singlet excitation energy level is preferably greater than 0 eV and less than or equal to 0.2 eV, more preferably greater than 0 eV and less than or equal to 0.1 eV.

As examples of the thermally activated delayed fluorescence material, a fullerene, a derivative thereof, an acridine derivative such as proflavine, eosin, and the like are given. Furthermore, a metal-containing porphyrin, such as a porphyrin containing magnesium (Mg), zinc (Zn), cadmium (Cd), tin (Sn), platinum (Pt), indium (In), or palladium (Pd), is given.

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), or the like can be used. The heterocyclic compound is preferably used because of having the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small.

[Fluorescent Material]

The fluorescent material is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-

(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

[Host Material]

In the light-emitting layer, the light-emitting material is preferably dispersed in the host material. In this case, the weight ratio of the host material to the light-emitting material is larger. A variety of materials can be used as the host material. For example, a material having a function of transporting a hole (a hole-transport material) and a material having a function of transporting an electron (an electron-transport material) can be used. Furthermore, a bipolar material having a hole-transport property and an electron-transport property can be used.

As the host material, a material having a property of transporting more electrons than holes can be used, and a material having an electron mobility of $1\times10^{-6}$ cm$^2$/Vs or higher is preferable. A compound including a n-electron deficient heteroaromatic ring skeleton such as a nitrogen-containing heteroaromatic compound, or a zinc- or aluminum-based metal complex can be used, for example, as the material which easily accepts electrons (the material having an electron-transport property). Specific examples include a metal complex having a quinoline ligand, a benzoquinoline ligand, an oxazole ligand, or a thiazole ligand. In addition, a compound such as an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative can be given.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl) tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP);

heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl]dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl] pyridine (abbreviation: 35DCzPPy); and heteroaromatic compounds such as 4,4'-bis(5-methylbenzoxazol-2-yl)stilbene (abbreviation: BzOs). Among the heterocyclic compounds, the heterocyclic compounds having a triazine skeleton, a diazine (pyrimidine, pyrazine, pyridazine) skeleton, or a pyridine skeleton are highly reliable and stable and are thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

As the host material, hole-transport materials given below can be used.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Specific examples of the aromatic amine compounds that can be used as the material having a high hole-transport property include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino] phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl skeleton are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

It is preferable that the host material and the phosphorescent material be selected such that the emission peak of the host material overlaps with an absorption band, specifically an absorption band on the longest wavelength side, of a triplet metal to ligand charge transfer (MLCT) transition of the phosphorescent material. This makes it possible to provide a light-emitting element with drastically improved emission efficiency. Note that in the case where a thermally activated delayed fluorescence material is used instead of the phosphorescent material, it is preferable that the absorption band on the longest wavelength side be a singlet absorption band.

Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the carrier transport property of the light-emitting layer can be easily adjusted and a recombination region can be easily controlled. The content ratio (weight ratio) of the material having an electron-transport property to the material having a hole-transport property is preferably 1:9 to 9:1.

An exciplex may be formed by these mixed materials. It is preferable that the combination of the materials be selected so as to form an exciplex that exhibits light emission whose wavelength overlaps with a wavelength of a lowest-energy-side absorption band of the light-emitting material, in which case excitation energy is transferred smoothly from the exciplex to the light-emitting material, light emission can be obtained efficiently from the light-emitting material, and the driving voltage can be reduced.

In the light-emitting layer, a material other than the host material and the light-emitting material may be contained. Besides the above-mentioned materials, an inorganic compound or a high molecular compound (e.g., an oligomer, a dendrimer, and a polymer) may be used.

In the case of using quantum dots as the light-emitting material in the light-emitting layer, the thickness of the light-emitting layer is set to 3 nm to 100 nm, preferably 10 nm to 100 nm, and the light-emitting layer is made to contain 1 vol % to 100 vol % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, a blade coating method, a roll coating method, an ink-jet method, a printing method, a spray coating method, a curtain coating method, or a Langmuir-Blodgett method) may be employed. For a light-emitting layer containing a phosphorescent material, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

[Hole-Injection Layer and Hole-Transport Layer]

The hole-injection layer $419_{HIL}$ injects holes to the light-emitting layer $419_{EML}$ with the hole-transport layer $419_{HTL}$ with a high hole-transport property placed therebetween, and contains a hole-transport material and an acceptor substance. When a hole-transport material and an acceptor substance are contained, electrons are extracted from the hole-transport material by the acceptor substance to generate holes, and the holes are injected into the light-emitting layer $419_{EML}$ with the hole-transport layer $419_{HTL}$ placed therebetween. Note that the hole-transport layer $419_{HTL}$ is formed with a hole-transport material.

As the hole-transport materials used for the hole-injection layer $419_{HIL}$ and the hole-transport layer $419_{HTL}$, the above-described hole-transport materials that can be used for the light-emitting layer $419_{EML}$ can be used.

Examples of the acceptor substance that is used for the hole-injection layer $419_{HIL}$ include oxides of metals belonging to Groups 4 to 8 of the periodic table. Specifically, molybdenum oxide is particularly preferable.

[Electron-Transport Layer]

For the electron-transport layer $419_{ETL}$, the above-described electron-transport materials for the light-emitting layer $419_{EML}$ can be used.

[Electron-Injection Layer]

The electron-injection layer $419_{EIL}$ is a layer containing a substance with a high electron-injection property. For the electron-injection layer $419_{EIL}$, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound such as erbium fluoride (ErF$_3$) can be used. Electride may also be used for the electron-injection layer $419_{EIL}$. Examples of the electride include a substance in which electrons are added at high concentration to calcium oxide-aluminum oxide.

Alternatively, the electron-injection layer $419_{EIL}$ may be formed using a composite material in which an organic compound and an electron donor (donor) are mixed. The composite material is superior in an electron-injection property and an electron-transport property, since electrons are generated in the organic compound by the electron donor. The organic compound here is preferably a material excellent in transporting the generated electrons; specifically, for example, the substances for forming the electron-transport layer $419_{ETL}$ (e.g., a metal complex or a heteroaromatic compound) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The structure described in this embodiment can be used in appropriate combination with any of the structures described in the other embodiments.

Embodiment 3

In this embodiment, a transistor that can be used for the display device of one embodiment of the present invention is described in detail.

In this embodiment, a transistor with a staggered (top-gate) structure is described with reference to FIGS. 28A to 28C, FIGS. 29A to 29C, FIGS. 30A and 30B, FIGS. 31A and 31B, FIGS. 32A and 32B, FIGS. 33A and 33B, FIGS. 34A and 34B, and FIGS. 35A to 35C.

<3-1. Structure Example 1 of Transistor>

Figure 28A:
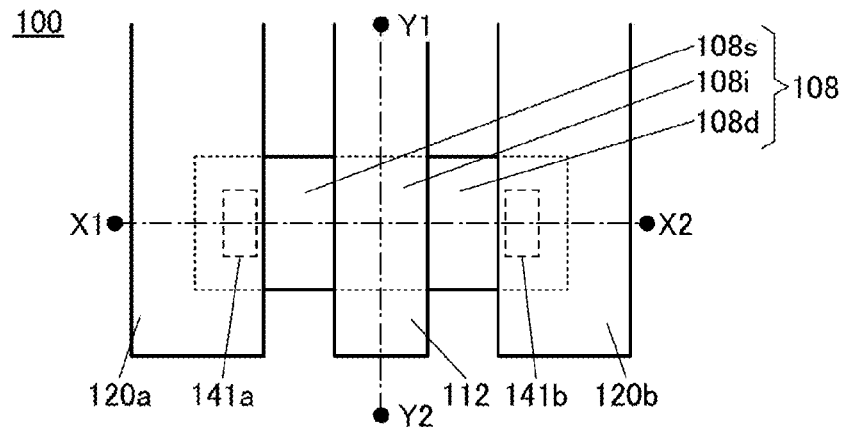
FIGS. 28A to 28C are a top view and cross-sectional views illustrating a semiconductor device.
Figure 28B:
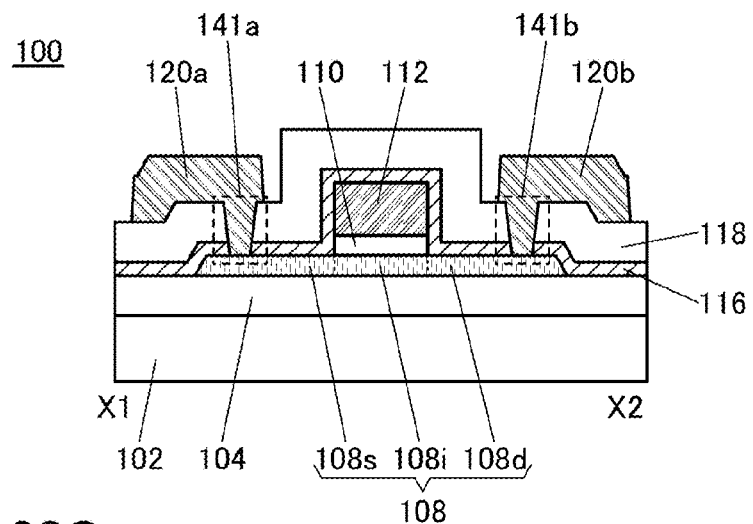
Figure 28C:
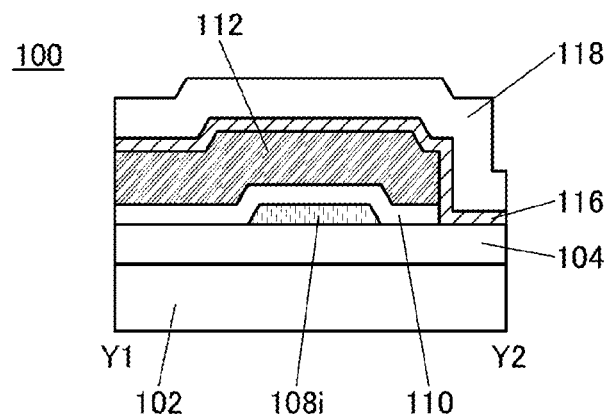

FIG. 28A is a top view of a transistor 100. FIG. 28B is a cross-sectional view taken along dashed-dotted line X1-X2 in FIG. 28A. FIG. 28C is a cross-sectional view taken along dashed-dotted line Y1-Y2 in FIG. 28A. For clarity, FIG. 28A does not illustrate some components such as an insulating film 110. As in FIG. 28A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

The transistor 100 illustrated in FIGS. 28A to 28C includes an insulating film 104 over a substrate 102; an oxide semiconductor film 108 over the insulating film 104; the insulating film 110 over the oxide semiconductor film 108; a conductive film 112 over the insulating film 110; and an insulating film 116 over the insulating film 104, the oxide semiconductor film 108, and the conductive film 112. Note that the oxide semiconductor film 108 includes a channel region 108i overlapping with the conductive film 112, a source region 108s in contact with the insulating film 116, and a drain region 108d in contact with the insulating film 116.

Furthermore, the insulating film 116 contains nitrogen or hydrogen. The insulating film 116 is in contact with the source region 108s and the drain region 108d, so that nitrogen or hydrogen that is contained in the insulating film 116 is added to the source region 108s and the drain region 108d. The source region 108s and the drain region 108d each have a high carrier density when nitrogen or hydrogen is added thereto.

The transistor 100 may further include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. The insulating film 110 includes an oxygen-excess region. Since the insulating film 110 includes the oxygen-excess region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. However, in that case, excess oxygen contained in the insulating film 104 might also be supplied to the source region 108s and the drain region 108d included in the oxide semiconductor film 108. When excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied only to the channel region 108i. Alternatively, the carrier density of the source and drain regions 108s and 108d can be selectively increased after excess oxygen is supplied to the channel region 108i and the source and drain regions 108s and 108d, in which case an increase in the resistance of the source and drain regions 108s and 108d can be prevented.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. The element that forms an oxygen vacancy is diffused from the insulating film 116 to the source region 108s and the drain region 108d in the case where the insulating film 116 contains one or more such elements. In addition or alternatively, the element that forms an oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Next, details of the components of the semiconductor device in FIGS. 28A to 28C are described.

[Substrate]

As the substrate 102, any of a variety of substrates can be used without particular limitation. The substrate 102 can be formed using a material similar to that of the substrates 401, 452, 652, and 670 described in Embodiment 1.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Oxide Semiconductor Film]

The oxide semiconductor film 108 can be formed using a material similar to that of the oxide semiconductor films 409a, 409b, and 409c described in Embodiment 1.

[Second Insulating Film]

The insulating film 110 functions as a gate insulating film of the transistor 100. In addition, the insulating film 110 has a function of supplying oxygen to the oxide semiconductor film 108, particularly to the channel region 108i. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, silicon oxide, silicon oxynitride, silicon nitride oxide, or silicon nitride may be used for the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

In addition to the above-described signal, a signal due to nitrogen dioxide ($NO_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1 \times 10^{17}$ spins/cm$^3$ and lower than $1 \times 10^{18}$ spins/cm$^3$ as the insulating film 110, for example.

Note that a nitrogen oxide ($NO_x$) such as nitrogen dioxide ($NO_2$) forms a state in the insulating film 110. The state is positioned in the energy gap of the oxide semiconductor film 108. Thus, when nitrogen oxide ($NO_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1 \times 10^{18}$ molecules cm$^{-3}$ and less than or equal to $5 \times 10^{19}$ molecules cm$^{-3}$. Note that the released amount of ammonia is the total amount of ammonia released by heat treatment in a range of 50° C. to 650° C. or 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6 \times 10^{20}$ atoms/cm$^3$.

The insulating film 110 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), or hafnium oxide. The use of such a high-k material enables a reduction in gate leakage current of a transistor.

[Third Insulating Film]

The insulating film 116 contains nitrogen or hydrogen. The insulating film 116 may contain fluorine. As the insulating film 116, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1 \times 10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a stack including an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a pulsed laser deposition (PLD) method, a thermal CVD method, or the like. The conductive films 112, 120a, and 120b can be formed using materials similar to those of the conductive films 402, 403a, 403b, 403, 405a, 405b, 405, 407a, 407b, 407c, 407d, 407e, 414a, 414b, 414c, 414d, 414e, 414f, 414g, 414h, 417, 420, and 610 which are described in Embodiment 1.

The conductive films 112, 120a, and 120b can also be formed using a light-transmitting conductive material such as ITO, indium oxide containing tungsten oxide, indium zinc oxide containing tungsten oxide, indium oxide containing titanium oxide, indium tin oxide containing titanium oxide, indium zinc oxide, or ITSO. It is also possible to have a layered structure formed using the above light-transmitting conductive material and the above metal element.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is favorable that the conductive film 112 has a single-layer structure of a light-shielding metal film or a stacked-layer structure of an oxide conductor (OC) and a light-shielding metal film because the channel region 108i formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 112, 120a, and 120b can be greater than or equal to 30 nm and less than or equal to 500 nm, or greater than or equal to 100 nm and less than or equal to 400 nm.

<3-2. Structure Example 2 of Transistor>

Next, a structure of a transistor different from that in FIGS. 28A to 28C is described with reference to FIGS. 29A to 29C.

Figure 29A:
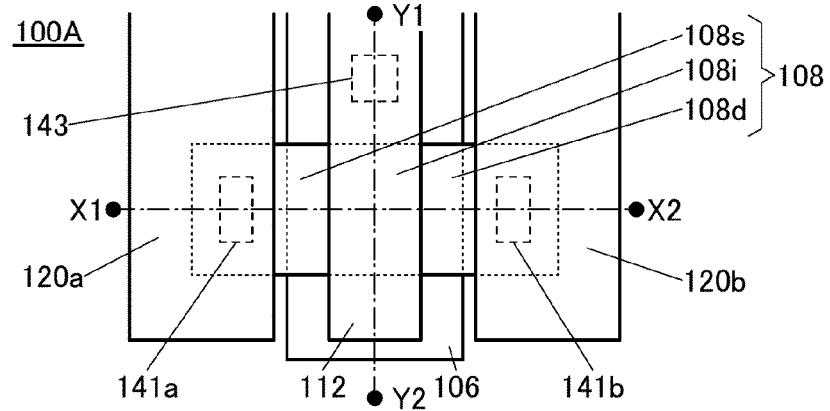
FIGS. 29A to 29C are a top view and cross-sectional views illustrating a semiconductor device.

FIG. 29A is a top view of a transistor 100A. FIG. 29B is a cross-sectional view taken along dashed-dotted line X1-X2 in FIG. 29A. FIG. 29C is a cross-sectional view taken along dashed-dotted line Y1-Y2 in FIG. 29A.

Figure 29B:
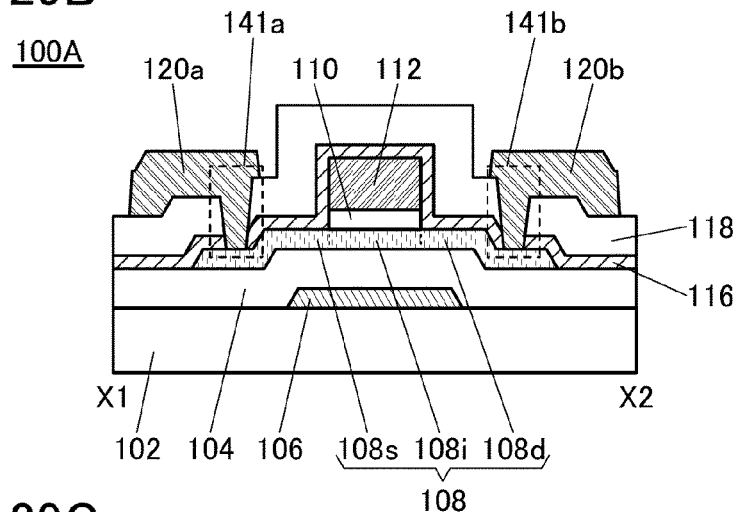
Figure 29C:
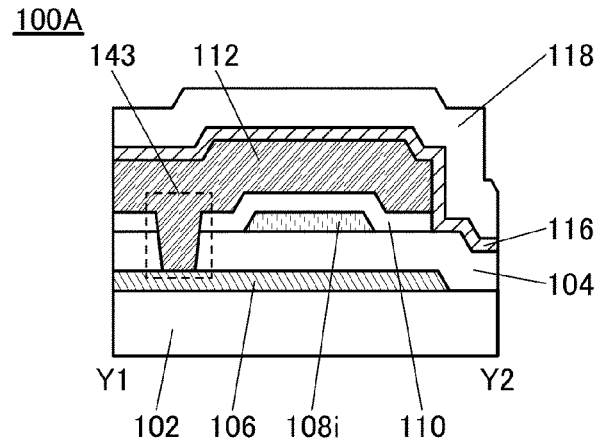

The transistor 100A illustrated in FIGS. 29A to 29C includes a conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112. Note that the oxide semiconductor film 108 includes the channel region 108i overlapping with the conductive film 112, the source region 108s in contact with the insulating film 116, and the drain region 108d in contact with the insulating film 116.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. When the conductive film 106 is formed using a light-shielding material, for example, light irradiating the channel region 108i from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper for the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, when the transistor 100A is used as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 29A to 29C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIG. 29C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 placed therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround an oxide semiconductor film in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3-V4) may be larger than the potential amplitude of the signal A (V1-V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

Except for the above-mentioned points, the transistor 100A has a structure and an effect similar to those of the transistor 100 described above.

<3-3. Structure Example 3 of Transistor>

Next, structures of a transistor different from that in FIGS. 29A to 29C are described with reference to FIGS. 30A and 30B, FIGS. 31A and 31B, FIGS. 32A and 32B, FIGS. 33A and 33B, FIGS. 34A and 34B, and FIGS. 35A to 35C.

Figure 30A:
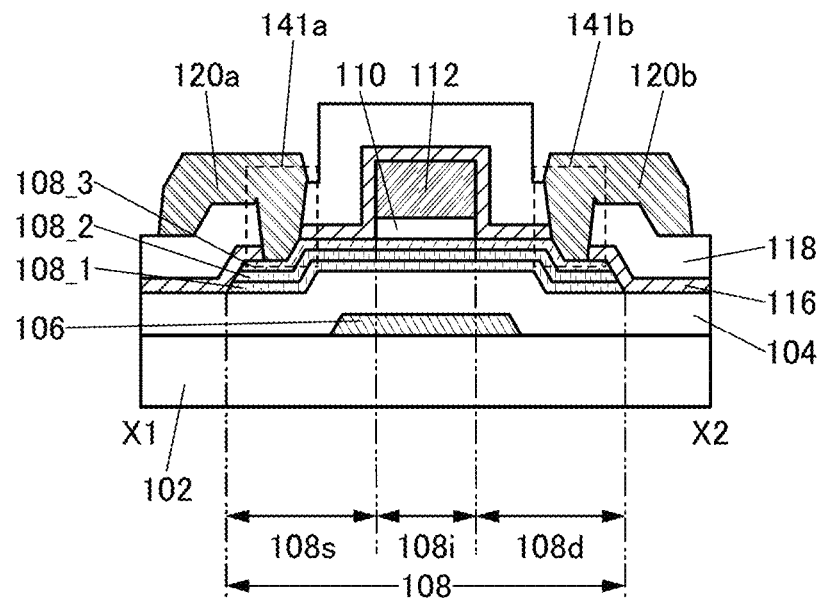
FIGS. 30A and 30B are cross-sectional views illustrating a semiconductor device.
Figure 30B:
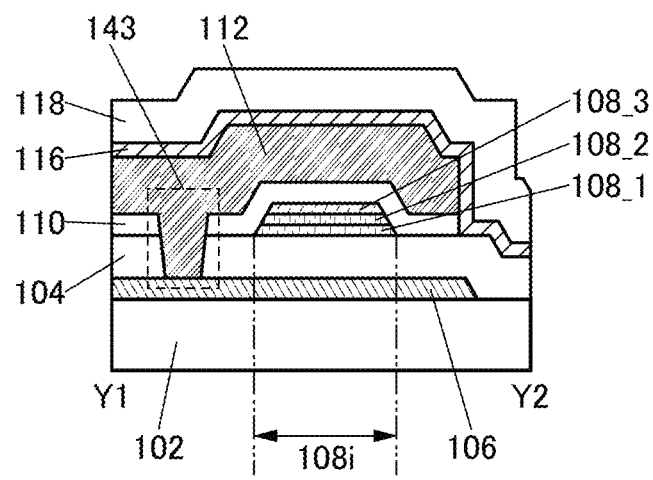
Figure 31A:
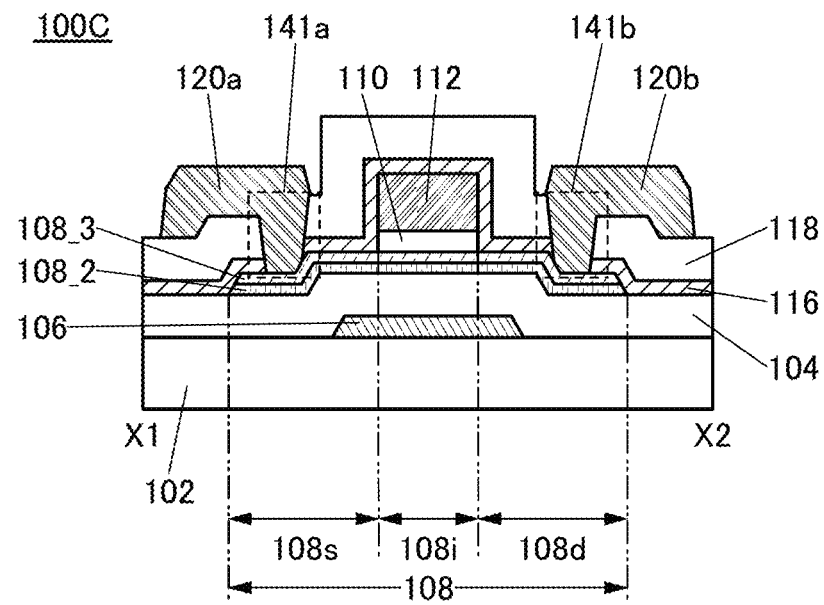
FIGS. 31A and 31B are cross-sectional views illustrating a semiconductor device.
Figure 31B:
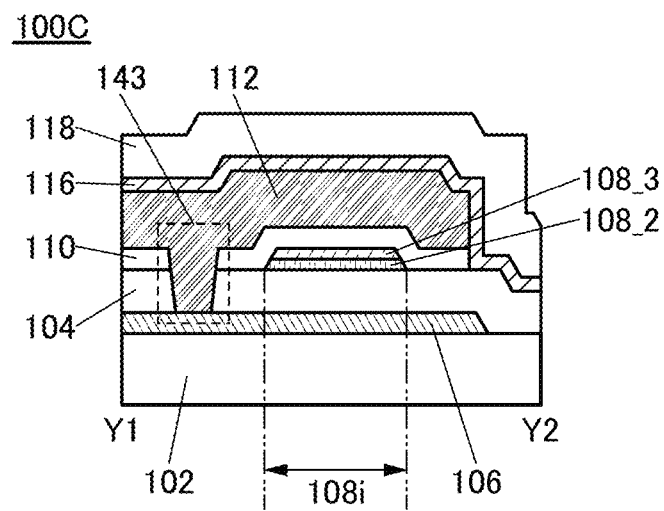
Figure 32A:
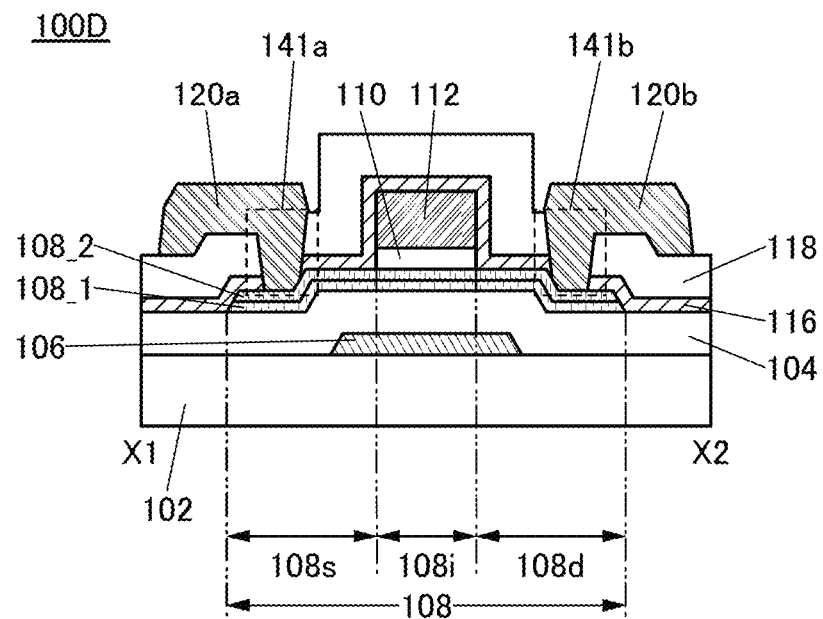
FIGS. 32A and 32B are cross-sectional views illustrating a semiconductor device.
Figure 32B:
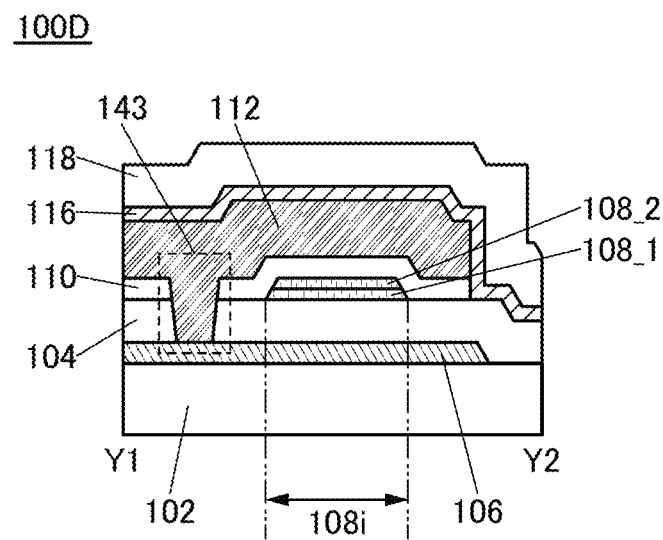
Figure 33A:
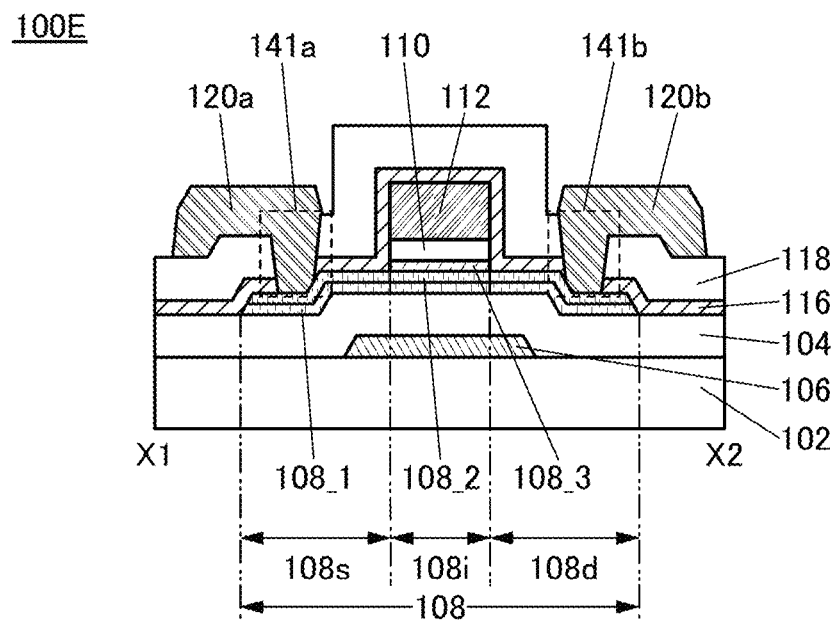
FIGS. 33A and 33B are cross-sectional views illustrating a semiconductor device.
Figure 33B:
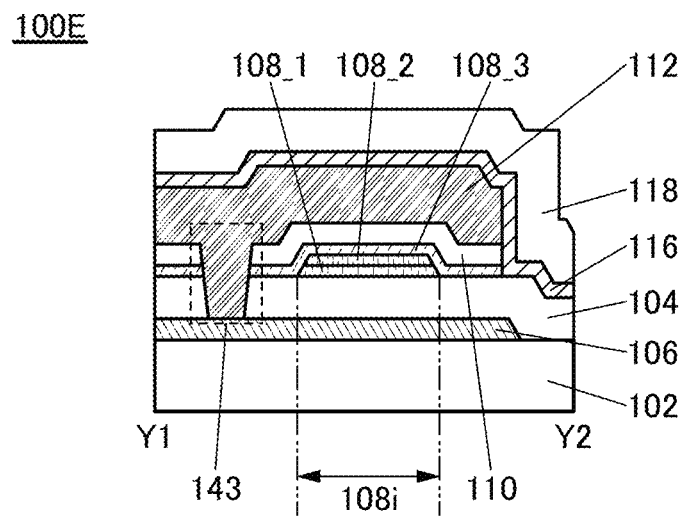
Figure 34A:
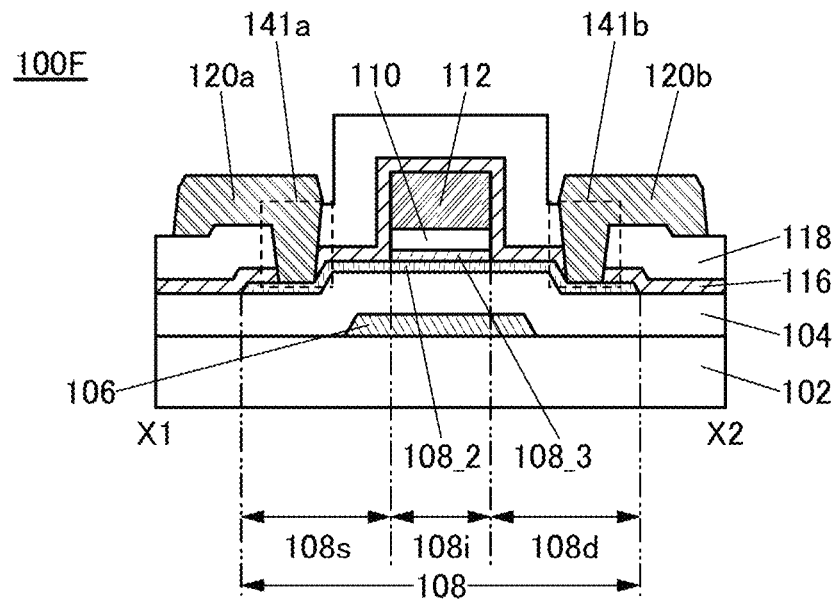
FIGS. 34A and 34B are cross-sectional views illustrating a semiconductor device.
Figure 34B:
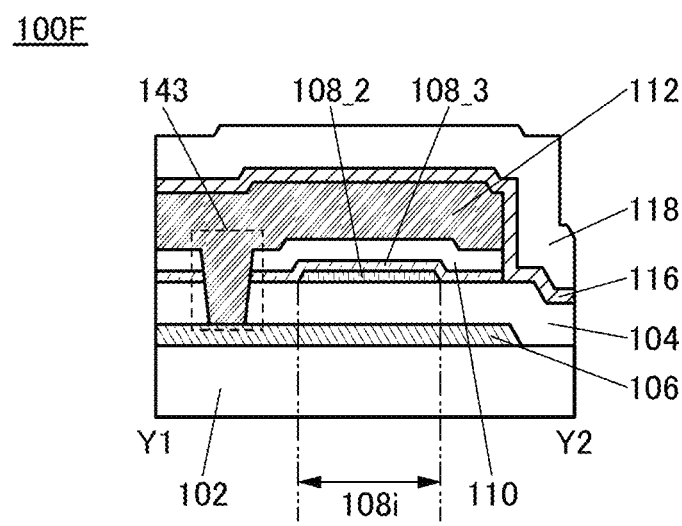

FIGS. 30A and 30B are cross-sectional views of a transistor 100B. FIGS. 31A and 31B are cross-sectional views of a transistor 100C. FIGS. 32A and 32B are cross-sectional views of a transistor 100D. FIGS. 33A and 33B are cross-sectional views of a transistor 100E. FIGS. 34A and 34B are cross-sectional views of a transistor 100F. Note that top views of the transistor 100C, the transistor 100D, the transistor 100E, and the transistor 100F are similar to that of the transistor 100A illustrated in FIG. 29A and thus are not described here.

The transistors 100C, 100D, 100E, and 100F are different from the above-described transistor 100A in the structure of the oxide semiconductor film 108. The other components of the transistors are similar to those of the transistor 100A described above and have similar effects.

The oxide semiconductor film 108 of the transistor 100B illustrated in FIGS. 30A and 30B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108i, the source region 108s, and the drain region 108d each have a three-layer structure of the oxide semiconductor film 108_1, the oxide semiconductor film 108_2, and the oxide semiconductor film 108_3.

The oxide semiconductor film 108 of the transistor 100C illustrated in FIGS. 31A and 31B includes the oxide semiconductor film 108_2 over the insulating film 104, and the oxide semiconductor film 108_3 over the oxide semiconductor film 108_2. The channel region 108i, the source region 108s, and the drain region 108d each have a two-layer structure of the oxide semiconductor film 108_2 and the oxide semiconductor film 108_3.

The oxide semiconductor film 108 of the transistor 100D illustrated in FIGS. 32A and 32B includes the oxide semiconductor film 108_1 over the insulating film 104, and the oxide semiconductor film 108_2 over the oxide semiconductor film 108_1. The channel region 108i, the source region 108s, and the drain region 108d each have a two-layer structure of the oxide semiconductor film 108_1 and the oxide semiconductor film 108_2.

The oxide semiconductor film 108 of the transistor 100E illustrated in FIGS. 33A and 33B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 108_2. Note that in the cross section of the transistor 100E in the channel width (W) direction, the oxide semiconductor film 108_3 covers side surfaces of the oxide semiconductor film 108_1 and the oxide semiconductor film 108_2.

The oxide semiconductor film 108 of the transistor 100F illustrated in FIGS. 34A and 34B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 108_2. Note that in the cross section of the transistor 100F in the channel width (W) direction, the oxide semiconductor film 108_3 covers side surfaces of the oxide semiconductor film 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100E and the transistor 100F, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

<3-4. Band Structure>

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 are described with reference to FIGS. 35A to 35C. Note that FIGS. 35A to 35C are each a band structure of the channel region 108i.

Figure 35A:
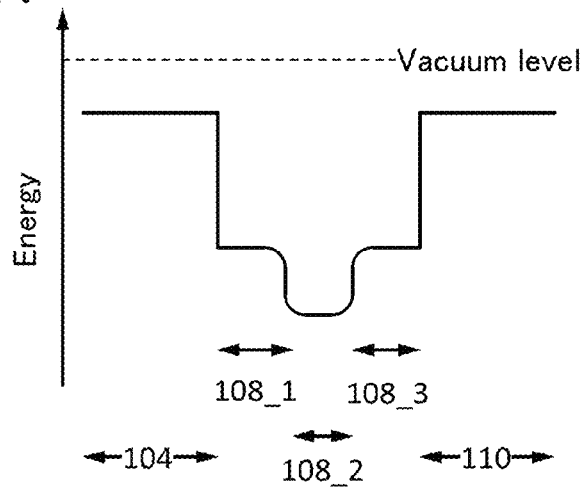
FIGS. 35A to 35C each illustrate a band structure.

FIG. 35A shows an example of a band structure in the thickness direction of a stack including the insulating film 104, the oxide semiconductor films 108_1, 108_2, and 108_3, and the insulating film 110. FIG. 35B shows an example of a band structure in the thickness direction of a stack including the insulating film 104, the oxide semiconductor films 108_2 and 108_3, and the insulating film 110. FIG. 35C shows an example of a band structure in the thickness direction of a stack including the insulating film 104, the oxide semiconductor films 108_1 and 108_2, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 35A, a silicon oxide film is used as each of the insulating films 104 and 110, an oxide semiconductor film formed using a metal oxide target whose atomic ratio of In to Ga to Zn is 1:3:2 is used as the oxide semiconductor film 108_1, an oxide semiconductor film formed using a metal oxide target whose atomic ratio of In to Ga to Zn is 4:2:4.1 is used as the oxide semiconductor film 108_2, and an oxide semiconductor film formed using a metal oxide target whose atomic ratio of In to Ga to Zn is 1:3:2 is used as the oxide semiconductor film 108_3.

Figure 35B:
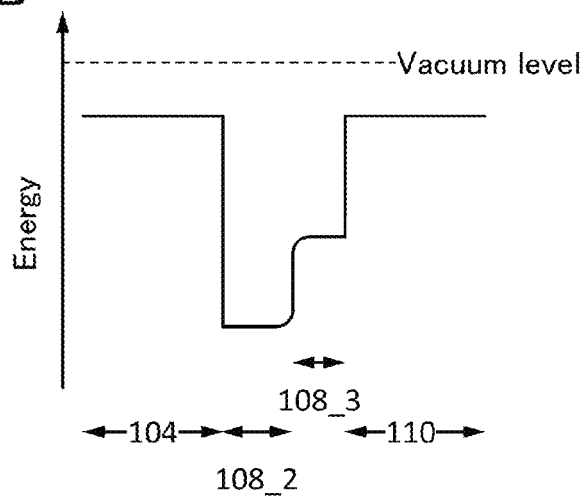
Figure 35C:
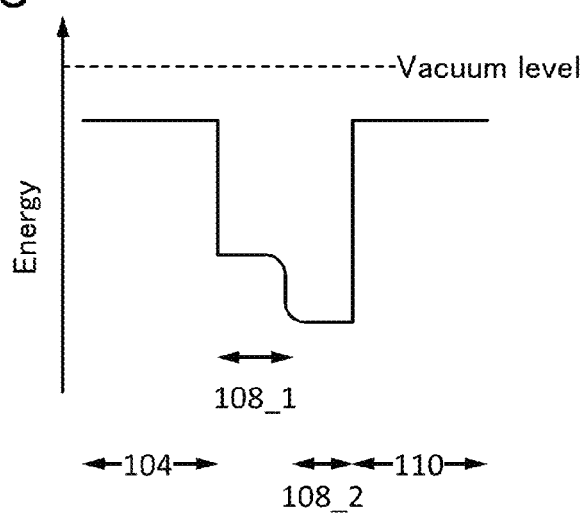

In the band structure of FIG. 35B, a silicon oxide film is used as each of the insulating films 104 and 110, an oxide semiconductor film formed using a metal oxide target whose atomic ratio of In to Ga to Zn is 4:2:4.1 is used as the oxide semiconductor film 108_2, and an oxide semiconductor film formed using a metal oxide target whose atomic ratio of In to Ga to Zn is 1:3:2 is used as the oxide semiconductor film 108_3.

In the band structure of FIG. 35C, a silicon oxide film is used as each of the insulating films 104 and 110, an oxide semiconductor film formed using a metal oxide target whose atomic ratio of In to Ga to Zn is 1:3:2 is used as the oxide semiconductor film 108_1, and an oxide semiconductor film formed using a metal oxide target whose atomic ratio of In to Ga to Zn is 4:2:4.1 is used as the oxide semiconductor film 108_2.

As illustrated in FIG. 35A, the conduction band minimum gradually varies between the oxide semiconductor films 108_1, 108_2, and 108_3. As illustrated in FIG. 35B, the conduction band minimum gradually varies between the oxide semiconductor films 108_2 and 108_3. As illustrated in FIG. 35C, the conduction band minimum gradually varies between the oxide semiconductor films 108_1 and 108_2. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 35A, FIG. 35B, or FIG. 35C, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from trap states.

In addition, the trap states might be more distant from the vacuum level than the conduction band minimum ($E_c$) of the oxide semiconductor film 108_2 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the conduction band minimum ($E_c$) of the oxide semiconductor film 108_2. Such a structure inhibits accumulation of electrons in the trap states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 function as oxide insulating films. It is preferable that the oxide semiconductor films 108_1 and 108_3 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, more preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS film described later, in which case a higher blocking property against constituent elements of the conductive films 120a and 120b, for example, copper elements, can be obtained.

Although the example where an oxide semiconductor film formed using a metal oxide target whose atomic ratio of In to Ga to Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga to Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. In that case, it is favorable that an oxide semiconductor film formed using a metal oxide target whose atomic ratio of In to Ga to Zn is 1:1:1 is used as the oxide semiconductor film 108_2 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga to Zn is 1:1:1, the atomic ratio of In to Ga to Zn in the oxide semiconductor films 108_1 and 108_3 might be 1:$\beta$1:$\beta$2 (0<$\beta$1≤2, 0<$\beta$2≤2). When the oxide semiconductor films 108_1 and 108_3 are formed using a metal oxide target whose atomic ratio of In to Ga to Zn is 1:3:4, the atomic ratio of In to Ga to Zn in the oxide semiconductor films 108_1 and 108_3 might be 1:$\beta$3:$\beta$4 (1≤$\beta$3≤5, 2≤$\beta$4≤6). When the oxide semiconductor films 108_1 and 108_3 are formed using a metal oxide target whose atomic ratio of In to Ga to Zn is 1:3:6, the atomic ratio of In to Ga to Zn in the oxide semiconductor films 108_1 and 108_3 might be 1:β5:β6 (1≤β5≤5, 4≤β6≤8).

The structure described in this embodiment can be used in appropriate combination with any of the structures described in the other embodiments.

Embodiment 4

In this embodiment, a transistor that can be used for the display device of one embodiment of the present invention is described in detail.

In this embodiment, an inverted staggered transistor is described with reference to FIGS. 36A to 36C, FIGS. 37A to 37C, FIGS. 38A to 38C, FIGS. 39A to 39C, and FIGS. 40A to 40D.

<4-1. Structure Example 1 of Transistor>

Figure 36A:
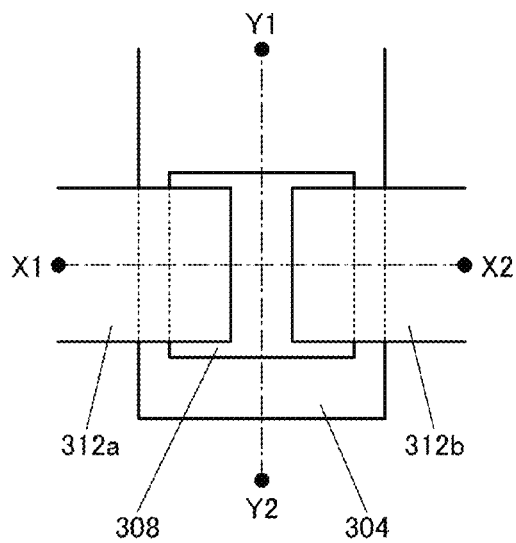
FIGS. 36A to 36C are a top view and cross-sectional views illustrating one mode of a transistor.
Figure 36B:
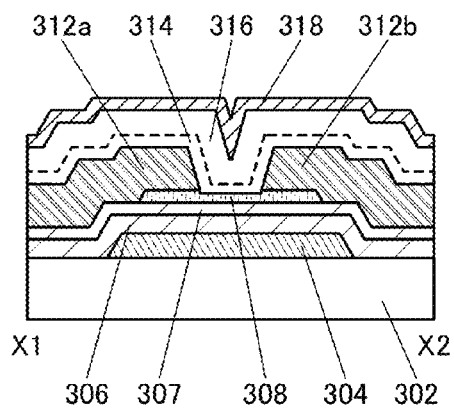
Figure 36C:
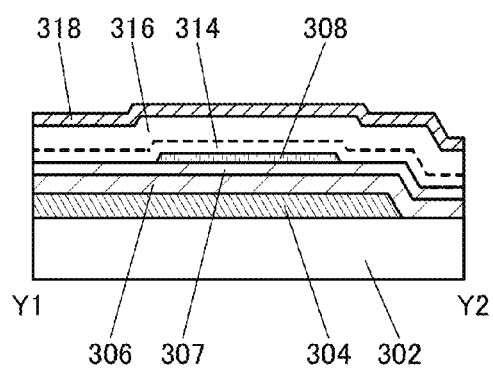

FIG. 36A is a top view of a transistor 300A. FIG. 36B is a cross-sectional view taken along dashed-dotted line X1-X2 in FIG. 36A. FIG. 36C is a cross-sectional view taken along dashed-dotted line Y1-Y2 in FIG. 36A. Note that in FIG. 36A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 36A, some components are not illustrated in some cases in top views of transistors described below.

The transistor 300A includes a conductive film 304 functioning as a gate electrode over a substrate 302, an insulating film 306 over the substrate 302 and the conductive film 304, an insulating film 307 over the insulating film 306, an oxide semiconductor film 308 over the insulating film 307, a conductive film 312*a* functioning as a source electrode electrically connected to the oxide semiconductor film 308, and a conductive film 312*b* functioning as a drain electrode electrically connected to the oxide semiconductor film 308. Over the transistor 300A, specifically, over the conductive films 312*a* and 312*b* and the oxide semiconductor film 308, an insulating film 314, an insulating film 316, and an insulating film 318 are provided. The insulating films 314, 316, and 318 function as a protective insulating film for the transistor 300A.

<4-2. Structure Example 2 of Transistor>

FIG. 37A is a top view of a transistor 300B. FIG. 37B is a cross-sectional view taken along dashed-dotted line X1-X2 in FIG. 37A. FIG. 37C is a cross-sectional view taken along dashed-dotted line Y1-Y2 in FIG. 37A.

The transistor 300B includes the conductive film 304 functioning as a gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312*a* functioning as a source electrode, and the conductive film 312*b* functioning as a drain electrode. The conductive film 312*a* is electrically connected to the oxide semiconductor film 308 through an opening 341*a* provided in the insulating films 314 and 316. The conductive film 312*b* is electrically connected to the oxide semiconductor film 308 through an opening 341*b* provided in the insulating films 314 and 316. Over the transistor 300B, specifically, over the conductive films 312*a* and 312*b* and the insulating film 316, the insulating film 318 is provided. The insulating films 314 and 316 function as a protective insulating film for the oxide semiconductor film 308. The insulating film 318 functions as a protective insulating film for the transistor 300B.

The transistor 300A has a channel-etched structure, whereas the transistor 300B in FIGS. 37A to 37C has a channel-protective structure.

<4-3. Structure Example 3 of Transistor>

Figure 38A:
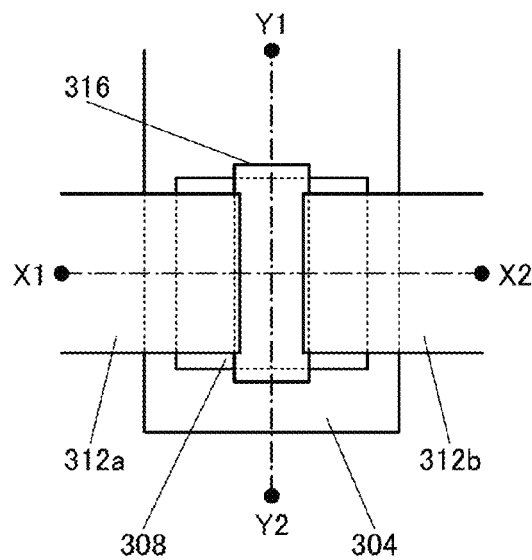
FIGS. 38A to 38C are a top view and cross-sectional views illustrating one mode of a transistor.
Figure 38B:
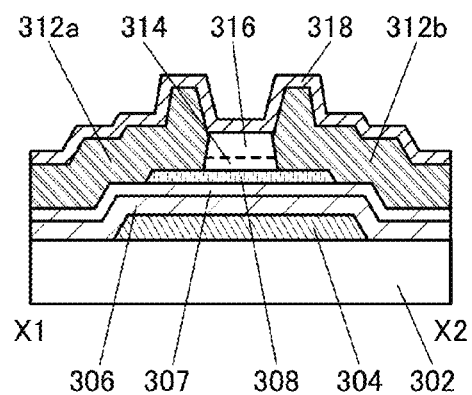
Figure 38C:
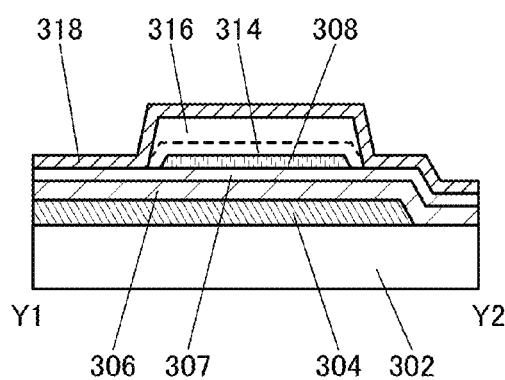

FIG. 38A is a top view of a transistor 300C. FIG. 38B is a cross-sectional view taken along dashed-dotted line X1-X2 in FIG. 38A. FIG. 38C is a cross-sectional view taken along dashed-dotted line Y1-Y2 in FIG. 38A.

The transistor 300C is different from the transistor 300B in FIGS. 37A to 37C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

<4-4. Structure Example 4 of Transistor>

Figure 39A:
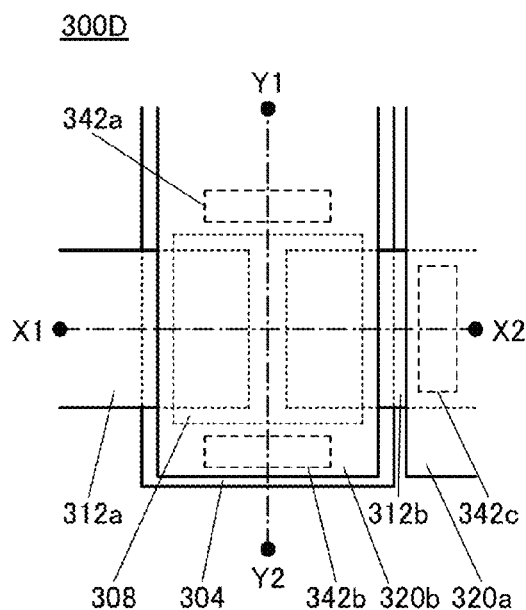
FIGS. 39A to 39C are a top view and cross-sectional views illustrating one mode of a transistor.
Figure 39B:
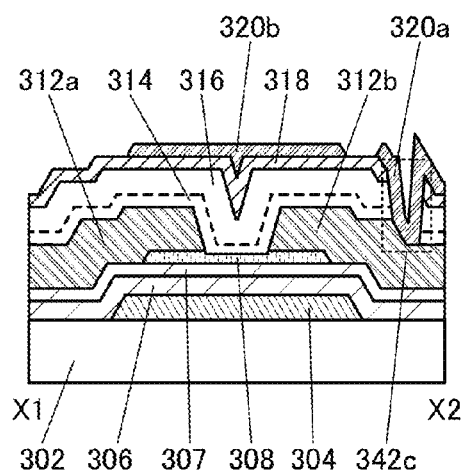
Figure 39C:
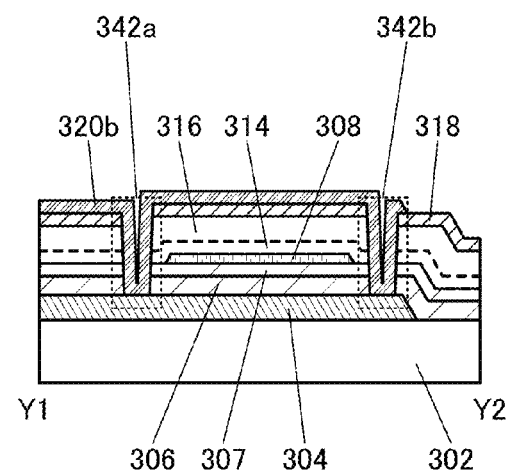

FIG. 39A is a top view of a transistor 300D. FIG. 39B is a cross-sectional view taken along dashed-dotted line X1-X2 in FIG. 39A. FIG. 39C is a cross-sectional view taken along dashed-dotted line Y1-Y2 in FIG. 39A.

The transistor 300D includes the conductive film 304 functioning as a first gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312*a* functioning as a source electrode, the conductive film 312*b* functioning as a drain electrode, the insulating film 318 over the conductive films 312*a* and 312*b* and the insulating film 316, and a conductive film 320*a* and a conductive film 320*b* over the insulating film 318. The conductive films 312*a* and 312*b* are electrically connected to the oxide semiconductor film 308.

In the transistor 300D, the insulating films 314, 316, and 318 function as a second gate insulating film of the transistor 300D. Furthermore, the conductive film 320*a* in the transistor 300D functions as a pixel electrode used for the display device. The conductive film 320*a* is connected to the conductive film 312*b* through an opening 342*c* provided in the insulating films 314, 316, and 318. In the transistor 300D, the conductive film 320*b* functions as a second gate electrode (also referred to as a back gate electrode).

As illustrated in FIG. 39C, the conductive film 320*b* is connected to the conductive film 304, which functions as the first gate electrode, in an opening 342*a* and an opening 342*b* provided in the insulating films 306, 307, 314, 316, and 318. Thus, the same potential is applied to the conductive film 320*b* and the conductive film 304.

The structure of the transistor 300D is not limited to that described above, in which the openings 342*a* and 342*b* are provided so that the conductive film 320*b* is connected to the conductive film 304. For example, a structure in which only one of the openings 342*a* and 342*b* is provided so that the conductive film 320*b* is connected to the conductive film 304, or a structure in which the conductive film 320*b* is not connected to the conductive film 304 without providing the openings 342*a* and 342*b* may be employed. Note that in the case where the conductive film 320*b* is not connected to the conductive film 304, it is possible to apply different potentials to the conductive film 320*b* and the conductive film 304.

Note that the transistor 300D has the s-channel structure described above.

<4-5. Structure Example 5 of Transistor>

The oxide semiconductor film 308 included in the transistor 300A in FIGS. 36A to 36C may have a stacked-layer structure. FIGS. 40A to 40D illustrate examples of such a case.

Figure 40A:
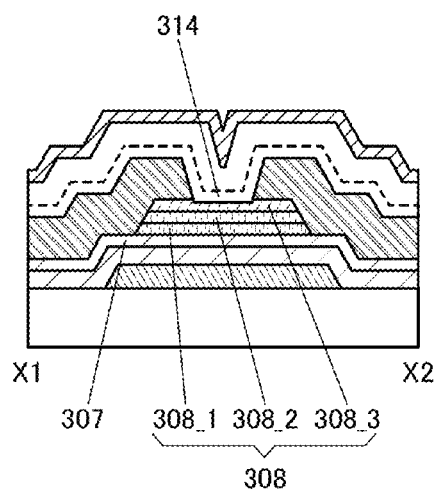
FIGS. 40A to 40D are cross-sectional views illustrating modes of transistors.
Figure 40B:
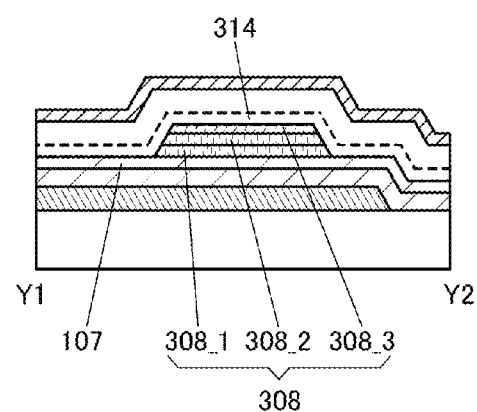
Figure 40C:
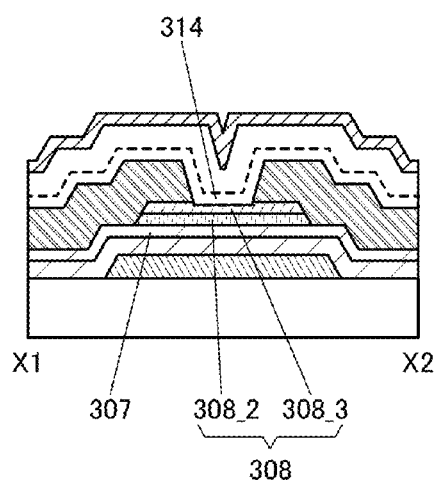
Figure 40D:
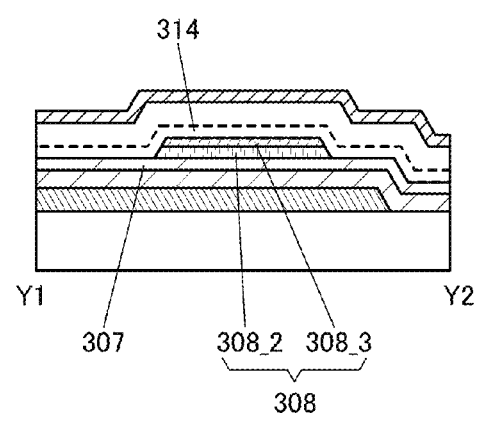

FIGS. 40A and 40B are cross-sectional views of a transistor 300E and FIGS. 40C and 40D are cross-sectional views of a transistor 300F. The top views of the transistors 300E and 300F are similar to that of the transistor 300A illustrated in FIG. 36A.

The oxide semiconductor film 308 of the transistor 300E illustrated in FIGS. 40A and 40B includes an oxide semiconductor film 308_1, an oxide semiconductor film 308_2, and an oxide semiconductor film 308_3. The oxide semiconductor film 308 of the transistor 300F illustrated in FIGS. 40C and 40D includes the oxide semiconductor film 308_2 and the oxide semiconductor film 308_3.

Note that the conductive film 304, the insulating film 306, the insulating film 307, the oxide semiconductor film 308, the oxide semiconductor film 308_1, the oxide semiconductor film 308_2, the oxide semiconductor film 308_3, the conductive film 312a, the conductive film 312b, the insulating film 314, the insulating film 316, the insulating film 318, and the conductive films 320a and 320b can be formed using the materials and formation methods of the conductive film 106, the insulating film 116, the oxide semiconductor film 108, the oxide semiconductor film 108_1, the oxide semiconductor film 108_2, the oxide semiconductor film 108_3, the conductive film 120a, the conductive film 120b, the insulating film 104, the insulating film 118, and the conductive film 112 described in Embodiment 3.

The structures of the transistors 300A to 300F can be freely combined with each other.

The structure described in this embodiment can be used in appropriate combination with any of the structures described in the other embodiments.

Embodiment 5

In this embodiment, the structure and the like of an oxide semiconductor are described with reference to FIGS. 41A to 41E, FIGS. 42A to 42E, FIGS. 43A to 43D, FIGS. 44A and 44B, and FIG. 45.

<5-1. Structure of Oxide Semiconductor>

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<5-2. CAAC-OS>

First, a CAAC-OS is described.

A CAAC-OS is one of oxide semiconductors and has a plurality of c-axis aligned crystal parts (also referred to as pellets).

Figure 41A:
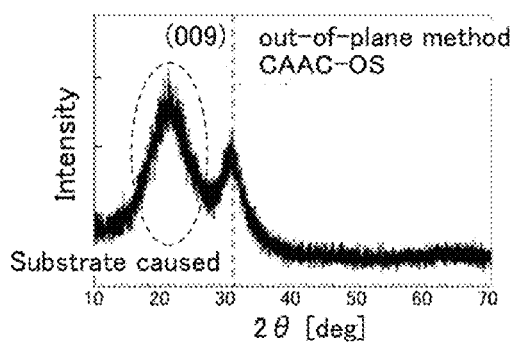
FIGS. 41A to 41E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 41A. This peak is derived from the (009) plane of the $InGaZnO_4$ crystal, which indicates that crystals in the CAAC-OS have c-axis alignment and that the c-axes are aligned in the direction substantially perpendicular to a surface over which the CAAC-OS film is formed (also referred to as a formation surface) or a top surface of the CAAC-OS film. The term "perpendicular" indicates that the angle formed between two straight lines is greater than or equal to 80° and less than or equal to 100°. Accordingly, the term "perpendicular" includes the case where the angle formed between two straight lines is greater than or equal to 85° and less than or equal to 95°. A peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

Figure 41B:
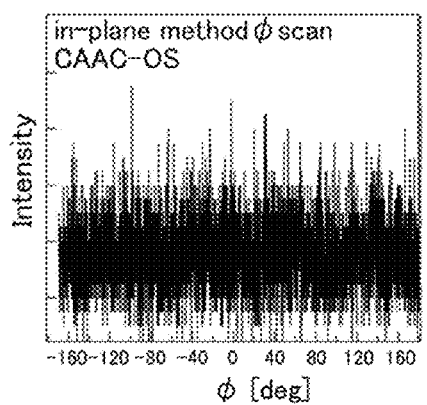
Figure 41C:
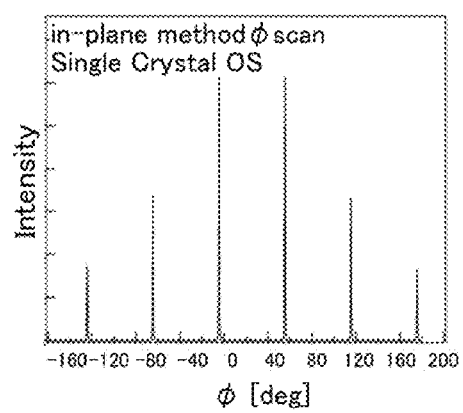
Figure 41D:
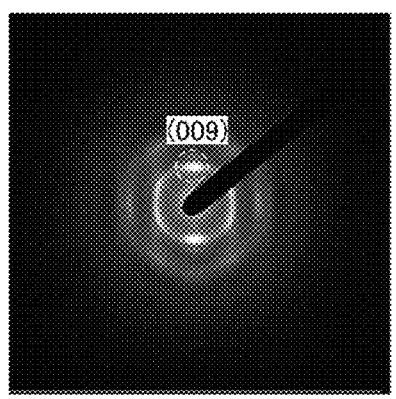

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the $InGaZnO_4$ crystal. When analysis (φ scan) is performed with 2θ fixed at around 56° while the sample is rotated around a normal vector to the sample surface as an axis (φ axis), as shown in FIG. 41B, a peak is not clearly observed. In contrast, in the case where single-crystal $InGaZnO_4$ is subjected to φ scan with 2θ fixed at around 56°, as shown in FIG. 41C, six peaks which are derived from crystal planes equivalent to the (110) plane are observed. Accordingly, the structural analysis using XRD shows that the directions of the a-axes and b-axes are irregularly oriented in the CAAC-OS.

Figure 41E:
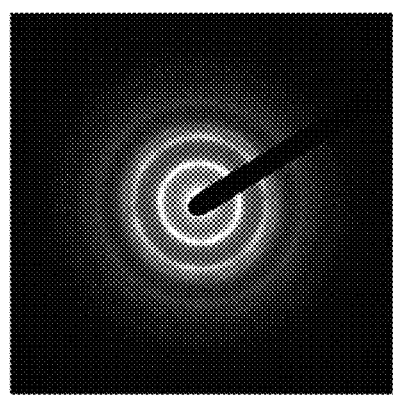

Next, a CAAC-OS analyzed by electron diffraction is described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) in FIG. 41D can be obtained. This diffraction pattern includes spots derived from the (009) plane of the $InGaZnO_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 41E shows a diffraction pattern obtained in such a manner that an electron beam with a probe diameter of 300 nm is incident on the same sample in the direction perpendicular to the sample surface. In FIG. 41E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 41E is derived from the (010) plane, the (100) plane, and the like of the InGaZnO$_4$ crystal. The second ring in FIG. 41E is derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 42A:
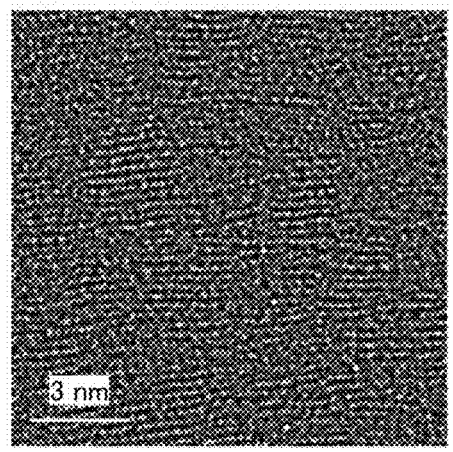
FIGS. 42A to 42E show a cross-sectional TEM image and plan-view TEM images of a CAAC-OS and images obtained through analysis thereof.

FIG. 42A shows a high-resolution TEM image of a cross section of the CAAC-OS which is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 42A shows pellets in which metal atoms are arranged in a layered manner. FIG. 42A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS. The term "parallel" indicates that the angle formed between two straight lines is greater than or equal to −10° and less than or equal to 10°, and accordingly also includes the case where the angle is greater than or equal to −5° and less than or equal to 5°.

Figure 42B:
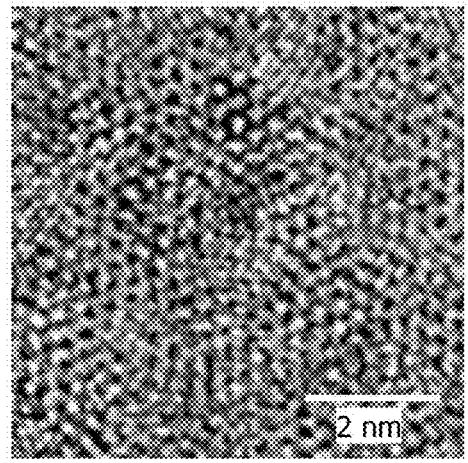
Figure 42C:
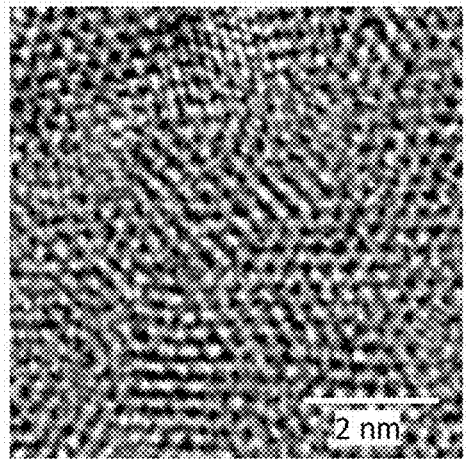
Figure 42D:
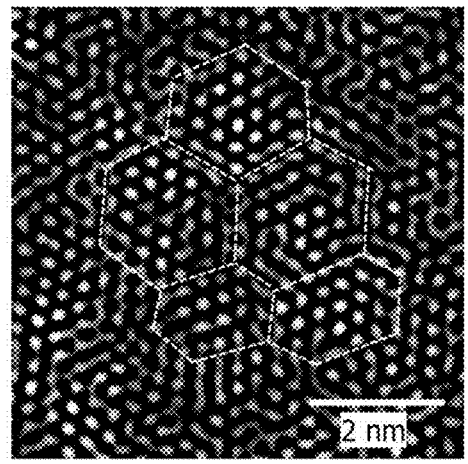
Figure 42E:
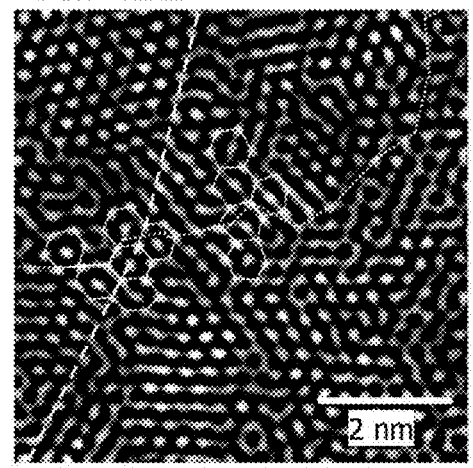

FIGS. 42B and 42C show Cs-corrected high-resolution TEM images of a plane of the CAAC-OS observed in the direction substantially perpendicular to the sample surface. FIGS. 42D and 42E are images obtained by image processing of FIGS. 42B and 42C. The method of image processing is as follows. The image in FIG. 42B is subjected to fast Fourier transform (FFT) to obtain an FFT image. Then, mask processing is performed on the obtained FFT image such that part in the range of 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 42D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 42E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, a distorted pentagon, or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8\times10^{11}$ cm$^{-3}$, preferably lower than $1\times10^{11}$ cm$^{-3}$, further preferably lower than $1\times10^{10}$ cm$^{-3}$, and higher than or equal to $1\times10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<5-3. nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 43A:
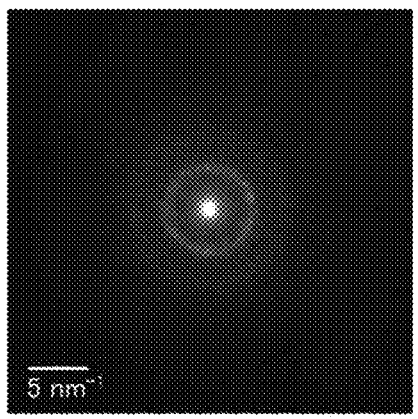
FIGS. 43A to 43D show electron diffraction patterns and a cross-sectional TEM image of an nc-OS.
Figure 43B:
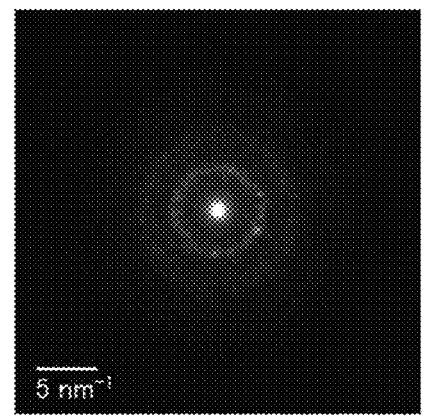

For example, when an electron beam with a probe diameter of 50 nm is incident on a 34-nm-thick region of a thinned nc-OS including an InGaZnO$_4$ crystal in the direction parallel to the formation surface, a ring-like diffraction pattern (nanobeam electron diffraction pattern) shown in FIG. 43A is observed. FIG. 43B shows a diffraction pattern (nanobeam electron diffraction pattern) obtained when an electron beam with a probe diameter of 1 nm is incident on the same sample. In FIG. 43B, a plurality of spots are observed in a ring-like region. Thus, ordering in an nc-OS is not observed with an electron beam with a probe diameter of 50 nm but is observed with an electron beam with a probe diameter of 1 nm.

Figure 43C:
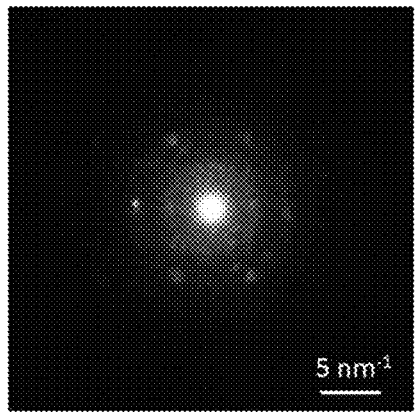

When an electron beam with a probe diameter of 1 nm is incident on a region with a thickness less than 10 nm, an electron diffraction pattern in which spots are arranged in an approximately regular hexagonal shape as shown in FIG. 43C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 43D:
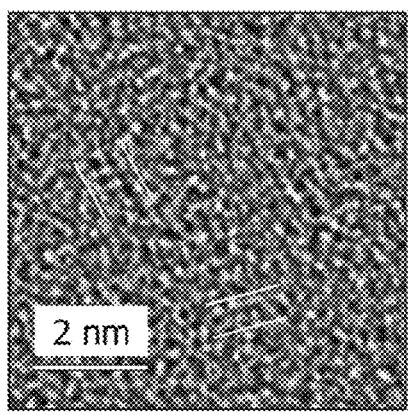

FIG. 43D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<5-4. a-Like OS>

An a-like OS has a structure between the structure of an nc-OS and the structure of an amorphous oxide semiconductor.

Figure 44A:
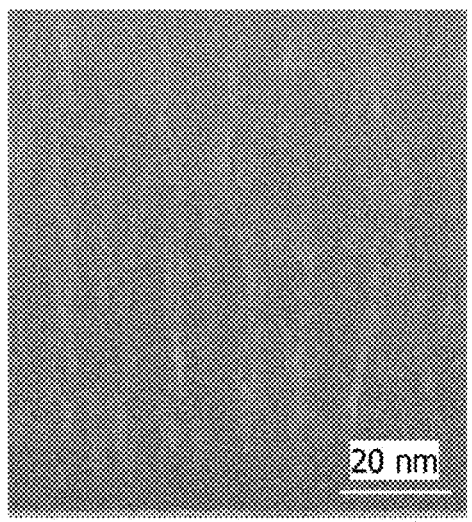
FIGS. 44A and 44B show cross-sectional TEM images of an a-like OS.
Figure 44B:
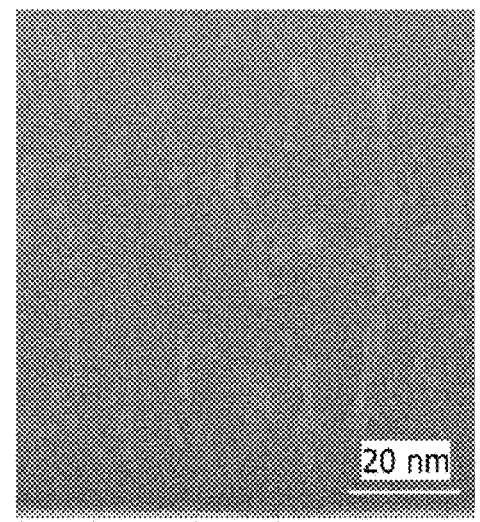

FIGS. 44A and 44B show high-resolution cross-sectional TEM images of an a-like OS. The high-resolution cross-sectional TEM image of the a-like OS in FIG. 44A is taken at the start of the electron irradiation. The high-resolution cross-sectional TEM image of the a-like OS in FIG. 44B is taken after the irradiation with electrons ($e^-$) at $4.3 \times 10^8$ $e^-/nm^2$. FIGS. 44A and 44B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of $InGaZnO_4$ in the following description. Each lattice fringe corresponds to the a-b plane of the $InGaZnO_4$ crystal.

Figure 45:
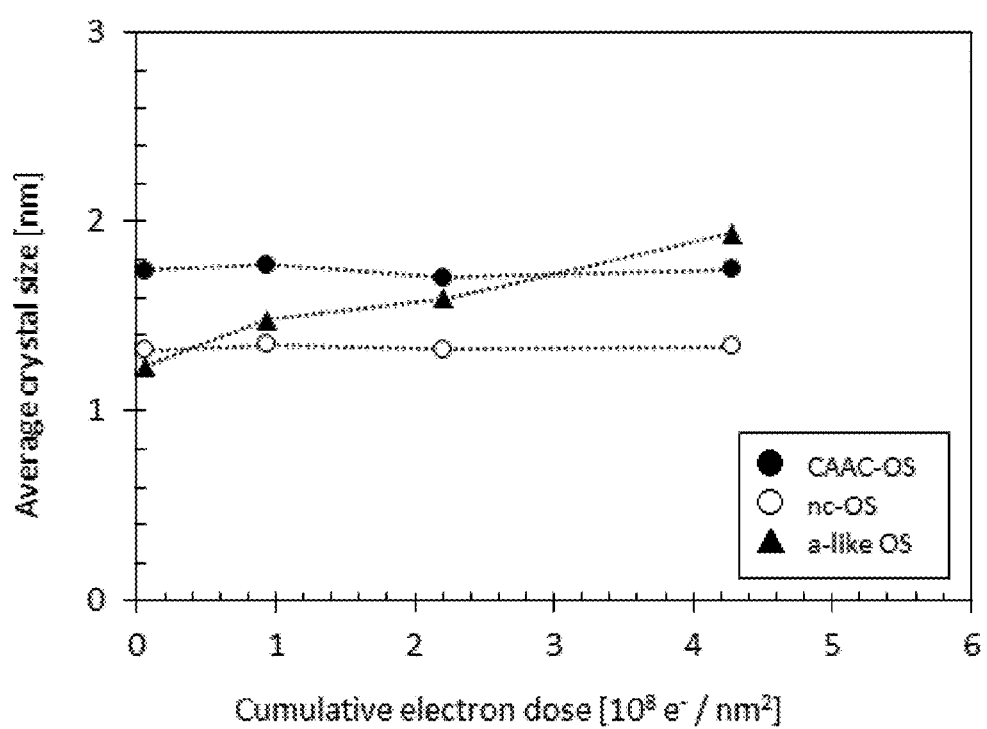
FIG. 45 shows a change in crystal parts of In—Ga—Zn oxides induced by electron irradiation.

FIG. 45 shows a change in the average size of crystal parts (at 22 points to 30 points) in each sample. Note that the crystal part size corresponds to the length of a lattice fringe. FIG. 45 indicates that the crystal part size in the a-like OS increases with an increase in the cumulative electron dose in obtaining TEM images, for example. As shown in FIG. 45, a crystal part with a size of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show few changes from the start of electron irradiation to a cumulative electron dose of $4.2 \times 10^8$ $e^-/nm^2$. As shown in FIG. 45, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ $e^-/(nm^2 \cdot s)$; and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga to Zn is 1:1:1, the density of single-crystal $InGaZnO_4$ with a rhombohedral crystal structure is 6.357 g/cm$^3$. Accordingly, in the case of the oxide semiconductor whose atomic ratio of In to Ga to Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga to Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structure described in this embodiment can be used in appropriate combination with any of the structures described in the other embodiments.

Embodiment 6

In this embodiment, a display module and electronic devices that include the display device of one embodiment of the present invention are described with reference to FIG. 46, FIGS. 47A to 47E, FIGS. 48A to 48E, and FIGS. 49A and 49B.

<6-1. Display Module>

Figure 46:
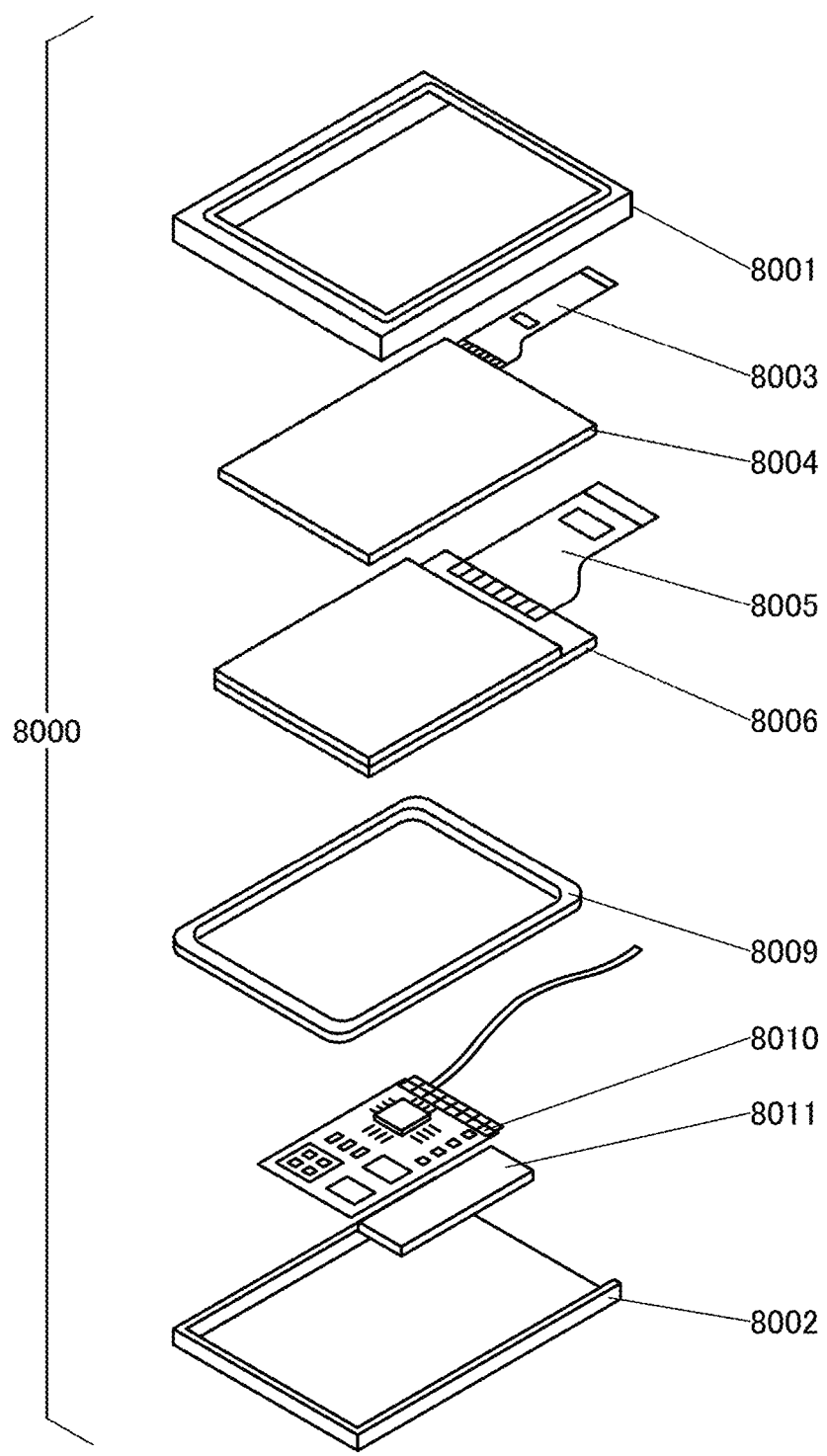
FIG. 46 illustrates a display module.

In a display module 8000 illustrated in FIG. 46, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may overlap with the display panel 8006. Alternatively, a counter substrate (sealing substrate) of the display panel 8006 can have a touch panel function. Alternatively, a photosensor may be provided in each pixel of the display panel 8006 so as to function as an optical touch panel.

The frame 8009 protects the display panel 8006 and functions as an electromagnetic shield for blocking electromagnetic waves generated by the operation of the printed circuit board 8010. The frame 8009 may function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<6-2. Electronic Device>

FIGS. 47A to 47E and FIGS. 48A to 48E illustrate electronic devices. These electronic devices can include a housing 9000, a display portion 9001, a camera 9002, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 47A to 47E and FIGS. 48A to 48E can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions of the electronic devices illustrated in FIGS. 47A to 47E and FIGS. 48A to 48E are not limited thereto, and the electronic devices may have other functions.

The electronic devices illustrated in FIGS. 47A to 47E and FIGS. 48A to 48E are described in detail below.

Figure 47A:
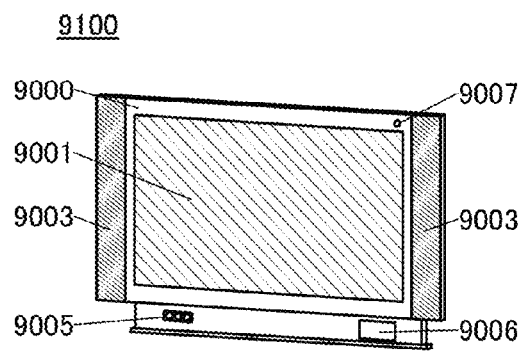
FIGS. 47A to 47E illustrate electronic devices.

FIG. 47A is a perspective view illustrating a television device 9100. The television device 9100 can include the display portion 9001 having a large screen size of, for example, 50 inches or more, 80 inches or more, or 100 inches or more.

FIG. 47B, FIG. 47C, FIG. 47D, and FIG. 47E are perspective views illustrating a portable information terminal 9101, a portable information terminal 9102, a portable information terminal 9103, and a portable information terminal 9104, respectively.

Figure 47B:
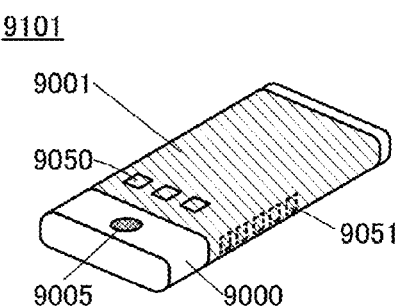

The portable information terminal 9101 illustrated in FIG. 47B has, for example, one or more of a function of a telephone set, a notebook, and an information browsing system. Specifically, the portable information terminal 9101 can be used as a smartphone. Although not illustrated, the speaker 9003, the connection terminal 9006, the sensor 9007, and the like may be provided in the portable information terminal 9101. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface (for example, a side surface) of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the strength of a received signal. Alternatively, the operation buttons 9050 or the like may be displayed in place of the information 9051. The display portion 9001 of the portable information terminal 9101 partly has a curved surface.

Figure 47D:
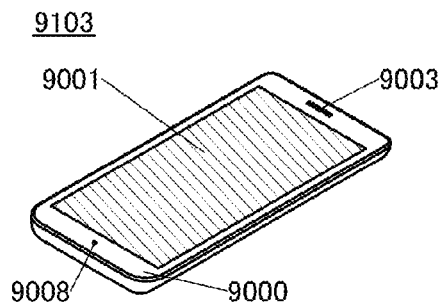
Figure 47C:
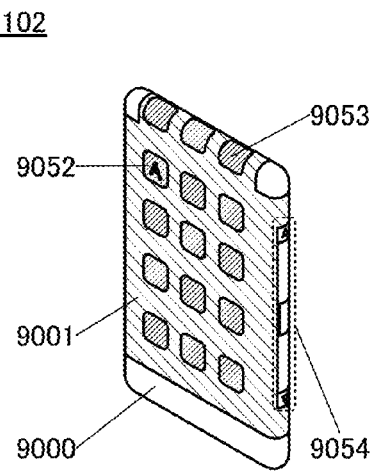

The portable information terminal 9102 illustrated in FIG. 47C has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call. The display portion 9001 of the portable information terminal 9102 partly has a curved surface.

Unlike in the portable information terminals 9101 and 9102 described above, the display portion 9001 does not have a curved surface in the portable information terminal 9103 illustrated in FIG. 47D.

Figure 47E:
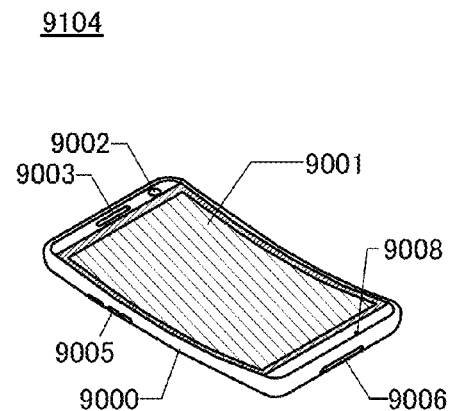

The display portion 9001 of the portable information terminals 9104 illustrated in FIG. 47E is curved. As illustrated in FIG. 47E, it is preferable that the portable information terminal 9104 be provided with a camera 9002 to have a function of taking a still image, a function of taking a moving image, a function of storing the taken image in a memory medium (an external memory medium or a memory medium incorporated in the camera), a function of displaying the taken image on the display portion 9001, or the like.

Figure 48A:
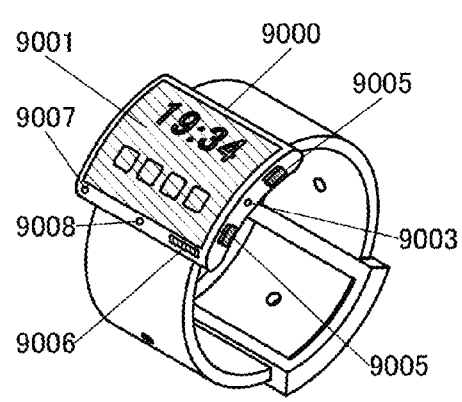
FIGS. 48A to 48E are perspective views illustrating display devices.
Figure 48B:
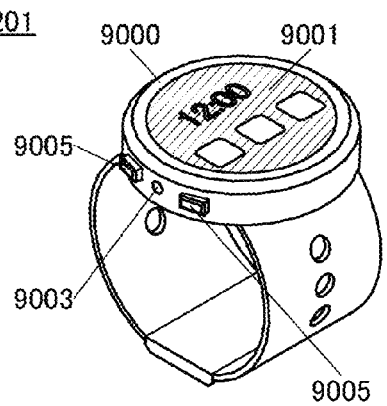

FIG. 48A is a perspective view of a watch-type portable information terminal 9200. FIG. 48B is a perspective view of a watch-type portable information terminal 9201.

The portable information terminal 9200 illustrated in FIG. 48A is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Unlike in the portable information terminal 9200 illustrated in FIG. 48A, the display surface of the display portion 9001 is not curved in the portable information terminal 9201 illustrated in FIG. 48B. Furthermore, the external state of the display portion of the portable information terminal 9201 is a non-rectangular shape (a circular shape in FIG. 48B).

Figure 48C:
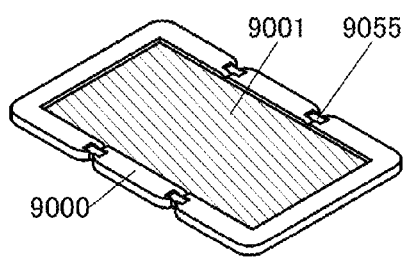
Figure 48D:
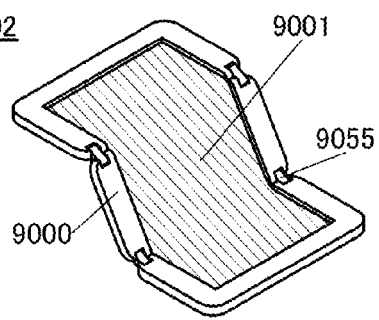
Figure 48E:
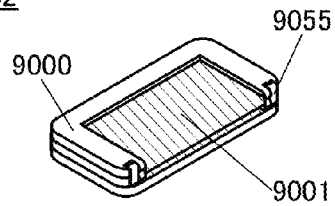

FIGS. 48C, 48D, and 48E are perspective views of a foldable portable information terminal 9202. FIG. 48C is a perspective view illustrating the portable information terminal 9202 that is opened. FIG. 48D is a perspective view illustrating the portable information terminal 9202 that is being opened or being folded. FIG. 48E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

The display device which is one embodiment of the present invention can be preferably used for the display portion 9001.

Figure 49A:
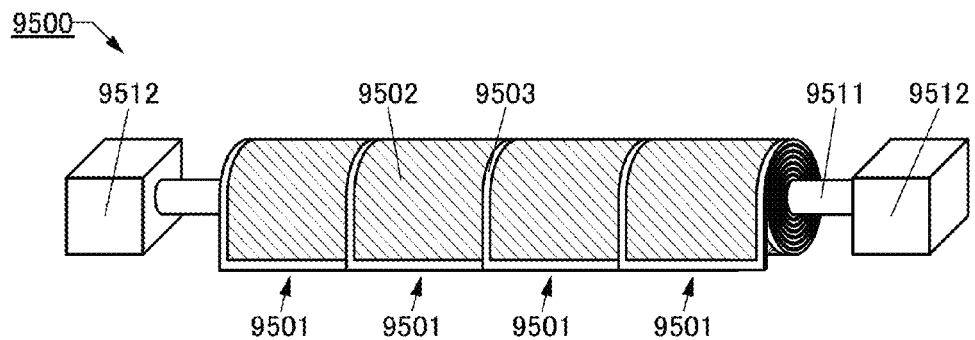
FIGS. 49A and 49B are perspective views illustrating a display device.
Figure 49B:
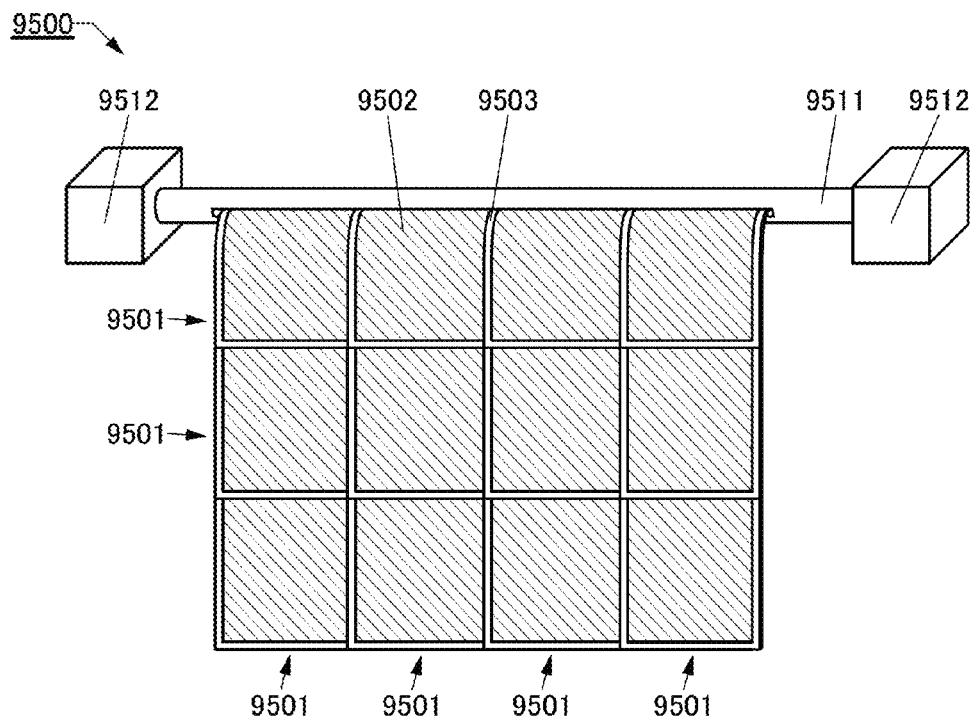

FIGS. 49A and 49B are perspective views of a display device 9500 including a plurality of display panels. Note that the plurality of display panels are wound in the perspective view in FIG. 49A, and are unwound in the perspective view in FIG. 49B.

The display device 9500 illustrated in FIGS. 49A and 49B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 49A and 49B, without limitation to this structure, the display regions 9502 of the adjacent display panels 9501 may overlap with each other without any space so that a continuous display region 9502 is obtained, for example.

The display device of one embodiment of the present invention can be preferably used in the display panel 9501.

Electronic devices described in this embodiment are characterized by having a display portion for displaying some sort of information. Note that the semiconductor device of one embodiment of the present invention can also be used for an electronic appliance that does not have a display portion.

The structure described in this embodiment can be used in appropriate combination with any of the structures described in the other embodiments.

EXAMPLE

In this example, a sample including a color film that can be used for the display device of one embodiment of the present invention was fabricated. Optical microscope observation and cross-sectional observation of the sample were performed. Details of the sample fabricated in this example are described below.

Note that in this example, by a method that corresponds to the method for manufacturing the display device 500 illustrated in FIGS. 15A to 15C, a sample (hereinafter referred to as Sample A1) that corresponds to the element provided on the side of the substrate 652 included in the display device 500 in FIG. 1 was fabricated. Thus, in the following description, components having functions similar to those in FIG. 1 and FIGS. 15A to 15C are denoted by the same reference numerals.

<1-1. Method for Fabricating Sample>

First, the light-blocking film 602 was formed over the substrate 652. A glass substrate was used as the substrate 652. The light-blocking film 602 was formed in such a manner that a 100-nm-thick titanium film was formed by sputtering and was then processed by lithography and etching.

After that, the structure body 604 was formed over the substrate 652 and the light-blocking film 602. The structure body 604 was formed in such a manner that a 1.2-μm-thick acrylic resin film was formed by a spin coating method and the pattern of the acrylic resin film was formed by lithography.

Then, the color film 606 was formed over the structure body 604. As the color film 606, an acrylic resin film containing a red pigment, an acrylic resin film containing a green pigment, and an acrylic resin film containing a blue pigment were formed by a spin coating method.

Next, the insulating film 608 was formed over the color film 606. As the insulating film 608, an acrylic resin film was formed by a spin coating method.

Then, the conductive film 610 was formed over the insulating film 608. As the conductive film 610, a 100-nm-thick ITSO film was formed by sputtering.

Next, the structure bodies 612*a* and 612*b* were formed over the conductive film 610. Each of the structure bodies 612*a* and 612*b* was formed in such a manner that an acrylic resin film was formed by a spin coating method and the pattern of the acrylic resin film was formed by lithography.

Through the above steps, Sample A1 of this example was fabricated. Note that in Sample A1, the alignment film 618*b* over the structure bodies 612*a* and 612*b* illustrated in FIG. 15C was not formed.

<1-2. Optical Microscope Observation>

Next, Sample A1 fabricated as described above was observed with an optical microscope.

Figure 50:
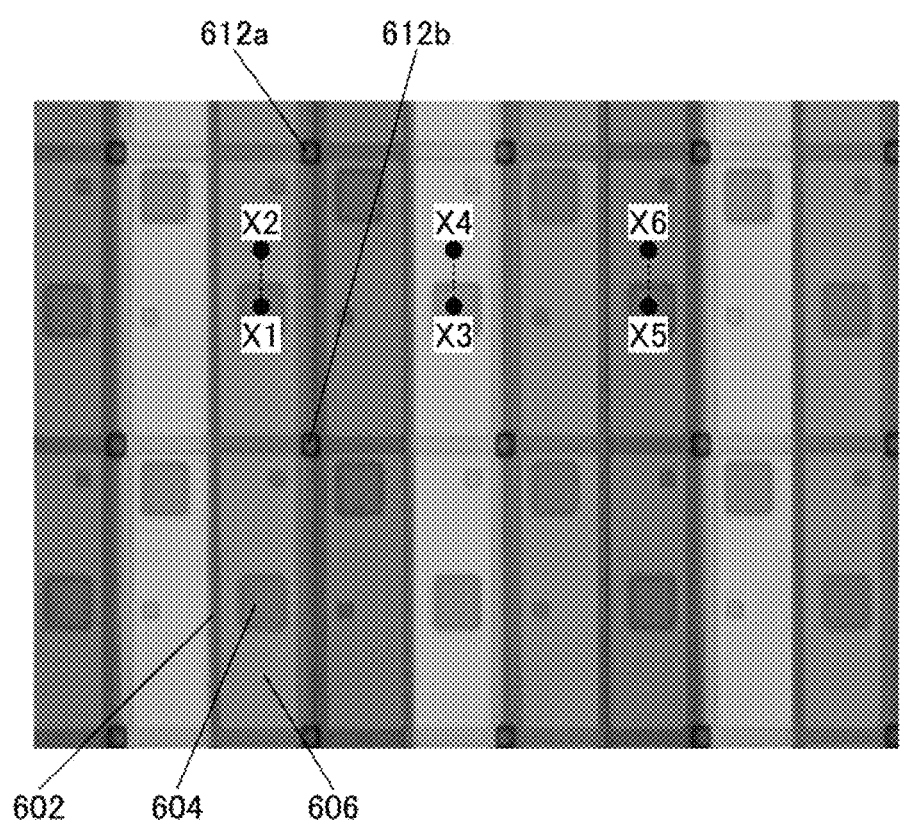
FIG. 50 shows an optical micrograph in Example.

An optical micrograph of Sample A1 is shown in FIG. 50. Note that the optical micrograph in FIG. 50 is a reflected bright-field image obtained at a magnification of 50 times.

As shown in FIG. 50, according to the optical microscope observation, Sample A1 fabricated in this example has a favorable pattern shape.

<1-3. Results of Cross-Sectional Observation>

Figure 51A:
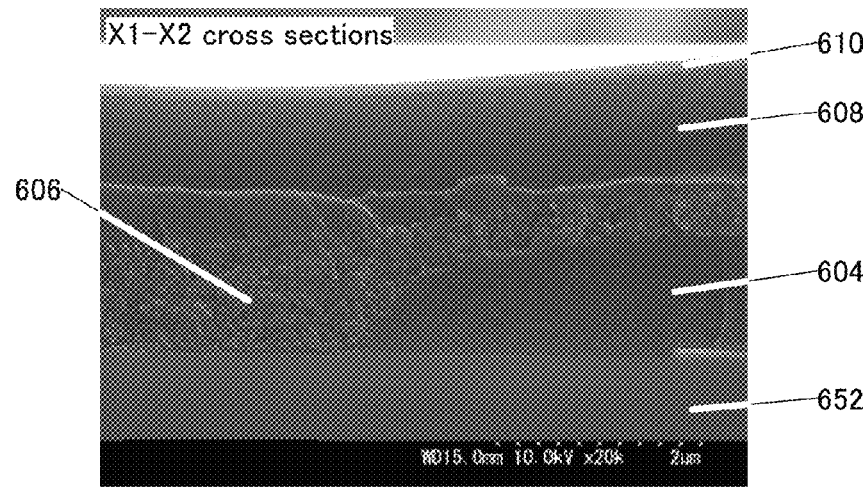
FIGS. 51A to 51C are cross-sectional SEM images in Example.
Figure 51B:
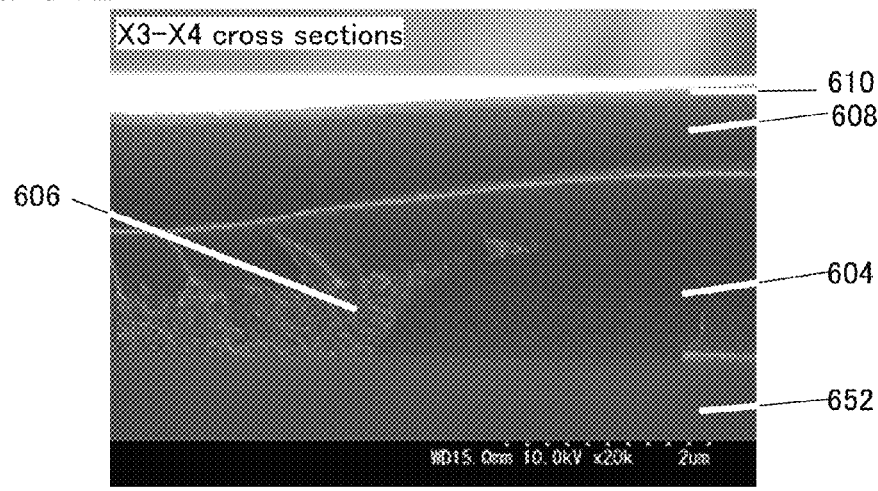
Figure 51C:
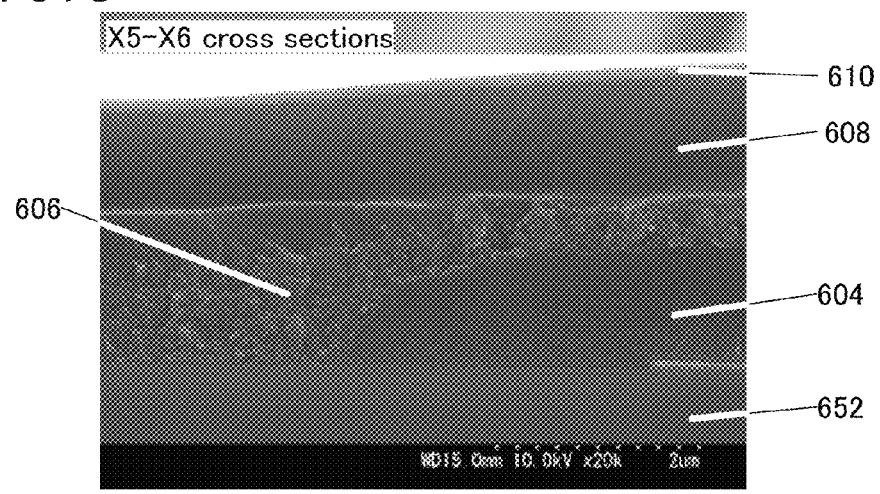

Next, cross sections along dotted lines X1-X2, X3-X4, and X5-X6 in FIG. 50 were observed. Results of the cross-sectional observation are shown in FIGS. 51A to 51C. Note that the cross sections were observed with the use of a scanning electron microscope (SEM).

FIGS. 51A, 51B, and 51C correspond to a cross-sectional SEM image along dotted line X1-X2, a cross-sectional SEM image along dotted line X3-X4, and a cross-sectional SEM image along dotted line X5-X6, respectively. The cross-sectional SEM images in FIGS. 51A to 51C were observed at a magnification of 20000 times.

The cross-sectional SEM images in FIGS. 51A to 51C show that in Sample A1 fabricated in this example, the thickness of the color film 606 in the region where the structure body 604 was provided is different from that of the color film 606 in the region where the structure body 604 was not provided. It was thus confirmed that the thickness of the color film 606 can be changed freely by forming a depression and a projection over the substrate 652 with the use of the structure body 604.

The structure described in this example can be used in appropriate combination with any of the structures described in the embodiments.

REFERENCE NUMERALS

10: pixel, 11: display element, 11*d*: display region, 12: display element, 12*d*: display region, 100: transistor, 100A: transistor, 100B: transistor, 100C: transistor, 100D: transistor, 100E: transistor, 100F: transistor, 102: substrate, 104: insulating film, 106: conductive film, 108: oxide semiconductor film, 108_1: oxide semiconductor film, 108_2: oxide semiconductor film, 108_3: oxide semiconductor film, 108*d*: drain region, 108*i*: channel region, 108*s*: source region, 110: insulating film, 112: conductive film, 116: insulating film, 118: insulating film, 120*a*: conductive film, 120*b*: conductive film, 141*a*: opening, 141*b*: opening, 143: opening, 300A: transistor, 300B: transistor, 300C: transistor, 300D: transistor, 300E: transistor, 300F: transistor, 302: substrate, 304: conductive film, 306: insulating film, 307: insulating film, 308: oxide semiconductor film, 308_1: oxide semiconductor film, 308_2: oxide semiconductor film, 308_3: oxide semiconductor film, 312*a*: conductive film, 312*b*: conductive film, 314: insulating film, 316: insulating film, 318: insulating film, 320*a*: conductive film, 320*b*: conductive film, 341*a*: opening, 341*b*: opening, 342*a*: opening, 342*b*: opening, 342*c*: opening, 401: substrate, 402: conductive film, 403: conductive film, 403*a*: conductive film, 403*b*: conductive film, 404: insulating film, 405: conductive film, 405*a*: conductive film, 405*b*: conductive film, 406: insulating film, 407*a*: conductive film, 407*b*: conductive film, 407*c*: conductive film, 407*d*: conductive film, 407*e*: conductive film, 407*f*: conductive film, 407*g*: conductive film, 408: insulating film, 409*a*: oxide semiconductor film, 409*b*: oxide semiconductor film, 409*c*: oxide semiconductor film, 410*a*: insulating film, 410*b*: insulating film, 410*c*: insulating film, 411*a*: oxide semiconductor film, 411*b*: oxide semiconductor film, 411*c*: oxide semiconductor film, 412: insulating film, 413: insulating film, 414*a*: conductive film, 414*b*: conductive film, 414*c*: conductive film, 414*d*: conductive film, 414*e*: conductive film, 414*f*: conductive film, 414*g*: conductive film, 414*h*: conductive film, 416: insulating film, 417: conductive film, 418: insulating film, 419: EL layer, 419$_{EIL}$: electron-injection layer, 419$_{EML}$: light-emitting layer, 419$_{ETL}$: electron-transport layer, 419$_{HIL}$: hole-injection layer, 419$_{HTL}$: hole-transport layer, 420: conductive film, 426: opening, 452: substrate, 454: sealing material, 500: display device, 500A: display device, 500B: display device, 502: pixel portion, 504*a*: gate driver circuit portion, 504*b*: gate driver circuit portion, 506: source driver circuit portion, 508*a*: external circuit, 508*b*: external circuit, 602: light-blocking film, 604: structure body, 606: color film, 608: insulating film, 610: conductive film, 612*a*: structure body, 612*b*: structure body, 618*a*: alignment film, 618*b*: alignment film, 620: liquid crystal layer, 622: sealant, 624: conductor, 626: functional film, 648: plasma, 652: substrate, 662: light-blocking film, 663: insulating film, 664: electrode, 665: electrode, 666: insulating film, 667: electrode, 668: insulating film, 670: substrate, 672: substrate, 674: bonding material, 681: insulating film, 682: conductive film, 691: touch panel, 692: touch panel, 693: touch panel, 8000: display module, 8001: upper cover, 8002: lower cover, 8003: FPC, 8004: touch panel, 8005: FPC, 8006: display panel, 8009: frame, 8010: printed circuit board, 8011: battery, 9000: housing, 9001: display portion, 9002: camera, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9103: portable information terminal, 9104: portable information terminal, 9200: portable information terminal, 9201: portable information terminal, 9202: portable information terminal, 9500: display device, 9501: display panel, 9502: display region, 9503: region, 9511: hinge, 9512: bearing.

This application is based on Japanese Patent Application serial no. 2015-220994 filed with Japan Patent Office on Nov. 11, 2015, the entire contents of which are hereby incorporated by reference.

The invention claimed is:

1. A display device comprising:
a first display element;
a second display element;
a color film; and
a reflective electrode,
wherein the first display element comprises a first pixel electrode and a liquid crystal layer,
wherein the second display element comprises a second pixel electrode and a light-emitting layer,
wherein the first pixel electrode is electrically connected to the reflective electrode,
wherein the reflective electrode comprises an opening through which light emitted from the light-emitting layer passes,
wherein the color film faces the reflective electrode with the liquid crystal layer therebetween,
wherein the color film is provided over a substrate comprising a depression and a projection,
wherein the depression is provided in a position overlapping with the reflective electrode, and
wherein the projection is provided in a position overlapping with the second display element.

2. The display device according to claim 1, wherein the first pixel electrode faces the second pixel electrode with the reflective electrode therebetween.

3. A display module comprising:
the display device according to claim 1; and
a touch sensor.

4. An electronic device comprising:
the display device according to claim 1; and
a battery.

5. An electronic device comprising:
the display module according to claim 3; and
a battery.

6. A display device comprising:
a first display element;
a second display element;
a color film; and
a reflective electrode,
wherein the first display element comprises a first pixel electrode and a liquid crystal layer,
wherein the second display element comprises a second pixel electrode and a light-emitting layer,
wherein the first pixel electrode is electrically connected to the reflective electrode,
wherein the reflective electrode comprises an opening through which light emitted from the light-emitting layer passes,
wherein the color film faces the reflective electrode with the liquid crystal layer therebetween and faces the light-emitting layer,
wherein the color film is provided over a substrate comprising a depression and a projection,
wherein the depression is provided in a position overlapping with the reflective electrode, and
wherein the projection is provided in a position overlapping with the second display element.

7. The display device according to claim 6, wherein a region of the color film at the depression is thicker than a region of the color film at the projection.

8. The display device according to claim 6, wherein the first pixel electrode faces the second pixel electrode with the reflective electrode therebetween.

9. A display module comprising:
the display device according to claim 6; and
a touch sensor.

10. An electronic device comprising:
the display device according to claim 6; and
a battery.

11. An electronic device comprising:
the display module according to claim 9; and
a battery.

* * * * *